US007507525B2

(12) United States Patent
Sugasaki

(10) Patent No.: US 7,507,525 B2
(45) Date of Patent: Mar. 24, 2009

(54) POLYMERIZABLE COMPOSITION AND LITHOGRAPHIC PRINTING PLATE PRECURSOR

(75) Inventor: Atsushi Sugasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/416,309

(22) Filed: May 3, 2006

(65) Prior Publication Data

US 2006/0257783 A1 Nov. 16, 2006

(30) Foreign Application Priority Data

May 10, 2005 (JP) .......................... P.2005-137549
Jul. 13, 2005 (JP) .......................... P.2005-204685

(51) Int. Cl.
G03F 7/027 (2006.01)
G03F 7/11 (2006.01)
G03F 7/32 (2006.01)

(52) U.S. Cl. ................. 430/276.1; 430/281.1; 430/302; 430/278.1; 430/911; 430/905; 430/915; 430/285.1; 430/287.1; 430/288.1; 430/284.1; 430/283.1; 430/271.1

(58) Field of Classification Search ........................ None
See application file for complete search history.

(56) References Cited

U.S. PATENT DOCUMENTS

| 2,927,023 | A | * | 3/1960 | Martin | 430/281.1 |
| 3,036,915 | A | * | 5/1962 | Notley | 430/271.1 |
| 3,469,983 | A | * | 9/1969 | Herrick et al. | 430/271.1 |
| 3,479,185 | A | * | 11/1969 | Chambers, Jr. | 430/278.1 |
| 3,549,367 | A | * | 12/1970 | Chang et al. | 430/278.1 |
| 3,898,087 | A | * | 8/1975 | Brutchen et al. | 430/281.1 |
| 3,960,685 | A | | 6/1976 | Sano et al. | |
| 4,195,997 | A | | 4/1980 | Graham | |
| 4,221,859 | A | * | 9/1980 | Fanger et al. | 522/65 |
| 4,499,176 | A | * | 2/1985 | Curtis et al. | 430/253 |
| 4,772,538 | A | * | 9/1988 | Walls et al. | 430/284.1 |
| 4,840,875 | A | * | 6/1989 | Kunichika et al. | 430/309 |
| 5,407,764 | A | * | 4/1995 | Cheema et al. | 430/15 |
| 5,976,735 | A | * | 11/1999 | Monk et al. | 430/18 |
| 6,014,929 | A | * | 1/2000 | Teng | 101/456 |
| 6,689,537 | B2 | * | 2/2004 | Urano et al. | 430/273.1 |
| 2002/0164542 | A1 | | 11/2002 | Oshio et al. | |
| 2004/0166442 | A1 | * | 8/2004 | Sawada et al. | 430/271.1 |

FOREIGN PATENT DOCUMENTS

| EP | 0 278 691 A2 | | 8/1988 |
| GB | 807948 A | * | 1/1959 |
| JP | 63-113450 A | | 5/1988 |
| JP | 3-63740 B2 | | 10/1991 |
| JP | 7-120038 B2 | | 12/1995 |
| JP | 10-10719 A | | 1/1998 |
| JP | 11-352691 A | | 12/1999 |
| JP | 2001-125257 A | | 5/2001 |
| JP | 2002-229207 A | | 8/2002 |
| JP | 2004-109851 A | | 4/2004 |
| WO | 91/06893 A | | 5/1991 |
| WO | 2004006039 A1 | * | 8/2000 |

OTHER PUBLICATIONS

Hercules, Product Data, KLUCEL(tm) Hydroxypropylcellulose, Pharm Grade, No. 494-8, copy right Aqualon, 2002, three pages from Hercules Incorporated, Aqualon Division, www.aqualon,com, printed in USA.*
Guido, Stefano, "Phase Behavior of Aqueous Solutions of Hycroxypropylcellulose", Macromolecules, 1995 vol. 28, pages 4530-4539.*
Wypych, George, Handbook of Fillers—A Definitive User's Guide and Databook (2nd Edition). ChemTec Publishing. year of publication 2000, pp. 1-14, printed from Online version : http://www.knovel.com/knovel2/Toc.jsp?BookID=1011&VerticalID=0.*
"Gums" from the Dec. 4, 2000 online posting of Kirk-Othmer Encyclopedia of Chemical Technology, 20 pages.(John Wiley & Sons, Inc. at www.mrw.interscience.wiley.com/emrw/9780471238966/kirk/article/gumsbair.a01/re10001/html.*
Keentok, "On rod-like polymers", Rheologica Acta 23:661-663 (Nov. 1984).*
CHaplan, Martin, "Carrageenan", Water structure and science (Http://www.lsbu.ac.uk/water/hycar.html) Jul. 1, 2007, 3 pages from web printed out Nov. 13, 2007.*
Monroe et al "Photoinitiators for Free-Radical-Initiatoed Photoimaging Systems", Chem. Rev. vol. 93, pp. 435-448, 1993, no month given.*

* cited by examiner

Primary Examiner—Cynthia Hamilton
(74) Attorney, Agent, or Firm—Sughrue Mion, PLLC

(57) ABSTRACT

A lithographic printing plate precursor having a photosensitive layer containing (A) at least one saccharide selected from the group consisting of an oligosaccharide and a polysaccharide, (B) a binder polymer, (C) a compound having an addition polymerizable ethylenic unsaturated bond, and (D) a polymerization initiator, or a lithographic printing plate precursor having an undercoat layer comprising (A) at least one saccharide selected from the group consisting of an oligosaccharide and a polysaccharide, and a photosensitive layer containing (B) a binder polymer, (C) a compound having an addition polymerizable ethylenic unsaturated bond, and (D) a polymerization initiator.

7 Claims, 1 Drawing Sheet

PRIOR ART

POLYMERIZABLE COMPOSITION AND LITHOGRAPHIC PRINTING PLATE PRECURSOR

BACKGROUND OF THE INVENTION

1. Field of the Invention

The present invention relates to a polymerizable composition and a lithographic printing plate precursor, and more specifically a polymerizable composition suitable for a photosensitive layer of a negative lithographic printing plate precursor that is capable of high-speed writing with a laser beam, and a negative lithographic printing plate precursor using the polymerizable composition.

2. Description of the Related Art

As lithographic printing plate precursors, PS plates comprising a hydrophilic support having provided thereon a lipophilic photosensitive resin layer have so far been widely used. As the plate-making methods, methods of obtaining desired printing plates by mask exposure (areal exposure) via a lith film and then dissolving and removing the non-image area are generally used.

Digitized techniques of electronically processing, accumulating and outputting image data using a computer have prevailed in recent years, and various image output systems corresponding to these digitized techniques have been put to practical use. As a result, a computer-to-plate (CTP) technique of directly making a printing plate by scanning digitized image data with high convergent light such as a laser beam without using a lith film is eagerly desired. With such a tendency, it has become an important technical subject to obtain a printing plate precursor adaptable to this purpose.

As such a lithographic printing plate precursor capable of scanning exposure, a constitution comprising a hydrophilic support having provided thereon a lipophilic photosensitive resin layer (hereinafter also referred to as "a photosensitive layer") containing a photosensitive compound capable of generating an active seed such as a radical and a Brφnsted acid by laser exposure has so far been proposed and now on the market. A negative lithographic printing plate can be obtained by scanning exposing the lithographic printing plate precursor with laser beams on the basis of digital data to generate an active seed, causing physical or chemical changes on the photosensitive layer by the action of the active seed to make the photosensitive layer insoluble, and then development processing. In particular, a lithographic printing plate precursor comprising a hydrophilic support having thereon a photopolymerization type photosensitive layer containing a high speed photopolymerization initiator, an addition polymerizable ethylenic unsaturated compound, and a binder polymer soluble in an alkali developing solution, and, if necessary, an oxygen-shielding protective layer, is excellent in productivity and easy of development process, and has advantages that excellent in resolution and adhesion of inks, so that such a lithographic printing plate precursor is promising as a printing plate having preferred printing properties.

The disposal of waste solutions discharged with alkali development processing is a great interest of the industry at large in recent years from the consideration for the protection of global environment, and public attention is attracted to the measure of reducing the load of waste solution proposal by development process (e.g., mild development process with solutions having pH of from 4 to less than 10) without depending upon strong alkali developing solutions having pH 10 or more containing high concentration of alkali that is the main component of developing solutions (e.g., potassium hydroxide that is generally called a strong base).

Accordingly, it has been increasingly strongly desired to obtain a lithographic printing plate precursor exhibiting preferred printing properties in mild development process with solutions having pH of from 4 to less than 10, not to speak of strong alkali development process of pH 10 or more.

For the purpose of heightening the press life of a printing plate, alkali-soluble polyurethane resin binders (e.g., refer to JP-A-63-113450 (the term "JP-A" as used herein refers to an "unexamined published Japanese patent application") and JP-B-7-120038 (the term "JP-B" as used herein refers to an "examined Japanese patent publication")), and alkali-soluble acrylic resin binders having an ethylenic unsaturated bond at side chains (e.g., refer to JP-B-3-63740 and JP-A-10-10719) have conventionally been used.

In improving press life, it was general means to modify the copolymerization components of the polyurethane resin binder (e.g., refer to JP-A-11-352691 and JP-A-2001-125257), or modify the structure of the unit containing an ethylenic unsaturated bond in the acrylic resin binder (e.g., refer to JP-A-2002-229207).

However, in the examination of the improvement of press life in the polyurethane resin binder, the trade-off with aging developability (almost the same meaning as a raw preservation property) due to high aggregation ascribable to the urethane bonding in the polyurethane structure, or in the examination of the improvement of press life by the modification of the unit structure containing an ethylenic unsaturated bond at side chains in the acrylic resin binder, the trade-off with aging developability ascribable to dark polymerization of the double bond parts C=C of side chains is latently involved.

An excellent technique of getting rid of the trade-off of press life and a raw preservation property has been found in recent years (e.g., refer to JP-A-2004-109851). According to the technique, similarly to JP-A-2002-229207, since a specific alkali-soluble polymer has at the side chain an ethylenic unsaturated bond having high radical reactivity, a high density and tenacious crosslinking structure is rapidly formed in the polymer compound by the supply of energy at the time of exposure, so that high sensitivity and excellent press life can be realized.

Additionally, the specific alkali-soluble polymer in JP-A-2004-109851 is characterized in that it has hydrogen bonding groups and cyclic structures as the linking groups of the terminal ethylenic unsaturated groups with the main chain polymer and the copolymer component, and the hydrogen bonding property of such linking groups and the bulkiness of the cyclic structures inhibit the rotation around the polymer main chain and maintain a high glass transition temperature, as a result the dark polymerization by thermal motion of the terminal ethylenic unsaturated groups is prevented to reveal a good raw preservation property.

However, a technique capable of actually reconciling press life with a raw preservation property has not been found yet other than the technique (concept) of JP-A-2004-109851, so that a technique capable of reconciling press life with a raw preservation property looking steadily at not only alkali development process but also the non-alkali development process has been desired.

SUMMARY OF THE INVENTION

Accordingly, the objects of the invention are to provide a polymerizable composition capable of improving press life and having a good raw preservation property (a property not generating reduction in developability accompanied by soiling of a non-image area by aging), and a lithographic printing plate precursor.

As a result of earnest examination to solve the above problems, the present inventor has found that the above problems can be solved by the use of a specific oligosaccharide or polysaccharide, thus the invention has been achieved.

Accordingly, the present invention is as follows.

(1) A polymerizable composition comprising:
(A) at least one saccharide selected from the group consisting of an oligosaccharide and a polysaccharide;
(B) a binder polymer;
(C) a compound having an addition polymerizable ethylenic unsaturated bond; and
(D) a polymerization initiator.

(2) The polymerizable composition as described in (1) above,
wherein the polysaccharide contains a hydrophilic group other than OH groups which are essentially inherent in the polysaccharide.

(3) The polymerizable composition as described in (1) or (2) above, which further comprises (E) a sensitizing dyestuff having an absorption maximum at a wavelength of from 300 to 600 nm.

(4) A lithographic printing plate precursor comprising:
a support; and
a photosensitive layer formed from a polymerizable composition as described in any of (1) to (3) above.

(5) A lithographic printing plate precursor comprising:
a support;
a layer comprising at least one saccharide selected from the group consisting of an oligosaccharide and a polysaccharide; and
a photosensitive layer, in this order,
wherein the photosensitive layer comprises:
(B) a binder polymer;
(C) a compound having an addition polymerizable ethylenic unsaturated bond; and
(D) a polymerization initiator.

(6) The lithographic printing plate precursor as described in (5) above,
wherein the polysaccharide has at least one substituent selected from the group consisting of a hydrophilic group that includes a carboxyl group, an amino group, an alkylamino group, an acetylamino group, an ethyleneoxy group, a sulfonic acid group, a phosphoric acid group, a urethane group, a urea group or a thiol group and a salt of the hydrophilic group.

(7) The lithographic printing plate precursor as described in (5) or (6) above,
wherein the polysaccharide has a property that a part or an entire structure of the polysaccharide takes a helical structure in an aqueous solution having a concentration of 50 mass % or less.

(8) The lithographic printing plate precursor as described in any of (5) to (7) above,
wherein the photosensitive layer further comprises (E) a sensitizing dyestuff having an absorption maximum at a wavelength of from 300 to 600 nm.

(9) A process for producing a lithographic printing plate comprising:
imagewise exposing a lithographic printing plate precursor as described in any of (4) to (8) above to thereby cure an exposed area; and
subjecting the exposed lithographic printing plate precursor to wet development processing.

(10) The lithographic printing plate precursor as described in (5) above,
wherein the polysaccharide has at least one substituent selected from the group consisting of a hydrophilic group that includes a carboxyl group, an amino group, an alkylamino group, an acetylamino group, an ethyleneoxy group, a sulfonic acid group, a phosphoric acid group, a urethane group, a urea group or a thiol group and a salt of the hydrophilic group, and
wherein the polysaccharide has a property that a part or an entire structure of the polysaccharide takes a helical structure in an aqueous solution having a concentration of 50 mass % or less.

(11) The lithographic printing plate precursor as described in (6) above,
wherein the at least one substituent selected from the group consisting of a hydrophilic group and a salt of the hydrophilic group is at least one of a carboxyl group, a salt of a carboxyl group, a sulfonic acid group and a salt of a sulfonic acid group.

The mechanism of the action of the invention is not clear, but it is presumed as follows.

When oligosaccharides or polysaccharides are introduced into the photosensitive layer of a lithographic printing plate precursor, since the oligosaccharides or polysaccharides (i) have many hydroxyl groups (OH groups) as compared with monosaccharides, and (ii) they are oligomers or polymers as shown by their names, it is possible for multipoint hydrogen bonding (which is ascribable to being (i)) to function jointly (which is revealed from the fact of being (ii)). Therefore, the efficiency of intermolecular interaction is great in oligosaccharides or polysaccharides as compared with monosaccharides.

As a result, at the time of forming a crosslinking cured film by exposure (at this time, covalent bonding is formed between $C=C$ of the binder side chains and $C=C$ of the polymerizable composition), the crosslinking cured film increases in strength due to the addition of the function by the conjoint multipoint hydrogen bonding, which presumably results in the improvement of press life of the printing plate precursor.

On the other hand, with respect to a non-image area (an unexposed area), multipoint hydrogen bonding formed among saccharides is non-covalent bonding, and in the state in which a protonic medium such as water (e.g., a developing solution) exists, the molecules of water inhibit hydrogen bonding from forming among functional groups, so that in general hydrogen bonding cannot be formed. In consequence, even if the deterioration of developability ascribable to crosslinking reaction or polymerization reaction (dark polymerization) is caused to some degree without exposure, since the osmosis of a developing solution into the film is accelerated by OH in the saccharide structure, the unexposed area of the photosensitive layer can be presumably easily developed even in a case of aging. As a result, it is supposed that a good printing plate excellent in raw preservation property (free from soiling attributable to development failure even after the lapse of time) can be obtained.

In a case of an undercoat layer comprising an oligosaccharide or polysaccharide, multipoint hydrogen bonding is formed (a) in the oligosaccharide or polysaccharide, (b) between the oligosaccharide or polysaccharide and a polar group (a COOH group and the like) in the binder polymer structure in a photosensitive layer, or (c) between the oligosaccharide or polysaccharide and the aluminum atom, oxygen atom, silicon atom in a support. As a result, multipoint hydrogen bonding is formed in an exposed area (an area cured by exposure) where the amount of osmosis of water or a developing solution is little, by which the film strength is heightened and the interfacial adhesion with a support and a photosensitive layer increases, so that high press life is achieved.

On the other hand, since a great amount of water or a developing solution osmoses deep into an undercoat layer in an unexposed area, hydrogen bonding is insantaneously cut and hydrophilic OH groups are bared to increase hydrophilicity (water solubility), as a result good developability and a raw preservation property are revealed.

In particular, in a case of a polysaccharide having a helical structure, which is a preferred embodiment in the invention, an exposed area is relatively hydrophobic, since, in addition to the above multipoint hydrogen bonding, the invasion of water into OH groups where helically twisted main chain forms multipoint hydrogen bonding is more effectively shielded. In consequence, the deterioration of film due to the damage by osmosis of developing solution hardly occurs to thereby achieve high press life.

On the other hand, in an unexposed area, from the following two reasons of (i) hydrogen bonding formed in the polysaccharide in the undercoat layer is non-covalent bonding, and (ii) a great deal of water (a developing solution) osmoses on account of unexposure (that is, the photosensitive layer is uncured and does not have a property of restaining the osmosis of a developing solution), the layer behaves as a hydrophilic polymer (uncoiled helix, that is, a random coil structure) under either developing condition of pH 4 or more and less than 10, or pH 10 or more, so that good developability and a raw preservation property are revealed.

Incidentally, the above helical structure means the forms of a single helix, a double helix, a triple helix, a zigzag structure, aggregation of two or more of the same helix or different helices (e.g., aggregation of a double helix and a double helix, aggregation of a double helix and a triple helix), and aggregation of a helical structure and a zigzag structure.

DETAILED DESCRIPTION OF THE INVENTION

Figure 1:
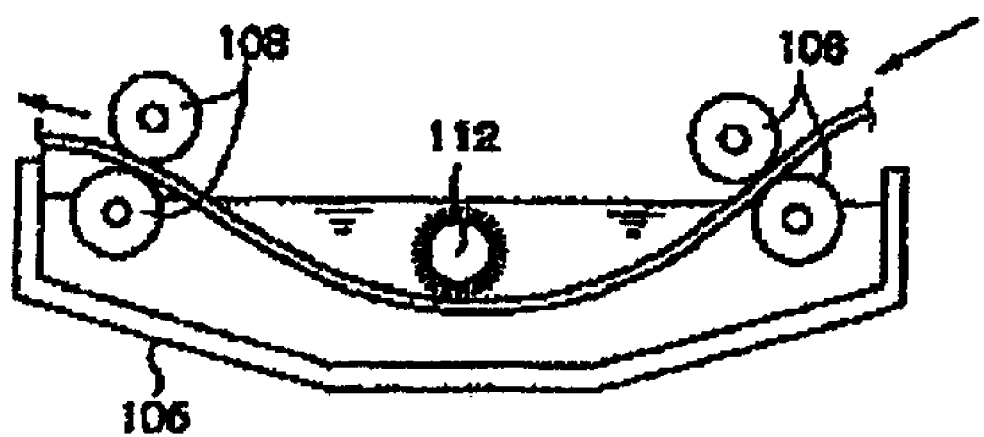
FIG. 1 is a drawing showing representative developing machine.

In the first place, at least a saccharide selected from the group consisting of an oligosaccharide and a polysaccharide for use in a polymerizable composition, a photosensitive layer of a lithographic printing plate precursor, or an undercoat layer of the invention will be described in detail.

At least a saccharide selected from the group consisting of an oligosaccharide and a polysaccharide:

In the specification of the invention, saccharides comprising from 2 to 10 monosaccharides linked by glycoside bonding are defined as oligosaccharides, and saccharides comprising 11 or more monosaccharides linked by glycoside bonding are defined as polysaccharides.

In the invention, polysaccharides are preferred to oligosaccharides in view of the film strength. It is more preferred for the polysaccharides to have a carboxyl group or a salt of a carboxyl group, or for the polysaccharides to have a sulfuric acid group or a salt of a sulfuric acid group. It is still more preferred for the polysaccharides to be a sulfuric acid group or a salt of a sulfuric acid group.

Further, when polysaccharides are used in an undercoat layer, in view of the adhesion of a support and a photosensitive layer in an exposed area and the maintenance of a hydrophilic property in an unexposed area, polysaccharides containing a hydrophilic group or polysaccharides having a helical structure are more preferred, and polysaccharides containing a hydrophilic group and having a helical structure are especially preferred of polysaccharides.

As the preferred specific examples of polysaccharides having a helical structure, carrageenan, schizophyllan, lentinan, laminaran, agarose, amylose, succinoglycan, alginic acid, curdlan, gellan gum, galactomannan, and the like can be exemplified. However, polysaccharides having a helical structure in the invention are not limited thereto.

Of polysaccharides containing a hydrophilic group and having a helical structure, the particularly preferred examples are agarose and carrageenan, above all, κ-carrageenan and l-carageenan.

In "a polysaccharide containing a hydrophilic group and having a helical structure", which is an especially preferred embodiment in the invention, it is more preferred, at the time of preparation and coating of an undercoat layer coating solution, to stir and heat the coating solution at 60 to 100° C. for 30 minutes or more, and coat and dry the coating solution maintained at this range of temperature, from the point of the improvement of the levels of press life and developability.

Although chemical reasons are not clear, the mechanism of the action that the above effects can be obtained is presumed as follows.

By preparing and coating an undercoat layer as above, the polysaccharide is existent in the undercoat layer in a random coil state (the polymer main chain is in a state of uncoiled and spread) from just after coating until before development, and hydrophobic pyranose rings and hydrophobic furanose rings as well as OH groups are bared.

And so, in an unexposed area, when water permeates an undercoat layer, a random coil structure is changed to a helical structure by hydrophobic interactions between pyranose rings and furanose rings. As a result, the polysaccharide takes a configuration in which the pyranose rings and the manose rings are buried in the inside of the helical, and only OH groups and hydrophilic groups are thrown out to the outside of the helical. Then, although the primary structures of the polysaccharide are the same in before and after water permeation, its polar character changes from hydrophobic (random coil) to hydrophilic (helical) due to the difference of the higher-order structures, thereby the developing property and the raw preservation property become excellent.

On the other hand, since a photosensitive layer is cured by exposure and restrains the osmosis of a developing solution in an exposed area, the adhesiveness between a support and an interface of an photosensitive layer is maintained and the press life is improved (not deteriorated) by multipoint hydrogen bonding origin of OH groups and hydrophilic groups and van der Waals interactions between pyranose rings and furanose rings.

The preferred content of these saccharides in a polymerizable composition (a photosensitive layer of a lithographic printing plate precursor) is from 0.01 to 99 mass % based on the total weight of the polymerizable composition (the photosensitive layer), preferably from 0.1 to 80 mass % in view of press life and a raw preservation property, more preferably from 1.0 to 60 mass %, and most preferably from 5.0 to 50 mass %. (In this specification, mass ratio is equal to weight ratio.)

The coating weight of the saccharides as an undercoat layer is preferably from 0.1 to 2,000 mg/m$^2$ from the viewpoint of press life and a raw preservation property, more preferably from 2.0 to 500 g/m$^2$, and most preferably from 5.0 to 100 mg/m$^2$.

Oligosaccharides and polysaccharides for use in the invention may be one kind alone, or a plurality of kinds may be used in combination. It is preferred to use one kind alone from the point of the simplicity of work in preparation of the coating solutions of a photosensitive layer and an undercoat layer.

The specific examples of oligosaccharides in the invention include disaccharide, e.g., maltose, maltotriose, cellobiose, lactose, sucrose, laminaribiose, saccharose, etc., and gentianose.

Further, the above saccharides can be substituted with an alkyl group, an alkenyl group, an alkynyl group, an alkoxyl group, an aryl group, a heterocyclic group, a hydroxyl group, a carboxyl group, an amino group, an ethyleneoxy group, a sulfonic acid group, a phosphoric acid group, a urethane group, a urea group, a thiol group, an acetal group, or a group of combination of these groups.

As the alkyl groups with which the oligosaccharides may be substituted, straight chain, branched, or cyclic alkyl groups having from 1 to 20 carbon atoms can be exemplified, and the specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2ethylhexyl group, a 2-methylhexyl group, a cyclohexyl group, a cyclopentyl group, and a 2-norbornyl group. Of these alkyl groups, straight chain alkyl groups having from 1 to 12 carbon atoms, branched alkyl groups having from 3 to 12 carbon atoms, and cyclic alkyl groups having from 5 to 10 carbon atoms are more preferred.

These alkyl groups may have a substituent, and as the substituents that can be introduced, monovalent nonmetallic atomic groups exclusive of a hydrogen atom are exemplified. The examples of the monovalent nonmetallic atomic groups include a halogen atom (—F; —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyl-oxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxy-carbonylamino group, an N-aryl-N-alkoxycarbonylamino group, an N-aryl-N-aryloxycarbonylamino group, a formyl group, an acyl group, a carboxyl group and a conjugate base group thereof, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkykulfonyl group, an arylsulfonyl group, a sulfo group (—$SO_3H$) and a conjugate base group thereof, an alkoxysulfonyl group, an aryloxysulfonyl group, a sulfinamoyl group, an N-alkylsulfinamoyl group, an N,N-dialkylsulfinamoyl group, an N-aryl-sulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfaoyl group, an N-alkyl-N-arylsulfamoyl group, an N-acylsulfamoyl group and a conjugate base group thereof, an N-alkylsulfonylsulfamoyl group (—$SO_2NHSO_2$(alkyl)) and a conjugate base group thereof, an N-arylsulfonylsulfamoyl group (—$SO_2NHSO_2$(aryl)) and a conjugate base group thereof, an N-alkylsulfonylcarbamoyl group (—$CONHSO_2$(alkyl)) and a conjugate base group thereof, an N-arylsulfonylcarbamoyl group (—$CONHSO_2$(aryl)) and a conjugate base group thereof, an alkoxysilyl group (—$Si(Oalkyl)_3$), an aryloxysilyl group (—$Si(Oaryl)_3$), a hydroxysilyl group (—$Si(OH)_3$) and a conjugate base group thereof, a phosphono group (—$PO_3H_2$) and a conjugate base group thereof, a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3H(alkyl)$) and a conjugate base group thereof, a monoarylphosphono group (—$PO_3H(aryl)$) and a conjugate base group thereof, a phosphonoxy group (—$OPO_3H_2$) and a conjugate base group thereof, a dialkylphosphonoxy group (—$OPO_3(alkyl)_2$), a diarylphosphonoxy group (—$OPO_3(aryl)_2$), an alkylarylphosphonoxy group (—$OPO_3(alkyl)(aryl)$), a monoalkylphosphonoxy group (—$OPO_3H(alkyl)$) and a conjugate base group thereof, a monoarylphosphonoxy group (—$OPO_3H(aryl)$) and a conjugate base group thereof, a cyano group, a nitro group, a dialkylboryl group (—$B(alkyl)_2$), a diarylboryl group (—$B(aryl)_2$), an alkylarylboryl group (—$B(alkyl)(aryl)$), a dihydroxyboryl group (—$B(OH)_2$) and a conjugate base group thereof, an alkylhydroxyboryl group (—$B(alkyl)(OH)$) and a conjugate base group thereof, an arylhydroxyboryl group (—$B(aryl)(OH)$) and a conjugate base group thereof, an aryl group, an alkenyl group, an alkynyl group, etc.

As the specific examples of the alkenyl groups with which the oligosaccharides may be substituted, straight chain, branched or cyclic alkenyl groups having from 1 to 10 carbon atoms, e.g., a vinyl group, a 1-propenyl group, a 1-butenyl group, a 1-methyl-1-propenyl group, a 1-cyclopentenyl group, a 1-cyclohexenyl group, etc., can be exemplified.

As the specific examples of the alkynyl groups, alkynyl groups having from 1 to 10 carbon atoms, e.g., an ethynyl group, a 1-propynyl group, a 1-butynyl group, a 1-octynyl group, etc., can be exemplified.

As the alkoxyl groups, alkoxyl groups having from 1 to 12 carbon atoms, e.g., a methoxy group, an ethoxy group, a butoxy group, etc., can be exemplified.

As the aryl groups, a benzene ring, a ring formed by condensation of 2 or 3 benzene rings, and a ring formed by condensation of a benzene ring and a 5-membered unsaturated ring can be exemplified. Specifically, a phenyl group, a naphthyl group, an anthryl group, a phenanthryl group, an indenyl group, an acenaphthenyl group, a fluorenyl group, etc., can be exemplified, and of these groups a phenyl group and a naphthyl group are more preferred.

As the substituents that can be introduced into these aryl groups, the above alkyl groups, and the substituents capable of being introduced into the alkyl groups can be exemplified.

The amino groups with which the oligosaccharides may be substituted may be ammonium groups neutralized with an acid.

The specific examples of polysaccharides in the invention include cellulose, amylose, hemicellulose, xylan, schizophyllan, curdlan, chitin, chitosan, lentinan, pectin, gua gum, tragacanth, amylopectin, xanthane gum, hydroxyethyl cellulose, methyl cellulose, nitrocellulose, cationed gua gum, emulsan, carrageenan, laminaran, etc.

Further, the above polysaccharides can be substituted with an alkyl group, an alkenyl group, an alkynyl group, an alkoxyl group, an aryl group, a heterocyclic group, a hydroxyl group, a carboxyl group, an amino group, an ethyleneoxy group, a sulfonic acid group, a phosphoric acid group, a urethane group, a urea group, a thiol group, an acetal group, or a group of combination of these groups.

As the specific examples of the alkyl group, alkenyl groups, alkynyl group, alkoxyl group and aryl group with which the polysaccharides may be substituted, the same groups as the specific examples of these groups with which the oligosaccharides may be substituted can be exemplified.

The amino groups with which the polysaccharides may be substituted may be ammonium groups neutralized with an acid.

Compounds having 2 or more 5-membered and/or 6-membered ring structures and at the same time saccharide structures as the ring structures like the above oligosaccharides and polysaccharides can contain new hydrophilic groups other than the hydrophilic groups that are essentially inherent in the oligosaccharides and polysaccharide. As other hydrophilic groups, a hydroxyl group, a carboxyl group, an amino group, an alkylamino group, an acetylamino group, an ethyleneoxy group, a sulfonic acid group, a phosphoric acid group, a urethane group, a urea group, and a thiol group are exemplified. It is possible for these hydrophilic groups to be bonded directly to the 5-membered ring or 6-membered ring but, if necessary, it is also possible to be bonded via a linking group such as a methylene group, a methyleneoxy group, or an aryl group. The above hydroxyl group, carboxyl group, sulfonic acid group, phosphoric acid group and thiol group may be protonic bodies or may be neutralized with a base.

As the specific examples of polysaccharides containing a carboxyl group as the hydrophilic group, alginic acid, chondroitin, propylene glycol alginate, carboxymethyl cellulose, carboxymethyl chitin, hyaluronic acid, hydroxypropylmethyl cellulose phthalate (HPMCP), hydroxy-propylmethyl cellulose acetate succinate (HPMCAS), cellulose acetate hexahydrophthalate (CAHHP), hydroxypropylmethyl cellulose acetate phthalate (HPMCAP), hydroxypropylmethyl cellulose hexahydrophthalate (HPMCHIP), and salts obtained by neutralizing these polysaccharides with a base can be exemplified.

As the specific examples of polysaccharides containing a sulfonic acid group as the hydrophilic group, chondroitin sulfuric acid, heparan sulfuric acid, keratan sulfuric acid, dermatan sulfuric acid, carrageenan, and salts obtained by neutralizing these polysaccharides with a base can be exemplified.

Other components for use in a polymerizable composition or a photosensitive layer are described in detail below.

(B) Binder polymer:

As the binder polymers for use in the invention, conventionally well known binder polymers can be used with no restriction, but polymers having a film-forming property are preferred. As the examples of such binder polymers, acrylic resins, polyvinyl acetal resins, polyurethane resins, polyurea resins, polyimide resins, polyamide resins, epoxy resins, methacrylic resins, polystyrene resins, novolak-type phenolic resins, polyester resins, synthetic rubbers and natural rubbers are exemplified.

The binder polymers may have a crosslinking property to improve the film strength of an image area. To make the binder polymers have a crosslinking property, it is effective to introduce a crosslinkable functional group such as an ethylenic unsaturated bond into the main chain or side chain of the binder polymers. The crosslinkable functional group may be introduced by copolymerization.

From the viewpoint of alkali solubility, the binder polymers preferably have an acid group represented by the following formula (1) having an acid dissociation constant (pKa) of from 0 to 11 at the side chains of the polymer.

$$P-X^3-(A^2-H)_m \qquad \text{Formula (1)}$$

In formula (1), P represents the skeleton of the main chain of the polymer, and $X^3$ represents a single bond directly bonding to the skeleton of the polymer, or a linking group selected from the group consisting of a carboxylic ester group (—COO—), an amido group (—CONH—), a hydrocarbon group, and an ether group (—O— or —S). $A^2$-H represents a partial structure functioning as an acid group having an acid dissociation constant (pKa) of from 0 to 11, and m represents an integer of from 1 to 5.

Acid groups having an acid dissociation constant (pKa) of from 0 to 11 are described below.

1. Acid Groups having an Acid Dissociation Constant (pKa) of 0 or More and Less than 5.5

As acid groups having an acid dissociation constant (pKa) of 0 or more and less than 5.5, a sulfonic acid group, a phosphoric acid group and a carboxylic acid group are exemplified, and a carboxylic acid group is especially preferred. As the structures containing a carboxylic acid group, e.g., acrylic acid, methacrylic acid, itaconic acid, crotonic acid, isocrotonic acid, maleic acid, p-carboxy-styrene are specifically exemplified, and acrylic acid, methacrylic acid and p-carboxystyrene are particularly preferred. These acid groups may be used one kind alone, or two or more kinds may be used.

2. Acid Groups having an Acid Dissociation Constant (pKa) of from 5.5 to 11

Of the acid groups contained in an alkali-soluble polymer in the invention, acid groups having an acid dissociation constant (pKa) of from 5.5 to 11 are described. pKa is preferably in the range of from 7 to 11, and more preferably from 8 to 11.

As such acid groups, specifically, e.g., a phenol group (pKa: 9.99), a 2-methoxyphenol group (pKa: 9.99), a 2-chloro-phenol group (pKa: 8.55), a 2-hydroxymethyl benzoate group (pKa: 9.87), a 4-methylphenol group (pKa: 10.28), a 1,3-benzenediol group (pKa: 9.20), a 1-naphthol group (pKa: 9.30), a 1,2-benzenediol group (pKa: 9.45), a benzenesulfonamido group (pKa: 10.00), an N-acetylphenylbenzenesulfonamido group (pKa: 6.94), a 4-aminobenzenesulfonamido group (pKa: 10.58), an N-phenyl-4-aminobenzenesulfonamido group (pKa: 6.30), an N-(4-acetylphenyl)-4-aminobenzenesulfonamido group (pKa: 7.61), and an ethyl acetylacetate group (pKa: 10.68) are exemplified. Of these acid groups, a phenol group that may have a substituent on the aromatic group and a benzene-sulfonamido group that may have a substituent on the aromatic group are more preferred.

The acid dissociation constants pKa described in the above specific examples are the numerical values described in E. P. Serjeant et al., Ionisation Constants of Organic Acids in Aqueous Solution, and John A. Dean, Lange's Handbook of Chemistry.

As the structural unit having a specific acid group, a structural unit represented by the following formula (2) is preferred.

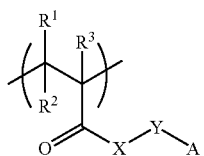

Formula (2)

In formula (2), X represents O, S or —$NR^4$—; Y represents a divalent organic group; A represents a specific acid group; and $R^1$, $R^2$, $R^3$ and $R^4$ each represents a hydrogen atom, a halogen atom, a monovalent organic group, a cyano group, or a nitro group.

In formula (2), as the monovalent organic group represented by $R^1$, $R^2$, $R^3$ and $R^4$, e.g., a straight chain, branched or cyclic alkyl group, an aromatic group, an alkoxyl group, an acyl group, an aralkyl group, an alkoxycarbonyl group, an aryloxy group, etc., are exemplified.

These monovalent organic groups may further have a substituent, e.g., an alkyl group, an aryl group, an alkoxyl group, an acyloxy group, a halogen atom, a hydroxyl group, an amino group, a cyano group, a nitro group, etc., are exemplified as the substituents that can be introduced.

In formula (2), as the divalent organic group represented by Y, e.g., an alkylene group, a phenylene group, a naphthylene group, etc., are exemplified.

These divalent organic groups may further have a substituent, e.g., an alkyl group, an aryl group, an alkoxyl group, an acyloxy group, a halogen atom, a hydroxyl group, an amino group, a cyano group, a nitro group, etc., are exemplified as the substituents that can be introduced.

As the structural unit having a specific acid group, structural units represented by the following formulae (3) to (8) are also preferred.

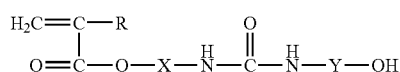

Formula (3)

In formula (3), R represents a hydrogen atom or an alkyl group; X represents a divalent linking group; and Y represents a divalent aromatic group that may have a substituent.

In formula (3), as the divalent linking group represented by X, e.g., an alkylene group and a phenylene group that may have a substituent are exemplified. As the divalent aromatic group that may have a substituent, a phenylene group and a naphthylene group that may have a substituent are exemplified are exemplified.

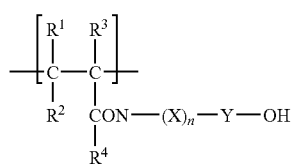

Formula (4)

In formula (4), $R^1$ and $R^2$ each represents a hydrogen atom, an alkyl group or a carboxylic acid group; $R^3$ represents a hydrogen atom, a halogen atom or an alkyl group; $R^4$ represents a hydrogen atom, an alkyl group, a phenyl group or an aralkyl group; X represents a divalent organic group for linking a nitrogen atom to an aromatic ring carbon atom; n represents 0 or 1; and Y represents a phenylene group that may have a substituent or a naphthylene group that may have a substituent.

Formula (4) is described in detail below.

In the structural unit represented by formula (4), Y represents a phenylene group that may have a substituent or a naphthylene group that may have a substituent. Since the characteristics of a polymerizable composition of the invention are hardly greatly influenced by the kind of the substituent, an arbitrary group can be used as the substituent. As representative substituents, e.g., an alkyl group, an alkoxyl group, a halogen atom, an acyl group, a hydroxyl group, a carboxylic acid, a sulfonic acid, a cyano group, a nitro group, etc., are exemplified.

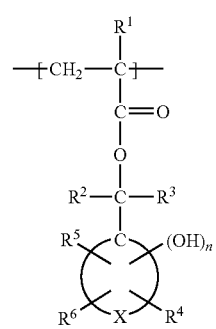

Formula (5)

In formula (5), $R^1$ represents a hydrogen atom, a halogen atom, a cyano group or an alkyl group; $R^2$ and $R^3$ each represents a hydrogen atom, a halogen atom, an alkyl group, an alkoxyl group, or an aryl group; X represents an atom necessary to complete a monocyclic or polycyclic, carbocyclic aromatic ring; and n represents 1, 2 or 3.

In the structural unit represented by formula (5), more preferably $R^1$ represents a hydrogen atom, a halogen atom, a cyano group, or an alkyl group having from 1 to 6 carbon atoms, $R^2$ and $R^3$ each represents a hydrogen atom, or an alkyl group having from 1 to 4 carbon atoms, $R^4$, $R^5$ and $R^6$ each represents a hydrogen atom, an alkyl group having from 1 to 4 carbon atoms, an aryl group, or a halogen atom, X represents a carbon atom necessary to complete a benzene ring or a naphthalene ring, and n represents 1.

In the structural unit represented by formula (5), especially preferably $R^1$ represents a hydrogen atom or a methyl group, $R^2$, $R^3$ and $R^4$ each represents a hydrogen atom, $R^5$ represents a hydrogen atom, an alkyl group having from 1 to 4 carbon atoms, or a halogen atom, $R^6$ represents a hydrogen atom, an alkyl group having from 1 to 4 carbon atoms, an aryl group, or a halogen atom, X represents a carbon atom necessary to complete a benzene ring or a naphthalene ring, and n represents 1.

When $R^1$ in formula (5) is an alkyl group, the alkyl group is preferably an alkyl group having from 1 to 6 carbon atoms, and more preferably an alkyl group having 1 or 2 carbon atoms. Particularly preferably, $R^1$ represents a hydrogen atom or a methyl group.

In formula (5), it is preferred that at least one of $R^2$ and $R^3$ represents a hydrogen atom. When $R^2$ and $R^3$ each represents an alkyl group, the alkyl group is preferably an alkyl group having from 1 to 6 carbon atoms, and particularly preferably an alkyl group having from 1 to 3 carbon atoms.

In formula (5), $R^4$ preferably represents a hydrogen atom. $R^5$ preferably represents an alkyl group having from 1 to 4 carbon atoms, and more preferably a methyl group. $R^6$ preferably represents an alkyl group having from 1 to 4 carbon atoms, or an aryl group.

In general, an alkyl group here is defined to represent a saturated or unsaturated group that may be substituted with a halogen atom or a hydroxyl group, may contain an ether group or a ketone group, may have a cyclic or open ring, and may be branched or not branched. An alkyl group not branched and having from 1 to 4 carbon atoms is preferred. An aryl group is defined to represent a heterocyclic or carbocyclic aromatic ring that may be monocyclic or polycyclic, and may be substituted with an aryl group, an alkoxyl group, a hydroxyl group, or a halogen atom.

The position of the substituents on the ring X is not especially restricted, and the position is only influenced by the easiness of manufacture of the compound.

The carbocyclic aromatic ring X may be monocyclic or polycyclic. Of the carbocyclic rings, a benzene ring and a naphthalene ring can be especially exemplified.

The halogen atom in formula (5) is preferably a chlorine, bromine, or iodine atom, and especially preferably a chlorine atom.

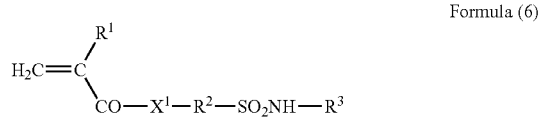

Formula (6)

Formula (7)

In formulae (6) and (7), $X^1$ and $X^2$ each represents —O— or —$NR^7$—; $R^1$ and $R^4$ each represents —H or —$CH_3$; $R^2$ and $R^5$ each represents an alkylene group having from 1 to 12 carbon atoms that may have a substituent, a cycloalkylene group, an arylene group, or an aralkylene group; $R^3$ represents —H, an alkyl group having from 1 to 12 carbon atoms that may have a substituent, a cycloalkyl group, an aryl group, or an aralkyl group; $R^6$ represents an alkyl group having from 1 to 12 carbon atoms that may have a substituent, a cycloalkyl group, an aryl group, or an aralkyl group, and $R^7$ represents a hydrogen atom, an alkyl group having from 1 to 12 carbon atoms that may have a substituent, a cycloalkyl group, an aryl group, or an aralkyl group.

Formula (8)

In formula (8), $A^1$ represents a hydrogen atom, a halogen atom, or an alkyl group having from 1 to 4 carbon atoms; $B^1$ represents a phenylene group or a substituted phenylene group; $B^2$ represents an alkylene group having from 2 to 6 carbon atoms that may have a substituent, or a phenylene group that may have a substituent; $B^3$ represents a divalent organic group; $X^1$ and $X^2$ each represents —CO— or —$SO_2$—; Y represents —CO—$R^1$ or —$SO_2$—$R^1$; $R^1$ represents an alkyl group, a substituted alkyl group, an aromatic group, or a substituted aromatic group; and m and j represent 0 or 1.

The specific examples of copolymerizing monomers B-1 to B-6, C-1 to C-15, D-1 to D-6, E-1 to E-15, F-1 to F-13, G-1 to G-3, H-1 and H-2, I-1, J-1 and J-2, which are used as the constitutional units represented by any of formulae (2) to (8), are shown below, but the invention is not restricted thereto. These copolymerizing monomers were synthesized according to the methods disclosed in each of JP-A-7-333839, JP-A-8-339080, JP-B-52-28401, JP-A-4-212961, JP-A-2-866 and JP-A-8-286369.

-continued
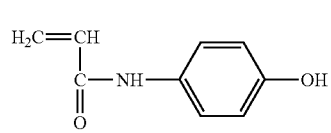
C-1
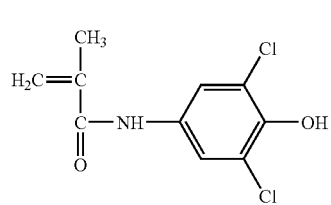
C-2
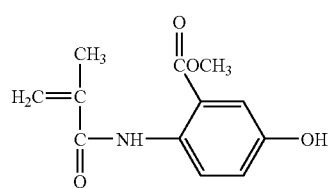
C-3
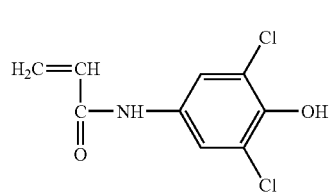
C-4
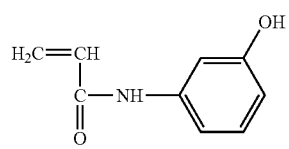
C-5
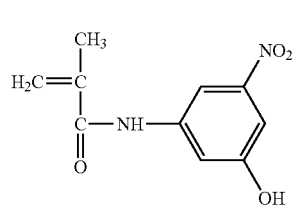
C-6
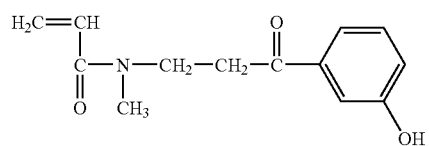
C-7
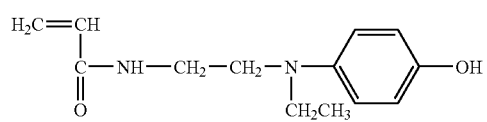
C-8
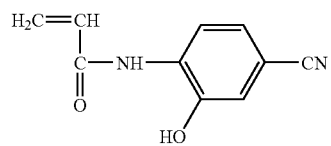
C-9
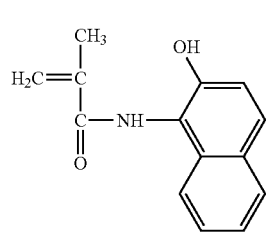
C-10
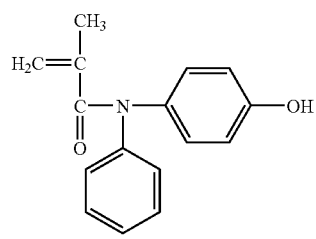
C-11
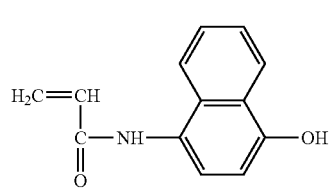
C-12
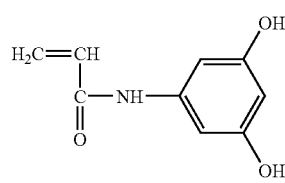
C-13
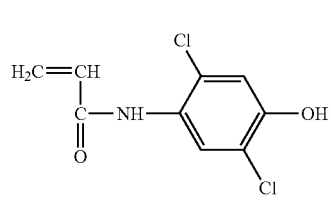
C-14
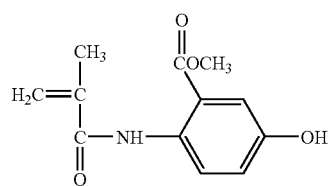
C-15
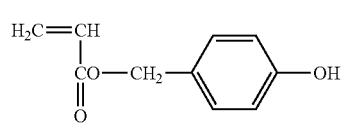
D-1

-continued
D-2
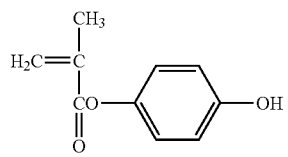
D-3
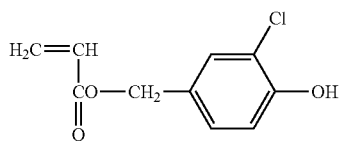
D-4
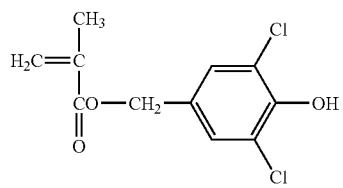
D-5
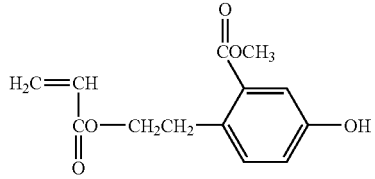
D-6
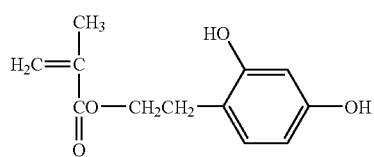
E-1
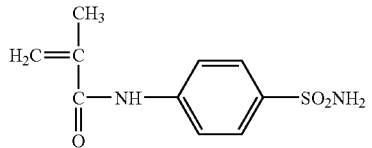
E-2
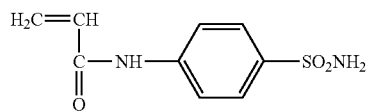
E-3
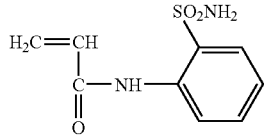
E-4
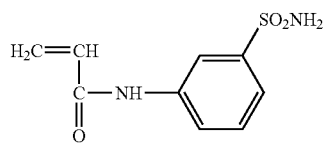
E-5
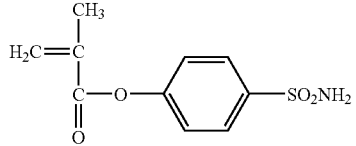
E-6
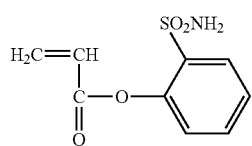
E-7
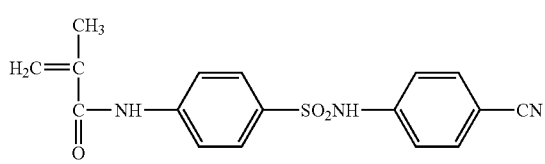
E-8
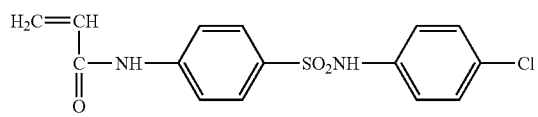
E-9
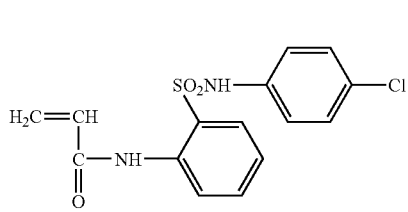
E-10
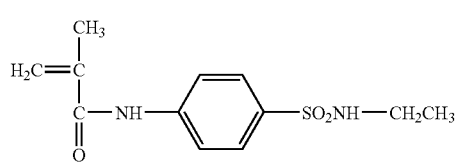
E-11
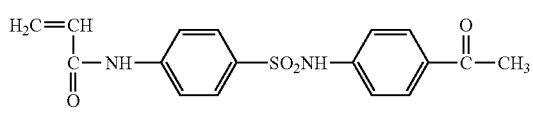
E-12
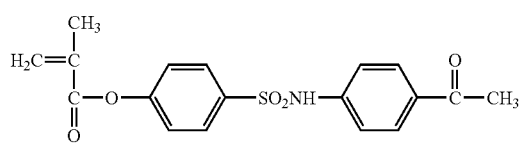
E-13
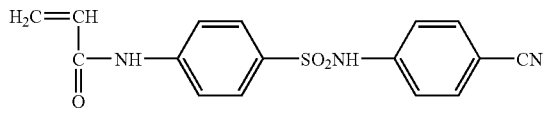

-continued
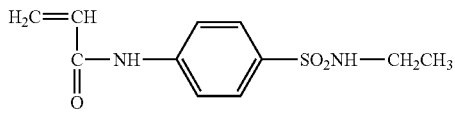
E-14
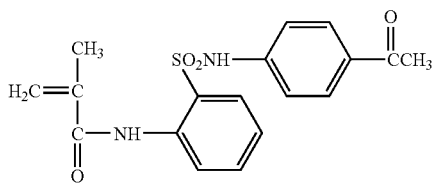
E-15
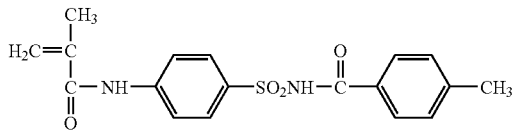
F-1
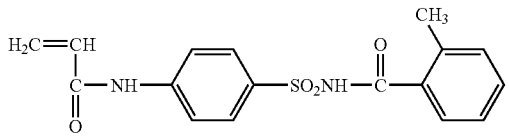
F-2
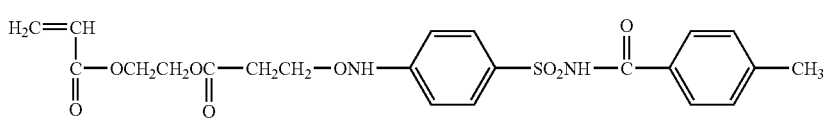
F-3
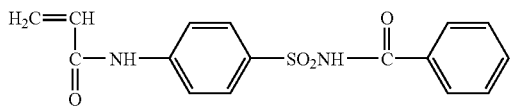
F-4
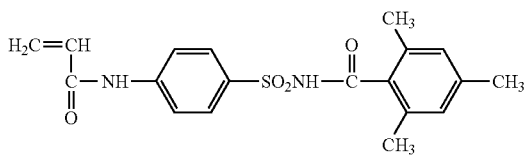
F-5
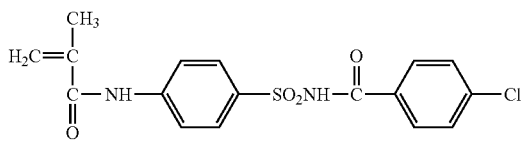
F-6
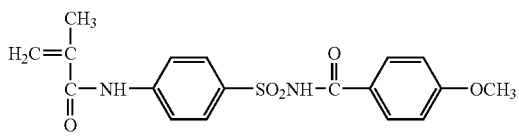
F-7
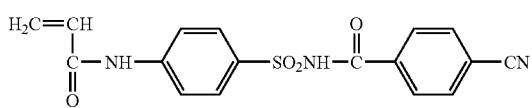
F-8
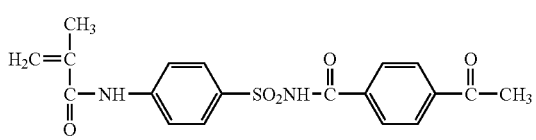
F-9
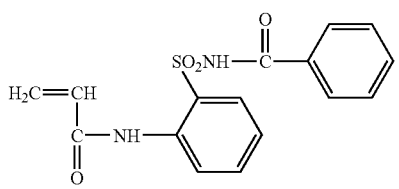
F-10
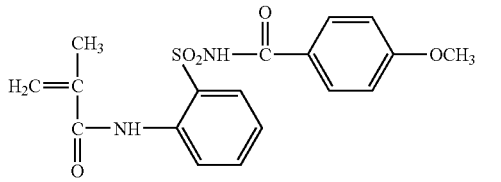
F-11
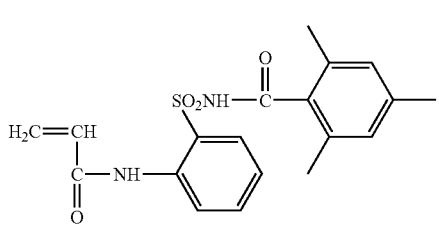
F-12
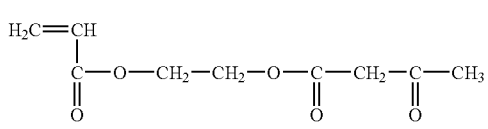
F-13
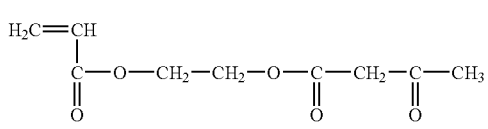
G-1
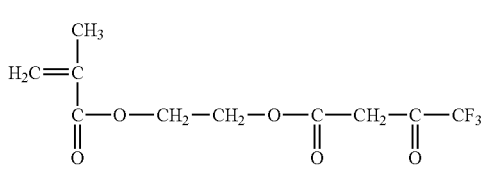
G-2

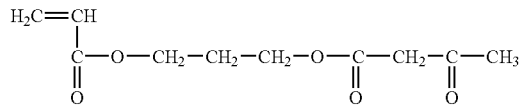
G-3

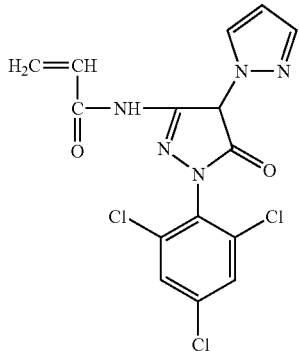
H-1

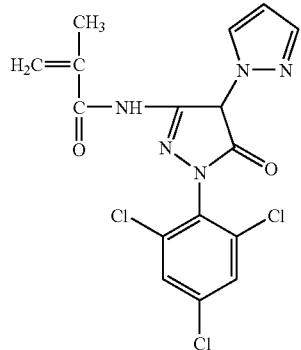
H-2

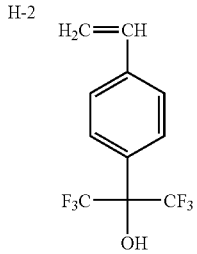
I-1

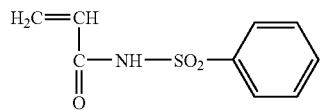
J-1

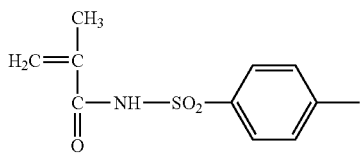
J-2

The binder polymers more preferably have a carboxylic acid as the acid group, and more preferably a case having an acid group as represented by the following formula (9). The binder polymers having a structural unit containing an acid group at the side chain as represented by formula (9) are characterized in that they do not precipitate after being dissolved in an alkali aqueous solution having pH of 10 or more and being allowed to stand at room temperature (25° C.) for 60 days.

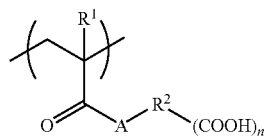

Formula (9)

In formula (9), $R^1$ represents a hydrogen atom or a methyl group; $R^2$ represents an n+1-valent organic linking group containing an ester group represented by —O(C=O)—; A represents an oxygen atom or $NR^3$—; $R^3$ represents a hydrogen atom or a monovalent hydrocarbon group having from 1 to 10 carbon atoms; and n represents an integer of from 1 to 5.

The means capable of restraining the precipitation of an alkali-soluble polymer in an alkali aqueous solution by aging as represented by formula (9) is not especially restricted, and it is sufficient to be capable of effectively restraining the reduction of solubility of a polymer due to vanishing of an alkali-soluble carboxyl group with the lapse of time. For example, a means of the introduction of other functional group modifiable in an alkali aqueous solution and revealable alkali-solubility, a means of the introduction of other functional group having high alkali-solubility capable of improving the solubility of a polymer at large, or a means of the introduction of a structure improvable solubility, although it does not function as an alkali-soluble group by itself, e.g., a structure having high affinity with an alkali aqueous solution, can be taken.

As the preferred specific embodiments, (I) an embodiment having at the side chain of a polymer a functional group capable of becoming an acid group by alkali hydrolysis represented by the following formula (10), (II) an embodiment having at the side chain of a polymer an acid group having an acid dissociation constant (pKa) of from 0 to 11 represented by the above formula (1), and (III) an embodiment having at the side chain of a polymer a solubility-assisting group to an alkali aqueous solution are exemplified. Of these embodiments, since embodiment (II) has been already described, the preferred embodiments other than (II) are described in detail below.

In the first place, a functional group capable of becoming an acid group by the hydrolysis with an alkali aqueous solution (a developing solution) having pH of 10 or more is explained. As such a functional group, a functional group represented by the following formula (10) is preferably exemplified, and it is preferred to have the functional group at the side chain of a polymer.

  Formula (10)

In formula (10), Q represents a linking group for linking the skeleton of a polymer main chain to $X^1$; and $X^1$ represents a protective group that is hydrolyzed in an alkali aqueous solution having pH of 10 or more. Here, when a functional group represented by formula (10) becomes -Q-OH after hydrolysis, -Q-OH represents an acid group having pKa of 10 or less.

Here, Q may represent a trivalent or more linking group, and in that case, formula (10) is represented by the following formula (10'). n represents an integer selected from 1 to 5.

  Formula (10')

In a case where a specific functional group becomes -Q-OH after hydrolysis, a linking group Q is in particular selected so that the pKa of -Q-OH is capable of 10 or less, especially preferably pKa of from 3 to 10. Q is preferably a linking group of hydrocarbon, and as such hydrocarbon groups, straight chin, branched, or cyclic alkyl groups and aromatic ring groups are exemplified, and of these groups, the groups capable of bringing the pKa of specific functional groups after hydrolysis into the above range are selected. In general, pKa can be in the above range by the introduction of an electron attractive group into such divalent or higher hydrocarbon groups.

As the preferred examples of hydrocarbon groups represented by Q, aromatic ring groups and cyclic ring groups are exemplified.

$X^1$ is not especially restricted so long as it is a functional group capable of functioning as a protective group until it is hydrolyzed by an alkali aqueous solution and desorbed.

As the preferred examples of such $X^1$, a substituted oxy group, a substituted thio group, and a substituted amino group are exemplified.

The specific functional group in the invention is more preferably a functional group represented by the following formula (11).

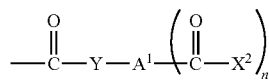  Formula (11)

In formula (11), $A^1$ represents an aromatic ring group or a cyclic ring group, and specifically an aromatic ring group having carbon atoms of from 4 to 50 or so, a heterocyclic group, a condensed polycyclic structure, and an aliphatic cyclic structure are exemplified.

n represents an integer selected from 1 to 5, and preferably from 1 to 3 in the light of the balance of alkali solubility of an unexposed area and the resistance to alkali developability of an exposed area.

$X^2$ represents —$NR^1R^2$, —$SR^3$ or —$OR^4$; $R^1$, $R^2$, $R^3$ and $R^4$ each represents a substituent composed of one or more atoms selected from the group consisting of a carbon atom, a hydrogen atom, an oxygen atom, a nitrogen atom, a sulfur atom, and a halogen atom, e.g., an alkyl group that may have a substituent and an aryl group that may have a substituent are exemplified.

As the alkyl groups, straight chain, branched, or cyclic alkyl groups having from 1 to 20 carbon atoms can be exemplified, and the specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these alkyl groups, straight chain alkyl groups having from 1 to 12 carbon atoms, branched alkyl groups having from 3 to 12 carbon atoms, and cyclic alkyl groups having from 5 to 10 carbon atoms are more preferred.

As the substituents that can be introduced into these alkyl groups, monovalent nonmetallic atomic groups exclusive of a hydrogen atom are exemplified. The examples of the substituents include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyl-oxy group, an N,N-diarylcarbamoyloxy group, an N-alkyl-N-arylcarbamoyloxy group, an alkylsulfoxy group, an arylsulfoxy group, an acylthio group, an acylamino group, an N-alkyl-acylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-aryl-ureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugate base group thereof, an alkoxycarbonyl group, an aryloxycarbonyl group, a carbamoyl group, an N-alkylcarbamoyl group, an N,N-dialkyl-carbamoyl group, an N-arylcarbamoyl group, an N,N-diaryl-carbamoyl group, an N-alkyl-N-arylcarbamoyl group, an alkyl-sulfinyl group, an arylsulfinyl group, an alkylsulfonyl group, an arylsulfonyl group, a sulfo group (—$SO_3H$) and a conjugate base group thereof, an alkoxysulfonyl group, an aryloxy-sulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-aryl-sulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-aryl-sulfamoyl group, an N-acylsulfamoyl group and a conjugate base group thereof, an N-alkylsulfonylsulfamoyl group (—$SO_2NHSO_2$(alkyl)) and a conjugate base group thereof, an N-arylsulfonylsulfamoyl group (—$SO_2NHSO_2$(aryl)) and a conjugate base group thereof, an N-alkylsulfonylcarbamoyl group (—$CONHSO_2$(alkyl)) and a conjugate base group thereof, an N-arylsulfonylcarbamoyl group (—$CONHSO_2$(aryl)) and a conjugate base group thereof, an alkoxysilyl group (—Si(Oalkyl)$_3$), an aryloxysilyl group (—Si)Oaryl)$_3$), a hydroxysilyl group (—Si(OH)$_3$) and a conjugate base group thereof, a phosphono group (—PO$_3$H$_2$) and a conjugate base group thereof, a dialkylphosphono group (—PO$_3$(alkyl)$_2$), a diaryl-phosphono group (—PO$_3$(aryl)$_2$), an alkylarylphosphono group (—PO$_3$(alkyl)(aryl)), a monoalkylphosphono group (—PO$_3$H-(alkyl)) and a conjugate base group thereof, a monoaryl-phosphono group (—PO$_3$H(aryl)) and a conjugate base group thereof, a phosphonoxy group (—OPO$_3$H$_2$) and a conjugate base group thereof, a dialkylphosphonoxy group (—OPO$_3$(alkyl)$_2$), a diarylphosphonoxy group (—OPO$_3$(aryl)$_2$), an alkylaryl-phosphonoxy group (—OPO$_3$(alkyl)(aryl)), a monoalkyl-phosphonoxy group (—OPO$_3$H(alkyl)) and a conjugate base group thereof, a monoarylphosphonoxy group (—OPO$_3$H(aryl)) and a conjugate base group thereof, a cyano group, a nitro group, a dialkylboryl group (—B(alkyl)$_2$), a diarylboryl group (—B(aryl)$_2$), an alkylarylboryl group (—B(alkyl)(aryl)), a dihydroxyboryl group (—B(OH)$_2$) and a conjugate base group thereof, an alkylhydroxyboryl group (—B(alkyl)(OH)) and a conjugate base group thereof, an arylhydroxyboryl group (—B(aryl)(OH)) and a conjugate base group thereof, an aryl group, an alkenyl group, and an alkynyl group.

As the aryl groups, a benzene ring, a ring formed by condensation of 2 or 3 benzene rings, and a ring formed by condensation of a benzene ring and a 5-membered unsaturated ring can be exemplified. Specifically, a phenyl group, a naphthyl group, an anthryl group, a phenanthryl group, an indenyl group, an acenaphthenyl group, a fluorenyl group, etc., can be exemplified, and of these groups a phenyl group and a naphthyl group are more preferred.

As the substituents that can be introduced into these aryl groups, the above alkyl groups, and the substituents capable of being introduced into the alkyl groups can be exemplified.

In such X$^2$, in particular, as the preferred examples of the substituted amino groups represented by —NR$^1$R$^2$, an acylamino group, an N-alkylacylamino group, an N-aryl-acylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkyl-ureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxy-carbonylamino group, an N-aryl-N-alkoxycarbonylamino group, and an N-aryl-N-aryloxycarbonylamino group are exemplified. As the alkyl groups and aryl groups in these groups, those shown above as the alkyl groups, substituted alkyl groups, aryl groups and substituted aryl groups can be exemplified. As for R$^8$ of the acyl groups (R$^8$CO—) in the acylamino group, N-alkylacylamino group and N-arylacylamino group, those shown above as the alkyl groups, substituted alkyl groups, aryl groups and substituted aryl groups can also be exemplified. Of these groups, an N-alkylamino group, an N,N-dialkylamino group, an N-arylamino group, and an acylamino group are exemplified as more preferred groups. As the preferred specific examples of substituted amino groups, a methylamino group, an ethylamino group, a diethylamino group, a morpholino group, a piperidino group, a pyrrolidino group, a phenylamino group, a benzoylamino group, an acetylamino group, etc., are exemplified.

Y represents a single bond, —O— or —NR$^5$—; and R$^5$ represents a hydrogen atom, or a hydrocarbon group having carbon atoms of from 1 to 10 or so. As the hydrocarbon groups represented by R$^5$, an alkyl group, an aryl group, an alkenyl group and an alkynyl group are exemplified.

As the specific examples of the alkyl groups, straight chain, branched, or cyclic alkyl groups having from 1 to 10 carbon atoms, e.g., a methyl group, an ethyl group, a propyl group, a butyl group, a pentyl group, a hexyl group, a heptyl group, an octyl group, a nonyl group, a decyl group, an isopropyl group, an isobutyl group, an sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group, a 2-norbornyl group and the like are exemplified.

As the specific examples of the aryl groups, aryl groups having from 1 to 10 carbon atoms, e.g., a phenyl group, a naphthyl group, an indenyl group, heteroaryl groups having from 1 to 10 carbon atoms and containing one hetero atom selected from the group consisting of a nitrogen atom, an oxygen atom, and a sulfur atom, e.g., a furyl group, a thienyl group, a pyrrolyl group, a pyridyl group, a quinolyl group and the like are exemplified.

As the specific examples of the alkenyl groups, straight chain, branched, or cyclic alkenyl groups having from 1 to 10 carbon atoms, e.g., a vinyl group, a 1-propenyl group, a 1-butenyl group, a 1-methyl-1-propenyl group, a 1-cyclopentenyl group, a 1-cyclohexenyl group and the like are exemplified.

As the specific examples of the alkynyl groups, alkynyl groups having from 1 to 10 carbon atoms, e.g., an ethynyl group, a 1-propynyl group, a 1-butynyl group, a 1-octynyl group and the like are exemplified.

R$^5$ may have a substituent, and the examples of such substituents are the same as those exemplified above as the introducible substituents in R$^1$ to R$^4$. However, the number of carbon atoms in R$^5$ is from 1 to 10 including the carbon atoms of the substituent.

Y preferably represents an oxygen atom or —NH— for the easiness of synthesis.

For introducing these specific functional groups into a polymer compound, a method of copolymerizing a monomer having a specific functional group and an unsaturated bond copolymerizable with other copolymerizing components in the molecule according to well-known methods is exemplified. Further, at this time, if necessary, other monomer not having a specific functional group can also be copolymerized. In the invention, a structural unit comprising such a monomer is sometimes called "a unit" in the polymer compound obtained by the copolymerization.

The preferred specific examples of units having a specific functional group are shown below, but the invention is not restricted thereto.

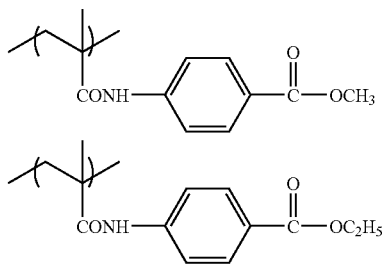

-continued
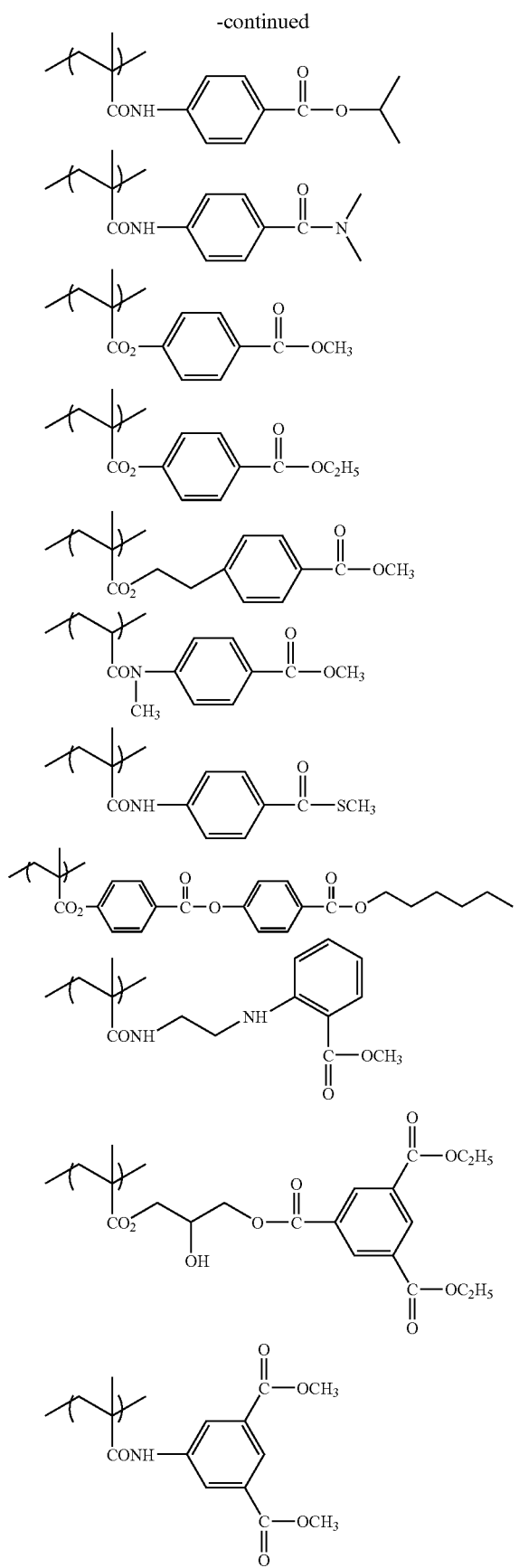
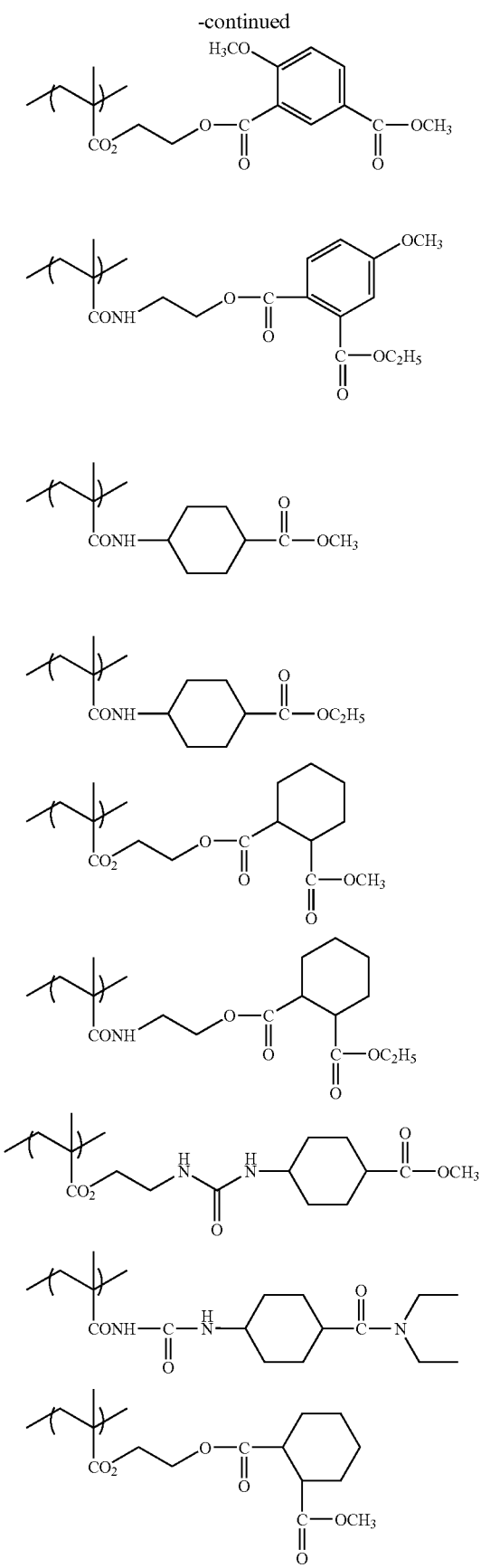

-continued

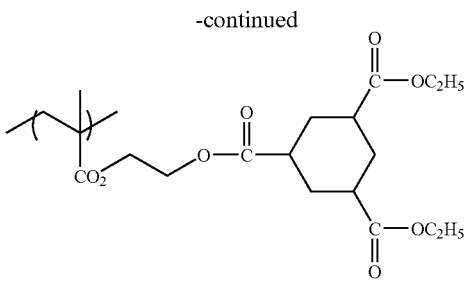

A unit having a specific functional group may be contained in a binder polymer one kind alone, or two or more kinds of units may be contained.

A binder polymer in the invention may be a polymer comprising a unit represented by formula (9) and a unit having a specific functional group alone, but a binder polymer is generally used in combination with a unit comprising other copolymerizing components described later. The total content of a unit having a specific functional group in a copolymer is arbitrarily determined by its structure and the design of a photosensitive layer, but is preferably from 1 to 99 mol % based on the total molar amount of the polymer components, more preferably from 5 to 90 mol %, and still more preferably from 10 to 70 mol %.

The structural unit having a specific acid group contained in a binder polymer may be one kind alone, or two or more kinds may be contained.

The content of an acid group having an acid dissociation constant (pKa) of from 0 to 11 of embodiment (II) in an organic polymer in the invention is preferably from 0.01 to 10.0 mmol per g of the organic polymer, and more preferably from 0.05 to 7.0 mmol.

As another more preferred embodiment, it is preferred for a binder polymer to have an acid group having a pKa of from 0 to 11 and an ethylenic unsaturated double bond (hereinafter sometimes referred to as "a radical polymerizable group") at the side chain of the binder polymer. For introducing a radical polymerizable group into the side chain of an organic polymer, a method of combining a unit having a radical polymerizable group of a structure represented by any of the following formulae (A) to (E) in addition to the above unit having a specific functional group is exemplified. The content of a radical polymerizable group in an organic polymer (the content of a radical polymerizable unsaturated double bond according to an iodometric titration flow method) is preferably from 0.1 to 10.0 mmol per g of the organic polymer, more preferably from 1.0 to 8.0 mmol, and most preferably from 1.5 to 7.0 mmol. Such a unit contained in an organic polymer may be one kind alone, or two or more kinds may be contained.

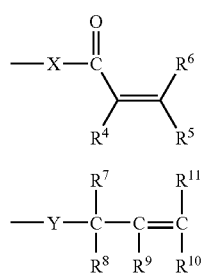

Formula (A)

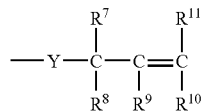

Formula (B)

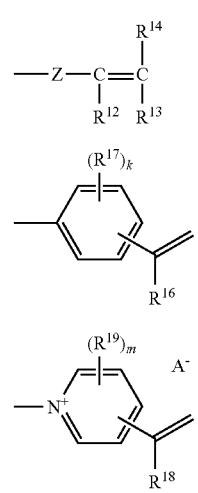

Formula (C)

Formula (D)

Formula (E)

Formulae (A) to (C) are described in the first place. In formulae (A) to (C), $R^4$ to $R^{14}$ each represents a hydrogen atom or a monovalent substituent; X and Y each represents an oxygen atom, a sulfur atom, or —N—$R^{15}$; Z represents an oxygen atom, a sulfur atom, —N—$R^{15}$, or a phenylene group; and $R^{15}$ represents a hydrogen atom or a monovalent organic group.

In formula (A), $R^4$, $R^5$ and $R^6$ each represents a hydrogen atom or a monovalent substituent, and $R^4$ represents a hydrogen atom, or an organic group, e.g., alkyl group, and especially preferably represents a hydrogen atom, a methyl group, a methylalkoxyl group or a methyl ester group. $R^5$ and $R^6$ each represents a hydrogen atom, a halogen atom, an amino group, a dialkylamino group, a carboxyl group, an alkoxycarbonyl-group, a sulfo group, a nitro group, a cyano group, an alkyl group, an aryl group, an alkoxyl group, an aryloxy group, an alkylamino group, an arylamino group, an alkylsulfonyl group, or an arylsulfonyl group, and preferably a hydrogen atom, a carboxyl group, an alkoxycarbonyl group, an alkyl group, or an aryl group.

Here, each of the above groups may have a substituent, and as the examples of such substituents, a methoxycarbonyl group, an ethoxycarbonyl group, an isopropoxycarbonyl group, a methyl group, an ethyl group, and a phenyl group are exemplified.

X represents an oxygen atom, a sulfur atom, or —N—$R^{15}$, and as $R^{15}$, an alkyl group which may have a substituent, and the like are exemplified.

In formula (B), $R^7$, $R^8$, $R^9$, $R^{10}$ and $R^{11}$ each represents a hydrogen atom or a monovalent substituent, specifically, e.g., a hydrogen atom, a halogen atom, an amino group, a dialkylamino group, a carboxyl group, an alkoxycarbonyl group, a sulfo group, a nitro group, a cyano group, an alkyl group, an aryl group, an alkoxyl group, an aryloxy group, an alkylamino group, an arylamino group, an alkylsulfonyl group, and an arylsulfonyl group are exemplified, and a hydrogen atom, a carboxyl group, an alkoxycarbonyl group, an alkyl group, and an aryl group are preferred.

These groups may have a substituent, and as the substituents that can be introduced to these groups, those exemplified as the substituents introducible into formula (A) can be exemplified.

Y represents an oxygen atom, a sulfur atom, or —N—$R^{15}$. As $R^{15}$, the same groups as in formula (A) can be exemplified.

In formula (C), $R^{12}$, $R^{13}$ and $R^{14}$ each represents a hydrogen atom or a monovalent substituent, and specifically, e.g., a hydrogen atom, a halogen atom, an amino group, a dialkylamino group, a carboxyl group, an alkoxycarbonyl group, a sulfo group, a nitro group, a cyano group, an alkyl group, an aryl group, an alkoxyl group, an aryloxy group, an alkylamino group, an arylamino group, an alkylsulfonyl group, an arylsulfonyl group, etc., are exemplified, and a hydrogen atom, a carboxyl group, an alkoxycarbonyl group, an alkyl group, and an aryl group are preferred above all.

These groups may have a substituent, and as the substituents that can be introduced to these groups, those described above as the substituents introducible to formula (A) can be exemplified.

Z represents an oxygen atom, a sulfur atom, $-N-R^{15}$, or a phenylene group, and as $R^{15}$, the same groups as in formula (A) are exemplified.

The preferred specific examples of the units having a radical polymerizable group of a structure represented by any of formulae (A) to (C) are shown below, but the invention is not restricted thereto.

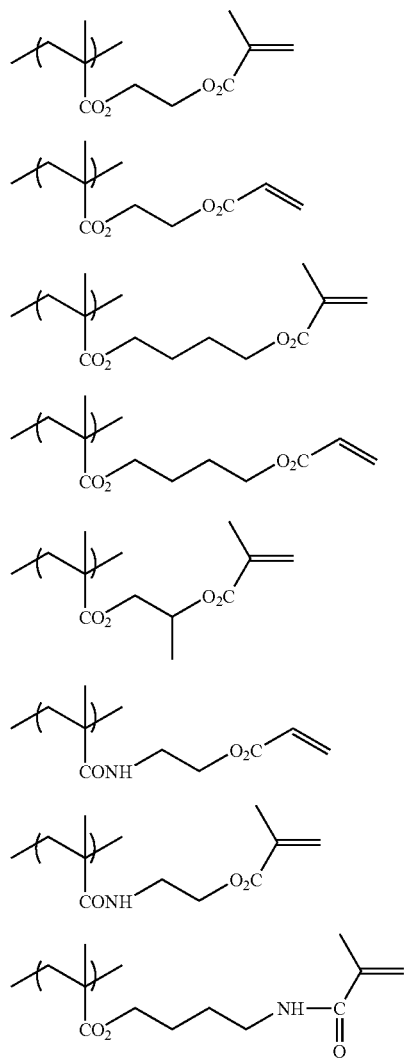

-continued

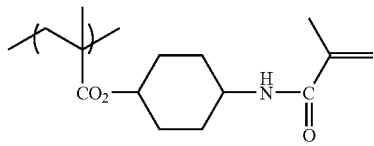

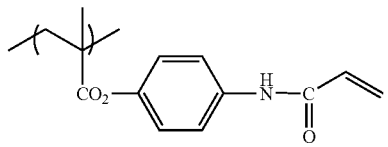

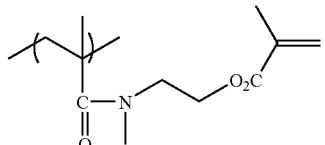

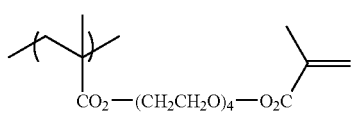

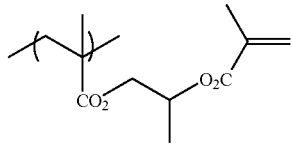

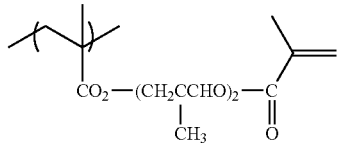

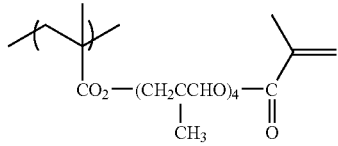

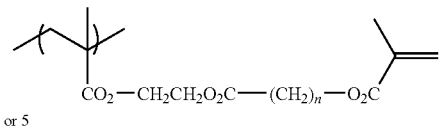

n is 4 or 5

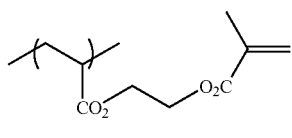

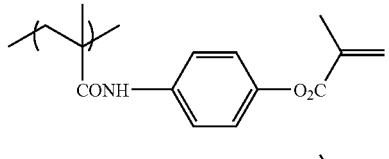

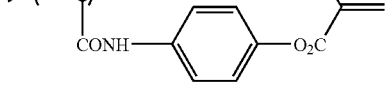

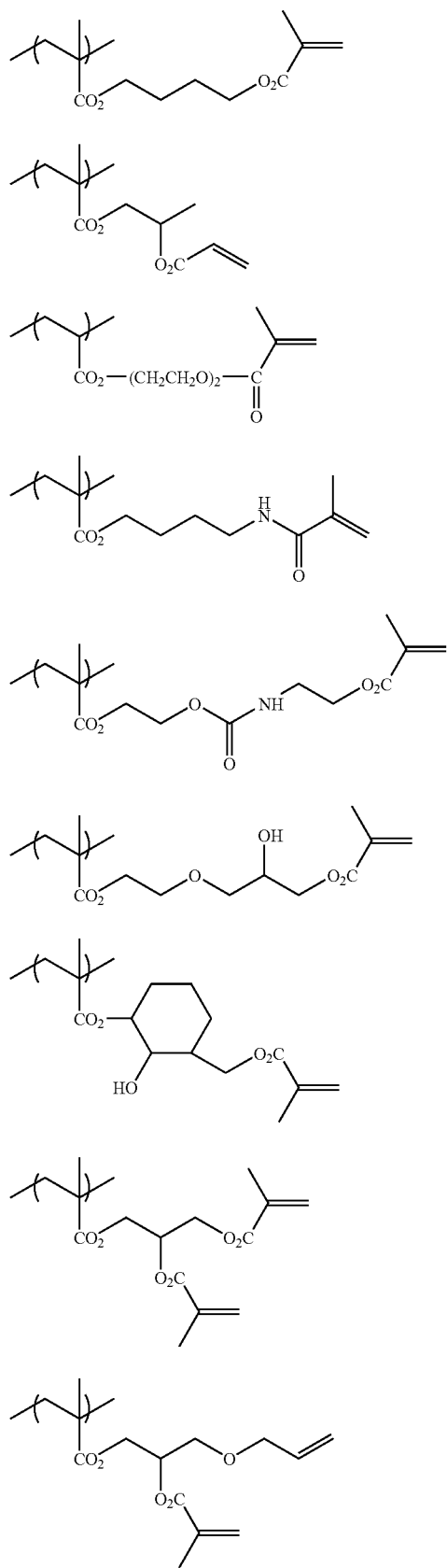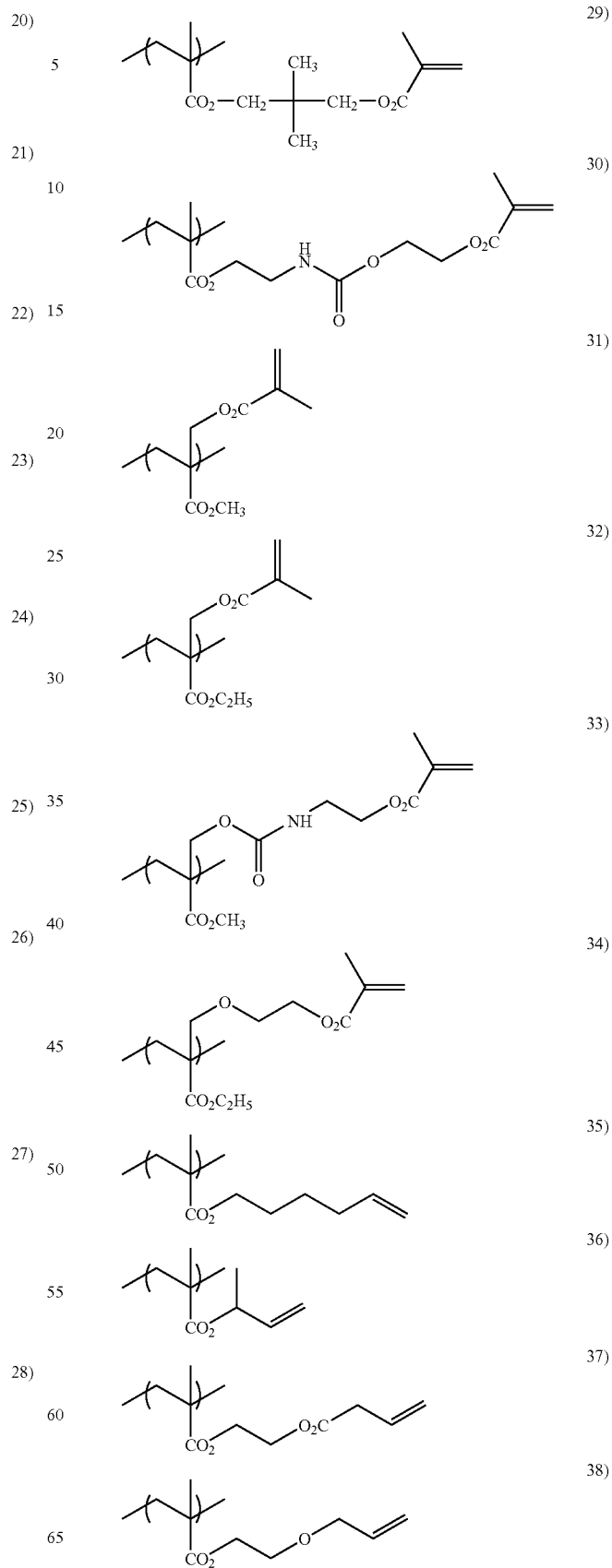

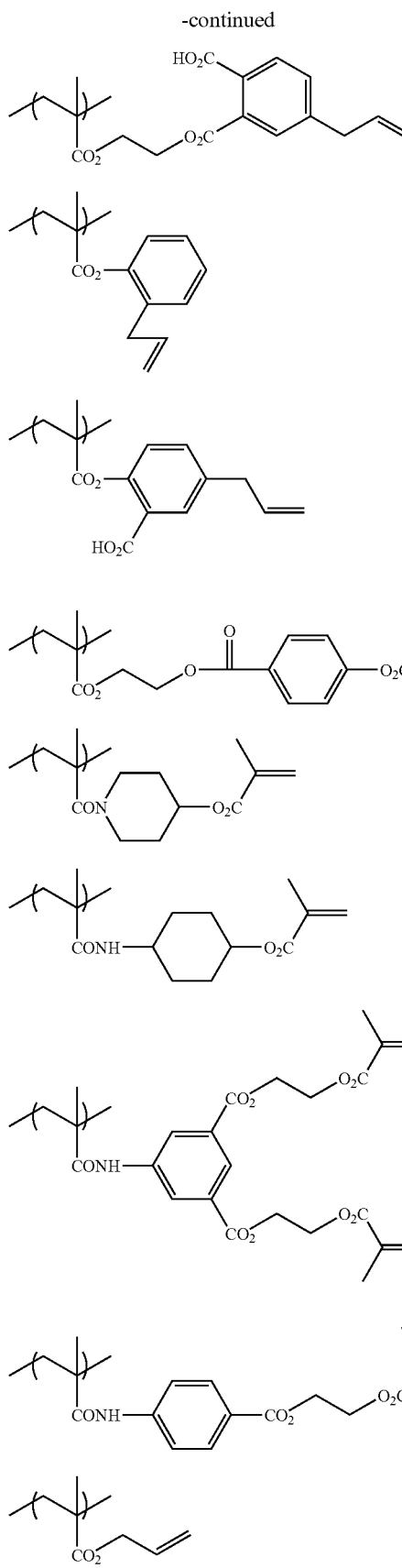

A polymer having a radical polymerizable group of a structure represented by formula (A) of the invention can be manufactured according to at least either the synthesis method (1) or (2) shown below.

Synthesis Method (1):

A method of obtaining a desired polymer compound by polymerizing one or more radical polymerizable compounds represented by the following formula (a) to synthesize a polymer compound, and then extracting a proton with a base- and desorbing $Z^1$:

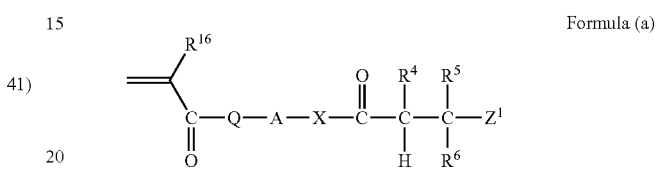

In formula (a), $R^4$ to $R^6$ have the same meaning as $R^4$ to $R^6$ in formula (A); $Z^1$ represents an anionic separating group; Q represents an oxygen atom, —NH—, or —$NR^{17}$— (wherein $R^{17}$ represents an alkyl group that may have a substituent); $R^{16}$ represents a hydrogen atom or an alkyl group that may have a substituent, above all a hydrogen atom, a methyl group, a methylalkoxyl group, and a methyl ester group are preferred; and A represents a divalent organic linking group.

As radical polymerizable compounds represented by formula (a), the following compounds can be exemplified, but the invention is not restricted thereto.

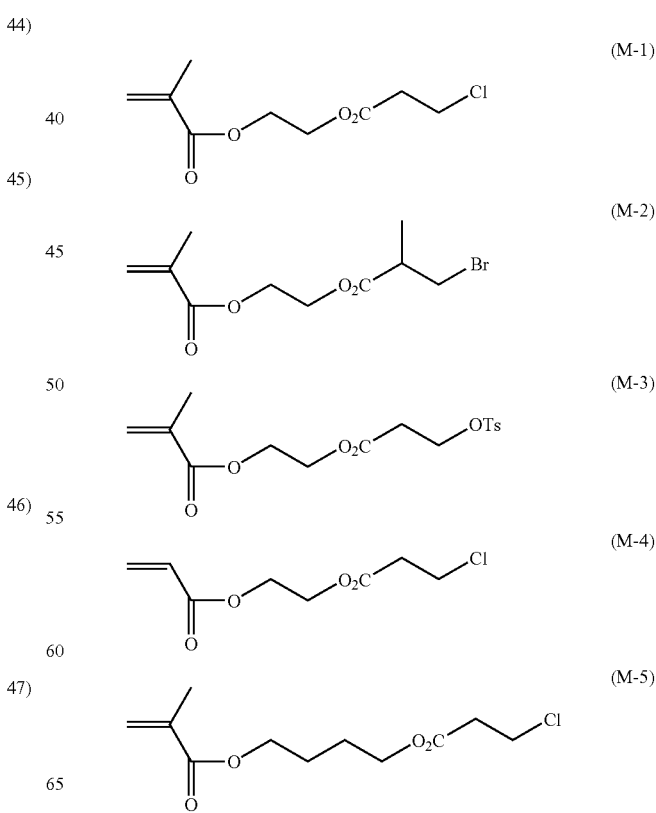

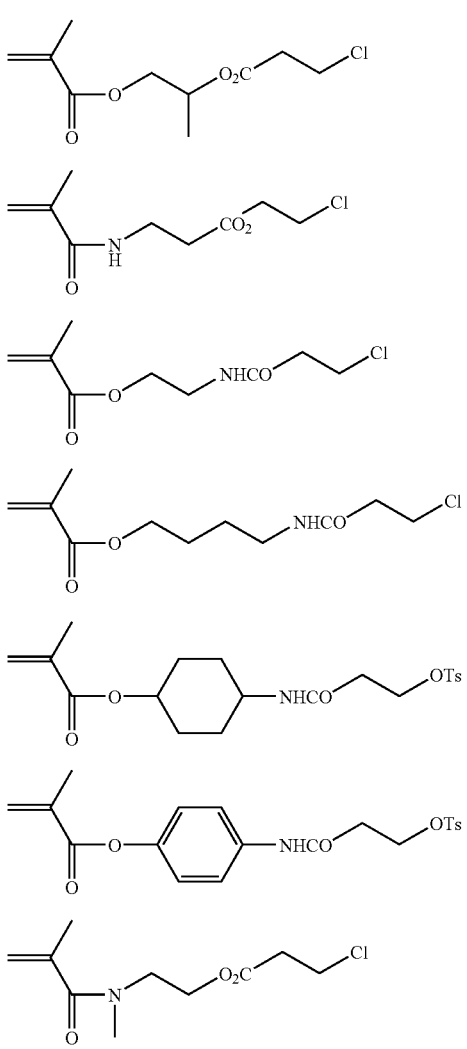

Radical polymerizable compounds represented by formula (a) are easily available commercially or by synthesis methods shown in the later-described synthesis examples.

A group represented by formula (A) can be introduced by synthesizing a polymer compound by polymerization according to an ordinary radical polymerization method by using one or more radical polymerizable compounds represented by formula (a) and, if necessary, other radical polymerizable compounds, dropping a desired amount of a base to the polymer solution under the condition of cooling or heating to carry out reaction, and performing neutralization treatment with an acid, if desired. Generally well-known suspension polymerization methods or solution polymerization methods can be applied to the manufacture of polymer compounds.

As the bases used, either inorganic compounds (inorganic bases) or organic compounds (organic bases) may be used. As preferred inorganic bases, sodium hydroxide, potassium hydroxide, sodium carbonate, sodium hydrogencarbonate, potassium carbonate, and potassium hydrogencarbonate are exemplified, and as organic bases, metal alkoxides, e.g., sodium methoxide, sodium ethoxide, and potassium t-butoxide, and organic amine compounds, e.g., triethylamine, pyridine, and diisopropylethylamine are exemplified.

Synthesis Method (2):

A method of obtaining a desired polymer compound by polymerizing one or more radical polymerizable compounds having a functional group to synthesize a backbone polymer compound (a polymer compound constituting the main chain), and then reacting the side chain functional group of the backbone polymer compound with a compound having a structure represented by the following formula (b):

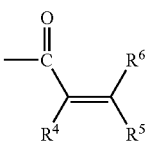

Formula (b)

$R^4$, $R^5$ and $R^6$ in formula (b) have the same meaning as $R^4$, $R^5$ and $R^6$ in formula (A).

As the examples of the functional groups of the radical polymerizable compounds having a functional group for use in the synthesis of the backbone polymer compound in synthesis method (2), a hydroxyl group, a carboxyl group, a carboxylic acid halide group, a carboxylic acid anhydride group, an amino group, a halogenated alkyl group, an isocyanate group, an epoxy group, etc., are exemplified. As the specific examples of the radical polymerizable compounds having such a functional group, 2-hydroxyethyl acrylate, 2-hydroxyethyl methacrylate, 4-hydroxybutyl acrylate, 4-hydroxybutyl methacrylate, acrylic acid, methacrylic acid, acrylic acid chloride, methacrylic acid chloride, methacrylic acid anhydride, N,N-dimethyl-2-aminoethyl methacrylate, 2-chloroethyl methacrylate, 2-isocyanic acid ethyl methacrylate, glycidyl acrylate, glycidyl methacrylate, etc., are exemplified.

A desired polymer compound can be obtained by the synthesis of a backbone polymer compound by polymerization by using one or more radical polymerizable compounds having such a functional group, and, if necessary, copolymerization with other radical copolymerizable compound, and then reacting with a compound having a group represented by formula (b).

As the examples of the compounds having a group represented by formula (b), the compounds exemplified as the specific examples of the radical polymerizable compounds having such a functional group can be exemplified.

A polymer having a radical polymerizable group of a structure represented by formula (B) of the invention can be manufactured according to at least either the synthesis method (3) or (4) shown below.

Synthesis Method (3):

A method of obtaining a polymer compound by polymerizing one or more radical polymerizable compounds having an unsaturated group represented by formula (B) and an ethylenic unsaturated group richer in addition polymerizability than the unsaturated group represented by formula (B), and if necessary, other radical polymerizable compound. This is a method to use a compound having in one molecule a plurality of ethylenic unsaturated bonds different in addition polymerizability, e.g., such a compound as allyl methacrylate.

The radical polymerizable compounds having an unsaturated group represented by formula (B) and an ethylenic unsaturated group richer in addition polymerizability than the unsaturated group represented by formula (B) include allyl acrylate, allyl methacrylate, 2-allyloxyethyl acrylate, 2-allyloxyethyl methacrylate, propargyl acrylate, propargyl methacrylate, N-allyl acrylate, N-allyl methacrylate, N,N-diallyl acrylate, N,N-diallyl methacrylamide, allyl acrylamide, allyl methacrylamide, etc.

Synthesis Method (4):

A method of introducing a group represented by formula (B) by polymerizing one or more radical polymerizable compounds having a functional group to synthesize a polymer compound, and then reacting the side chain functional group of the polymer compound with a compound having a structure represented by the following formula (c):

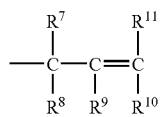

Formula (c)

$R^7$ to $R^{11}$ in formula (c) have the same meaning as $R^7$ to $R^{11}$ in formula (B).

As the specific examples of the radical polymerizable compounds having a functional group in synthesis method (4), the specific examples of the radical polymerizable compounds having a functional group shown in synthesis method (2) can be exemplified.

As the compounds having a structure represented by formula (c), allyl-alcohol, allylamine, diallylamine, 2-allyloxyethyl alcohol, 2-chloro-1-butene, and allyl isocyanate are exemplified.

A polymer having a radical polymerizable group of a structure represented by formula (C) of the invention can be manufactured according to at least either the synthesis method (5) or (6) shown below.

Synthesis Method (5):

A method of obtaining a polymer compound by the copolymerization of one or more radical polymerizable compounds having an unsaturated group represented by formula (C) and an ethylenic unsaturated group richer in addition polymerizability than the unsaturated group represented by formula (C), and if necessary, other radical polymerizable compound.

The radical polymerizable compounds having an unsaturated group represented by formula (C) and an ethylenic unsaturated group richer in addition polymerizability than the unsaturated group represented by formula (C) include vinyl acrylate, vinyl methacrylate, 2-phenylvinyl acrylate, 2-phenylvinyl methacrylate, 1-propenyl acrylate, 1-propenyl methacrylate, vinyl acrylamide, vinyl methacrylamide, etc.

Synthesis Method (6):

A method of introducing a group represented by formula (C) by polymerizing one or more radical polymerizable compounds having a functional group to synthesize a polymer compound, and then reacting the side chain functional group of the polymer compound with a compound having a structure represented by the following formula (d):

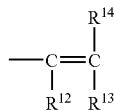

Formula (d)

$R^{12}$, $R^{13}$ and $R^{14}$ in formula (d) have the same meaning as $R^{12}$, $R^{13}$ and $R^{14}$ in formula (C).

As the specific examples of the radical polymerizable compounds having a functional group in synthesis method (6), the specific examples of the radical polymerizable compounds having a functional group shown in synthesis method (2) can be exemplified.

As the compounds having a structure represented by formula (d), 2-hydroxyethyl monovinyl ether, 4-hydroxybutyl monovinyl ether, diethylene glycol monovinyl ether, and 4-chloromethylstyrene are exemplified.

The synthesis methods (1) to (6) of the polymers having a radical polymerizable group of a structure represented by any of formulae (A) to (C) of the invention were described. For synthesizing the specific binder polymers of the invention using these synthesis methods, in polymerizing a radical polymerizable compound in each of synthesis methods (1) to (6), the synthesis can be achieved by copolymerizing the radical polymerizable compound and a unit represented by the above formula (9) in a prescribed ratio.

In the next place, formulae (D) and (E) are explained.

In formula (D), $R^{16}$ represents a hydrogen atom or a methyl group; $R^{17}$ represents an arbitrary atom or atomic group capable of substitution; and k represents an integer of from 0 to 4. A radical polymerizable group represented by formula (D) is bonded to the polymer main chain via a single bond or a linking group comprising an arbitrary atom or atomic group, and the way of bonding is not especially restricted.

In formula (E), $R^{18}$ represents a hydrogen atom or a methyl group; $R^{19}$ represents an arbitrary atom or atomic group capable of substitution; m represents an integer of from 0 to 4; and $A^-$ represents an anion. Such a pyridinium ring may take a form of benzopyridinium that is obtained by condensation of a benzene ring as the substituent, and a quinolium group and an isoquinolium group are included in that case. A radical polymerizable group represented by formula (E) is bonded to the polymer main chain via a single bond or a linking group comprising an arbitrary atom or atomic group, and the way of bonding is not especially restricted.

The preferred examples of the units (repeating units) containing a radical polymerizable group represented by formula (D) or (E) are shown below, but the invention is not restricted to these examples.

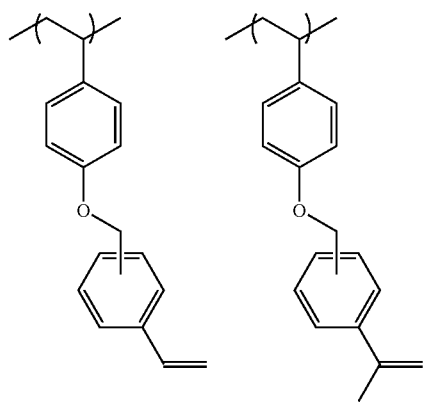

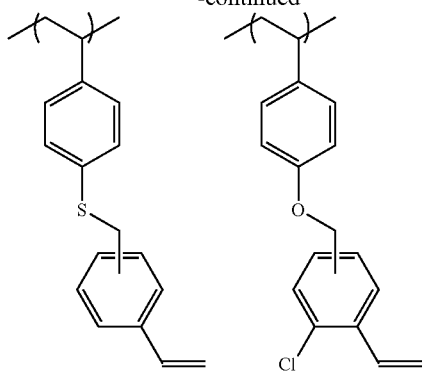
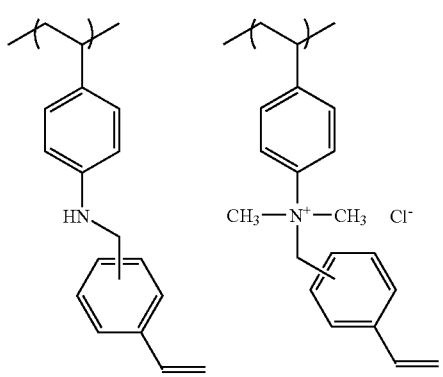
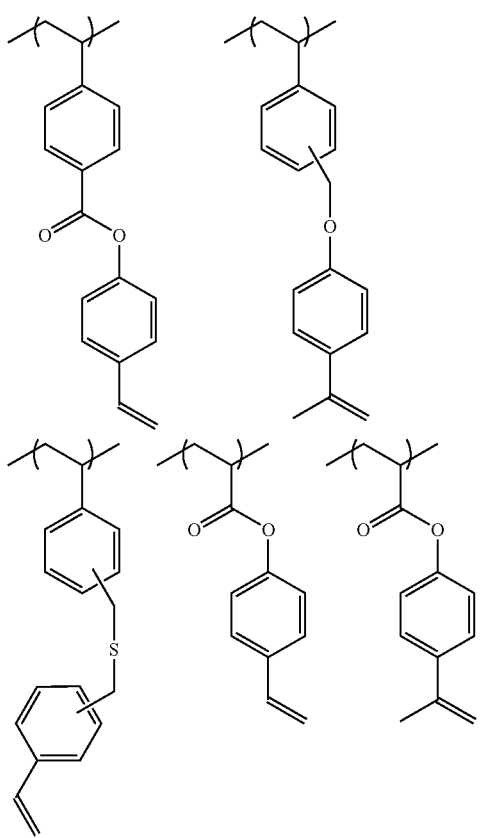
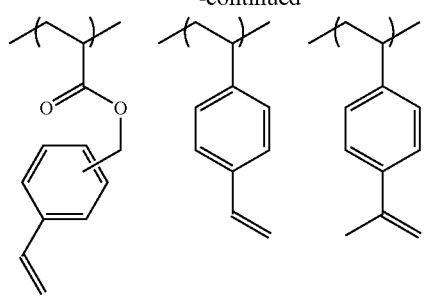
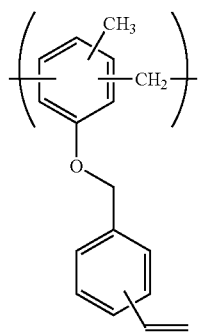
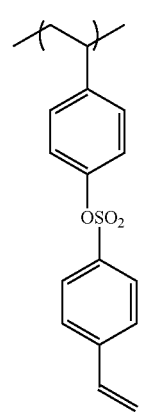
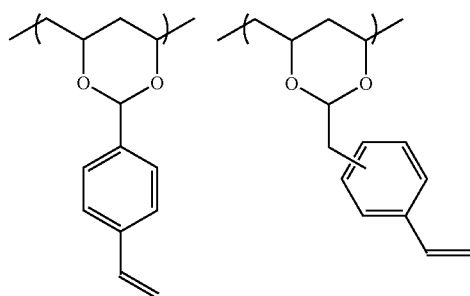
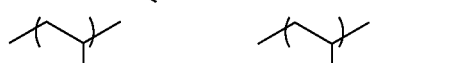
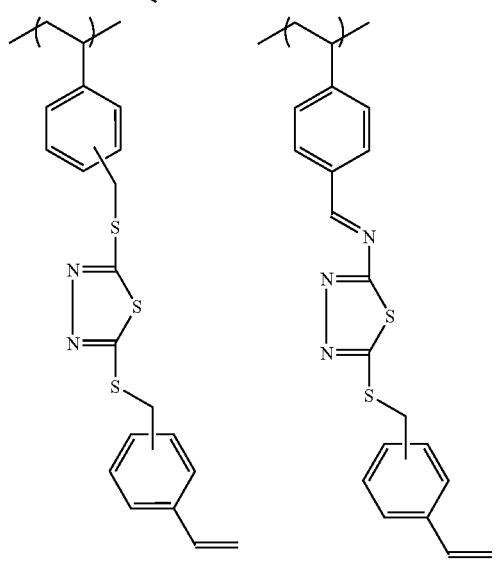

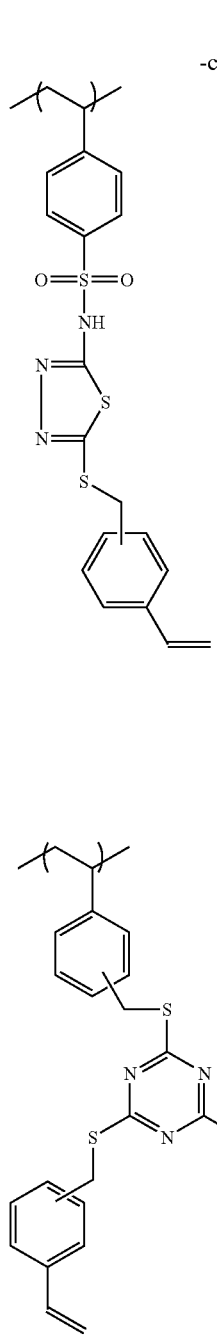
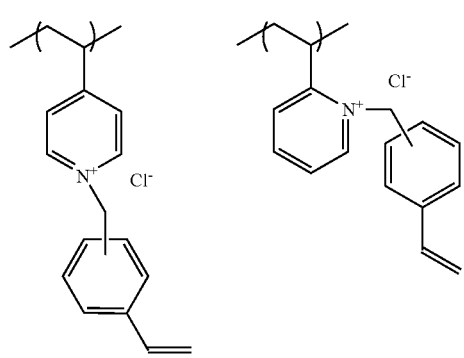
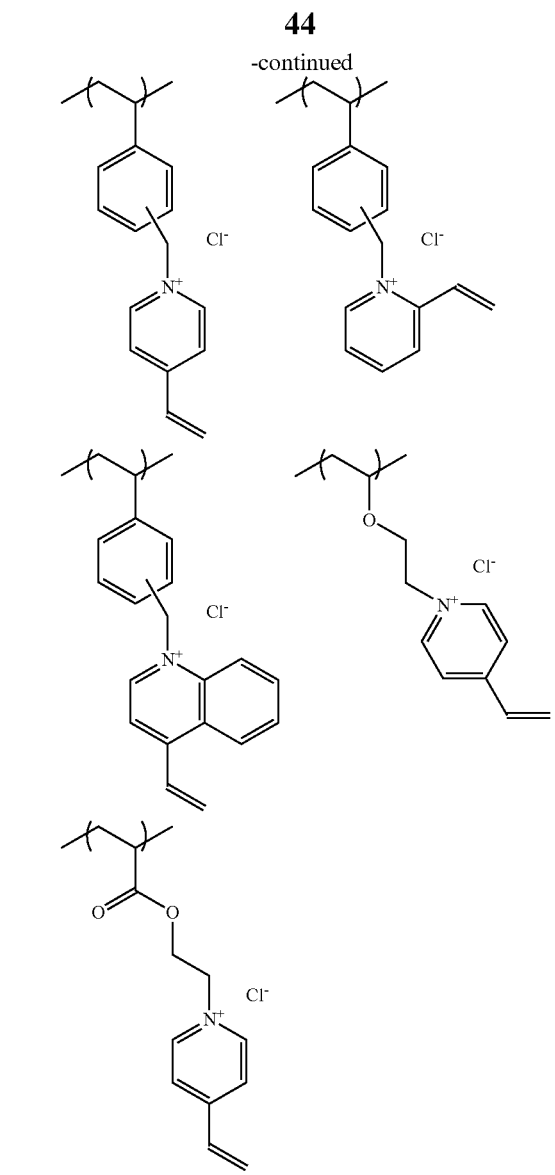

Of the radical polymerizable groups represented by formulae (A) to (E), the radical polymerizable groups of structures represented by formulae (A) and (B) are preferred, the radical polymerizable group of the structure represented by formula (A) is more preferred, and formula (A) in which $R^4$ represents a hydrogen atom or a methyl group, and X represents an oxygen atom or a: nitrogen atom is most preferred.

Other than the units having a carboxylic acid group and the units of preferred embodiments having the radical polymerizable groups, a binder polymer of the invention may contain the following copolymerization components. As such copolymerization components, conventionally well-known polymerizable components can be used with no limitation so long as they are radical polymerizable monomers. Specifically, the monomers described in Kobunshi Data Handbook—Kiso-Hen (Polymer Data Handbook—Elementary Course), compiled by Kobunshi Gakkai and published by Baifukan (1986) are exemplified. These copolymerizable components may be used one kind alone or two or more kinds may be used in combination.

As especially preferred copolymerizable components, the following monomers having a radical polymerizable group are exemplified.

For example, radical polymerizable compounds selected from acrylic esters, methacrylic esters, N,N-disubstituted acrylamides, N,N-disubstituted methacrylamides, styrenes, acrylonitriles, methacrylonitriles, etc., are exemplified.

Specifically, acrylic esters, e.g., alkyl acrylate (the carbon atom number of the alkyl group is preferably from 1 to 20) (specifically, e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxy-pentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, etc.), allyl acrylate (e.g., phenyl acrylate, etc.), methacrylic esters, e.g., alkyl methacrylate (the carbon atom number of the alkyl group is preferably from 1 to 20) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxy-pentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, etc.), allyl methacrylate, (e.g., phenyl methacrylate, cresyl methacrylate, naphthyl methacrylate, etc.), styrenes, e.g., styrene, alkylstyrene (e.g., methylstyrene, dimethylstyrene, trimethylstyrene, ethylstyrene, diethyl-styrene, isopropylstyrene, butylstyrene, hexylstyrene, cyclohexylstyrene, decylstyrene, benzylstyrene, chloromethylstyrene, trifluoromethylstyrene, ethoxymethyl-styrene, acetoxymethylstyrene, etc.), alkoxystyrene (e.g., methoxystyrene, 4-methoxy-3-methylstyrene, dimethoxystyrene, etc.), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), acrylonitrile, methacrylonitrile, etc., are exemplified.

Of these radical polymerizable compounds, acrylic esters, methacrylic esters and styrenes are preferably used.

These radical polymerizable compounds can be used one kind alone, or two or more kinds in combination.

The most preferred embodiment of the binder polymer of the invention is a case of having the specific radical polymerizable group together with a carboxylic acid group represented by formula (9).

The specific examples of the binder polymers in the invention are shown below, by classifying the compounds to a group having the radical polymerizable group (i-1) to (i-46), and a group not having the radical polymerizable group (ii-1) to (ii-5), but the invention is not restricted thereto.

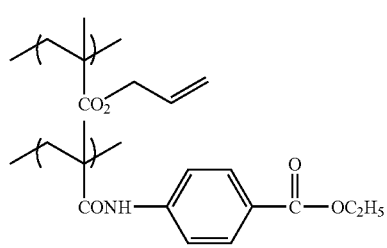

(i-1)

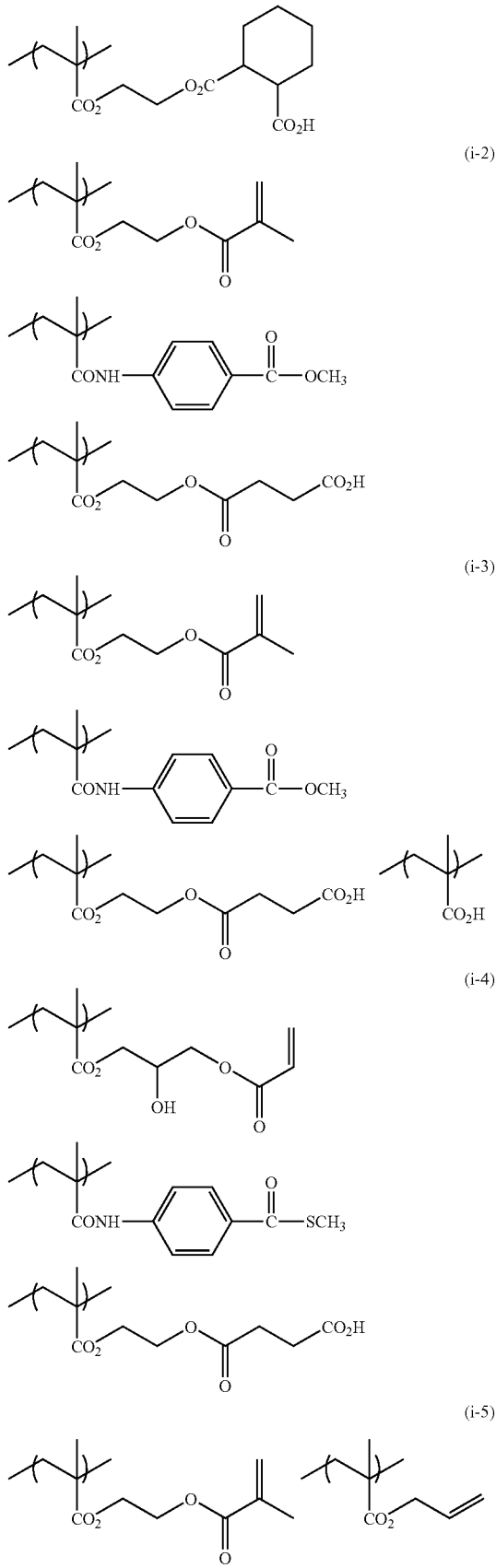

(i-2)

(i-3)

(i-4)

(i-5)

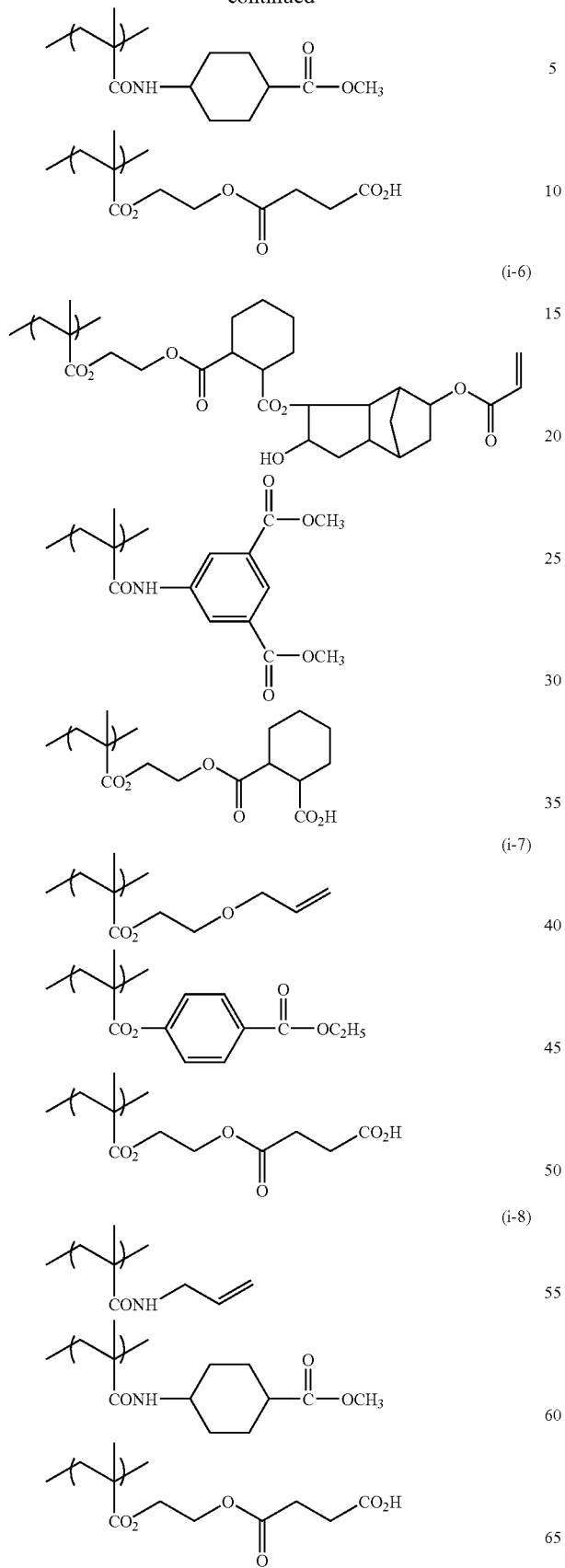

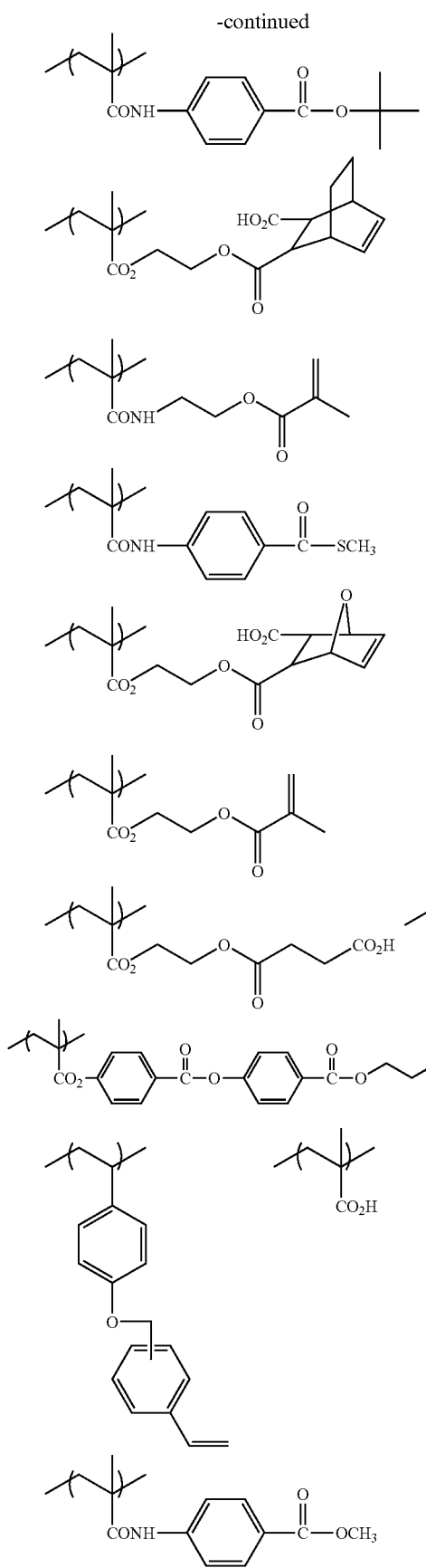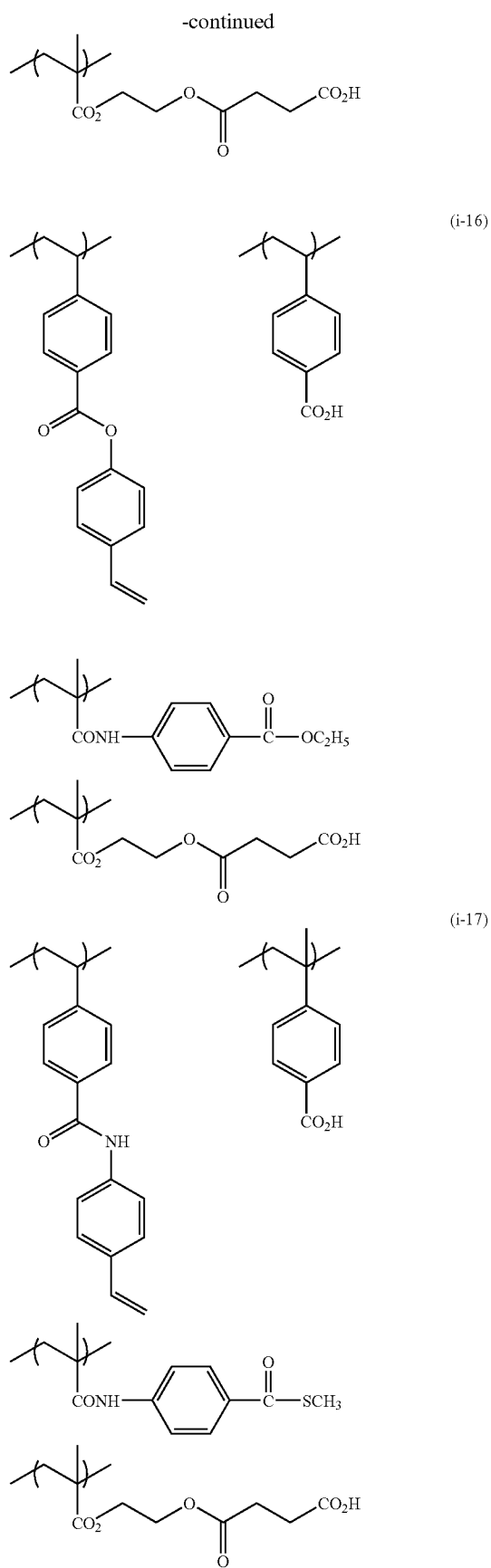

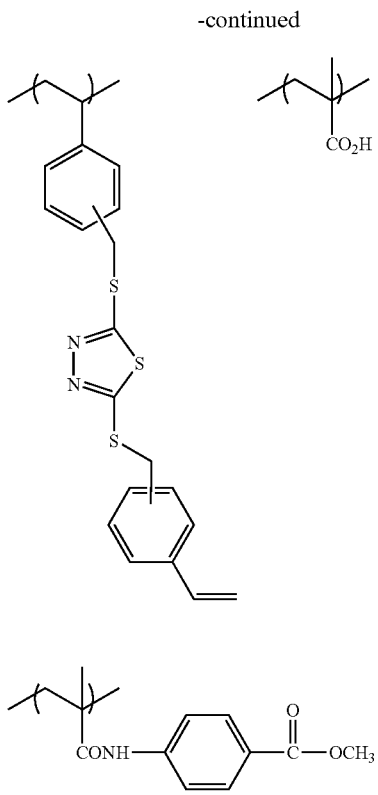
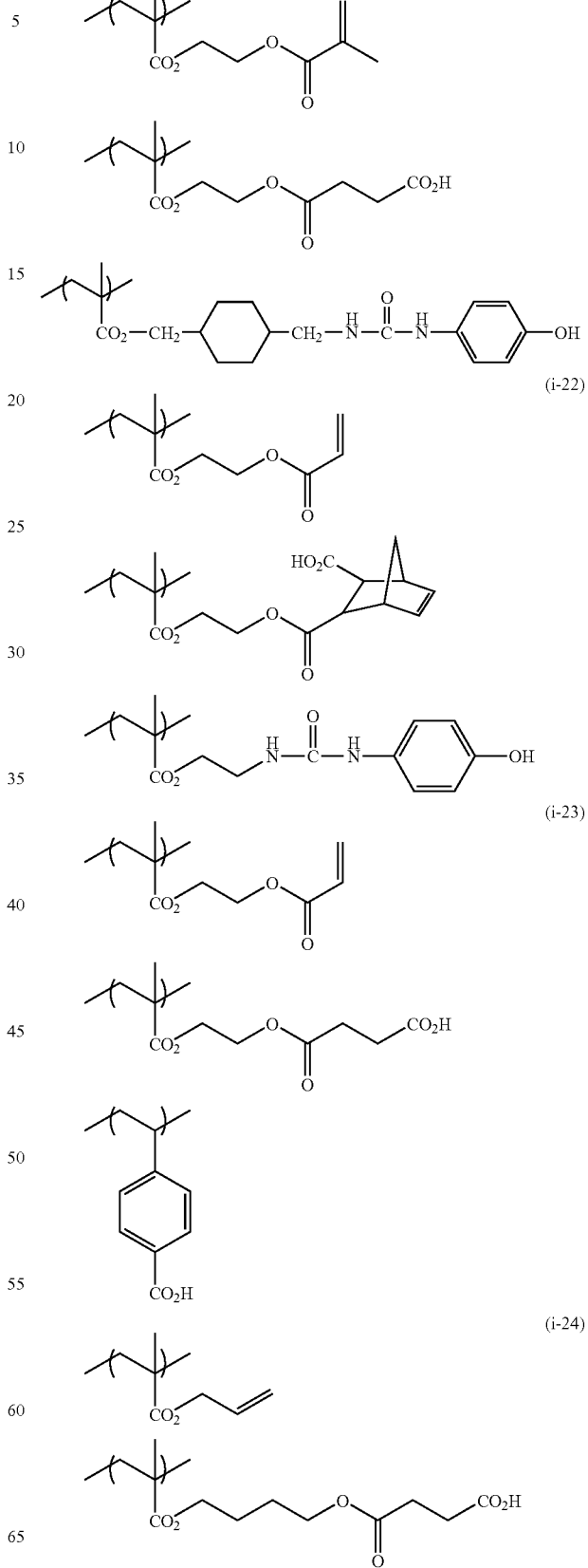

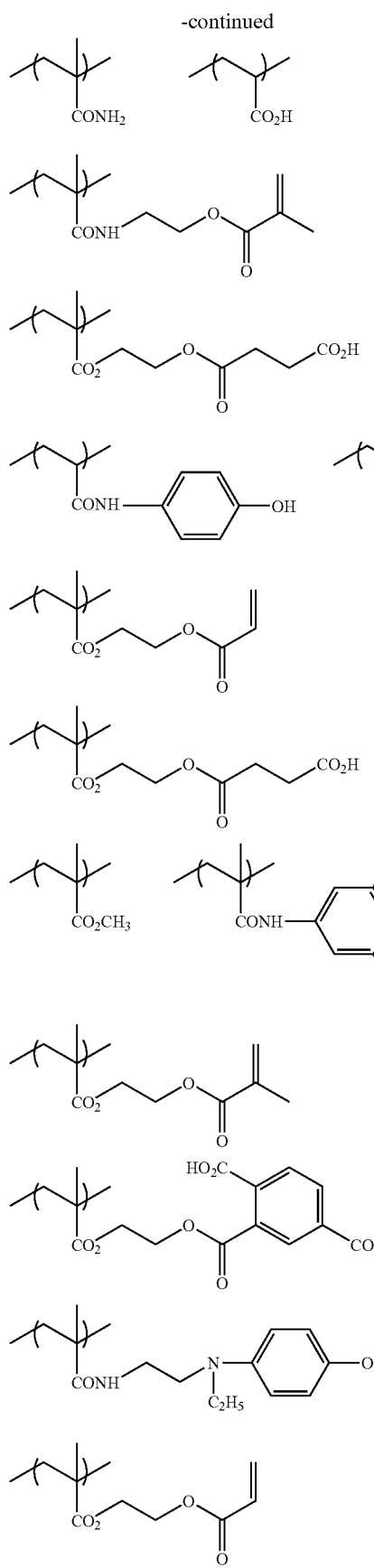
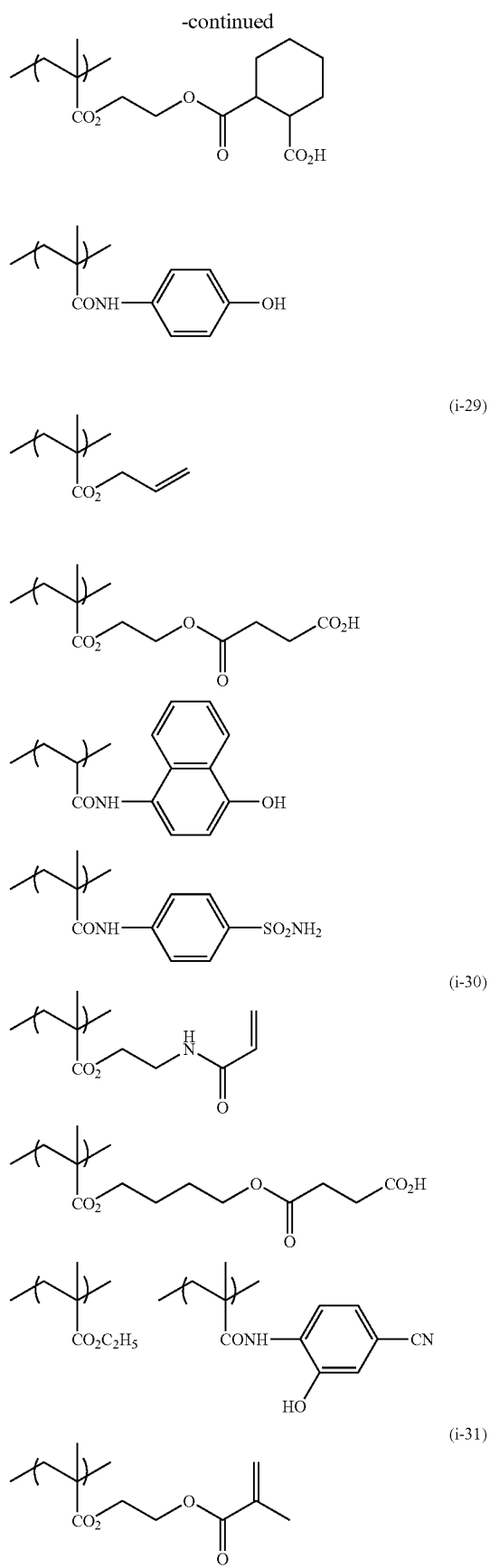

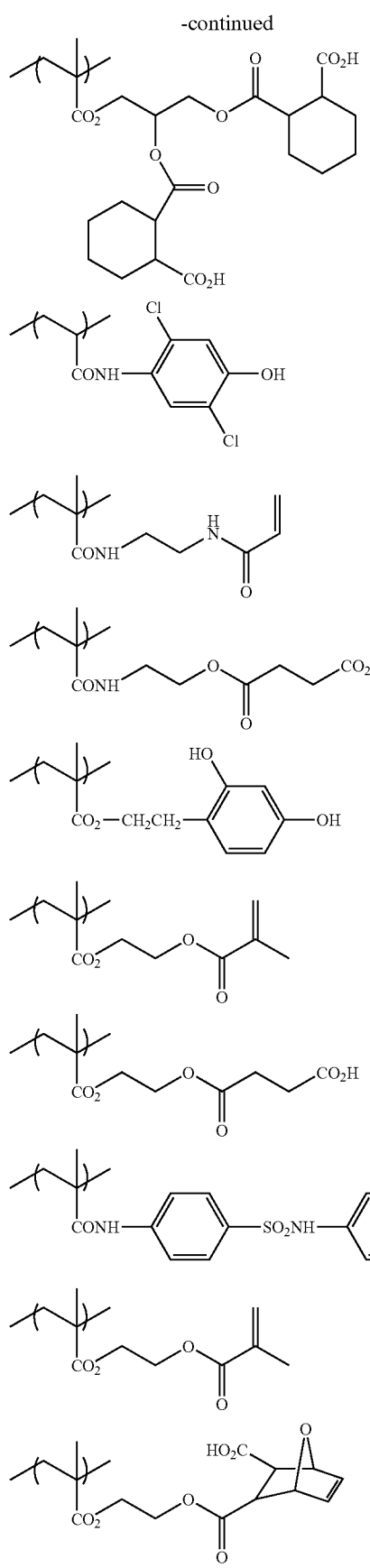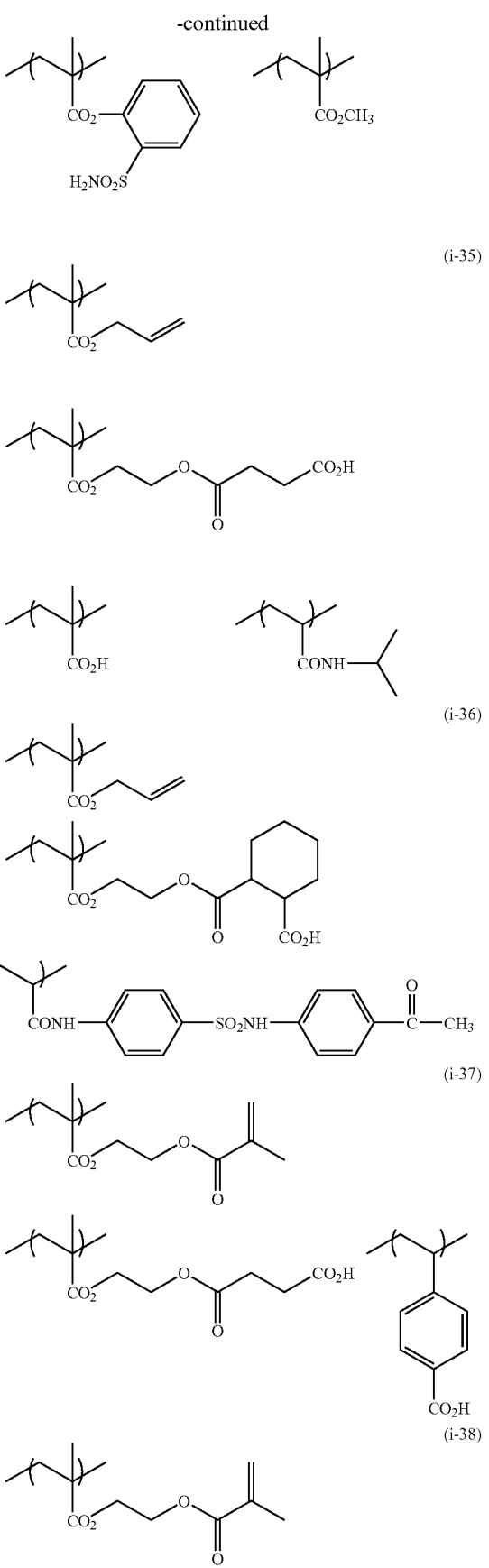

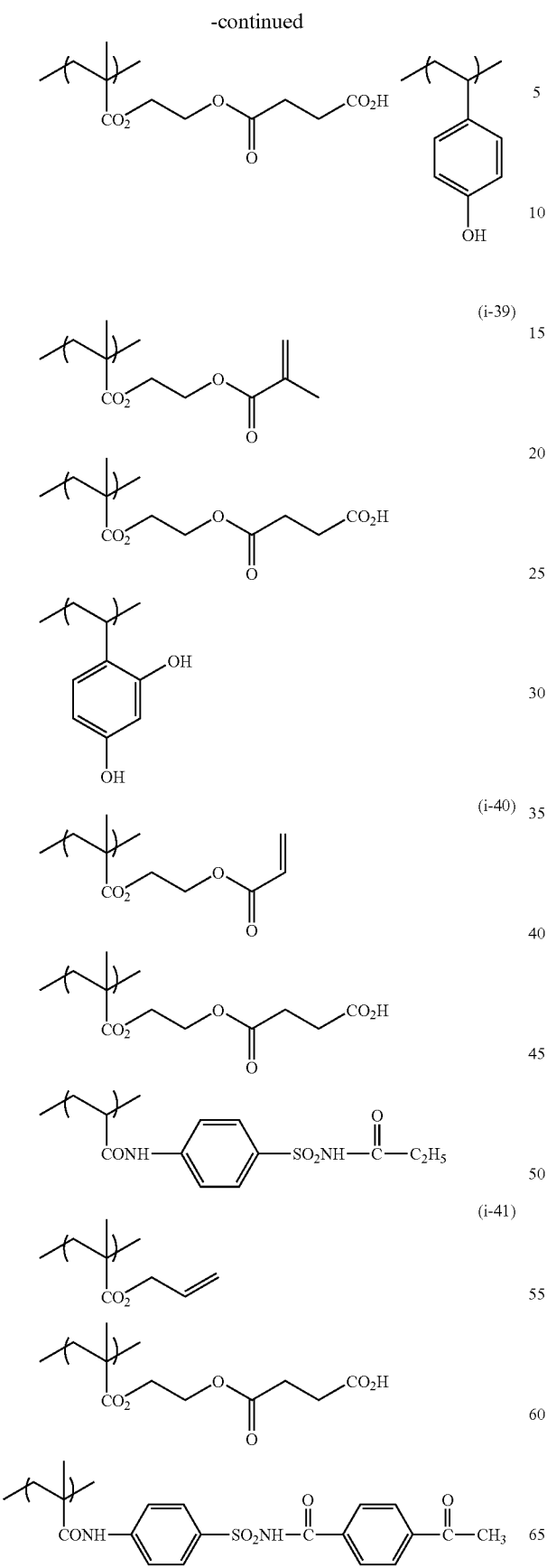
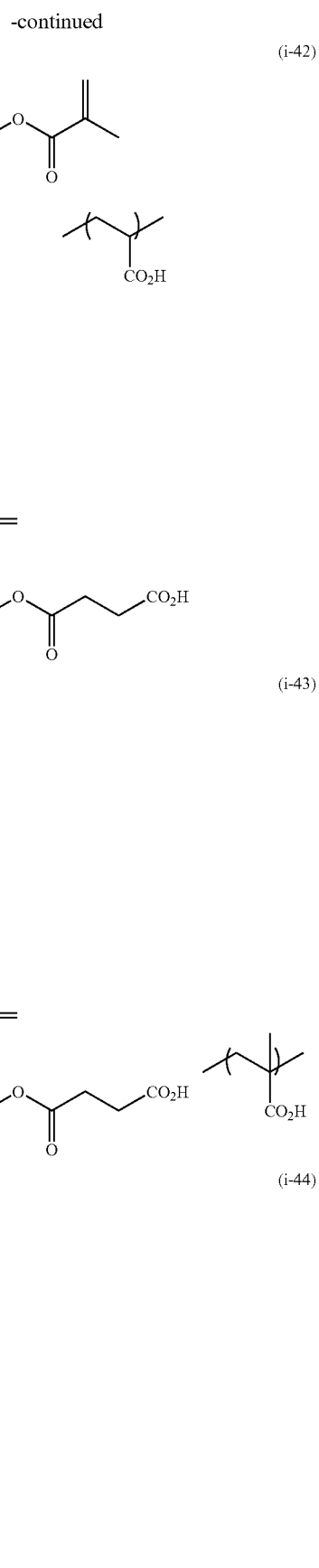

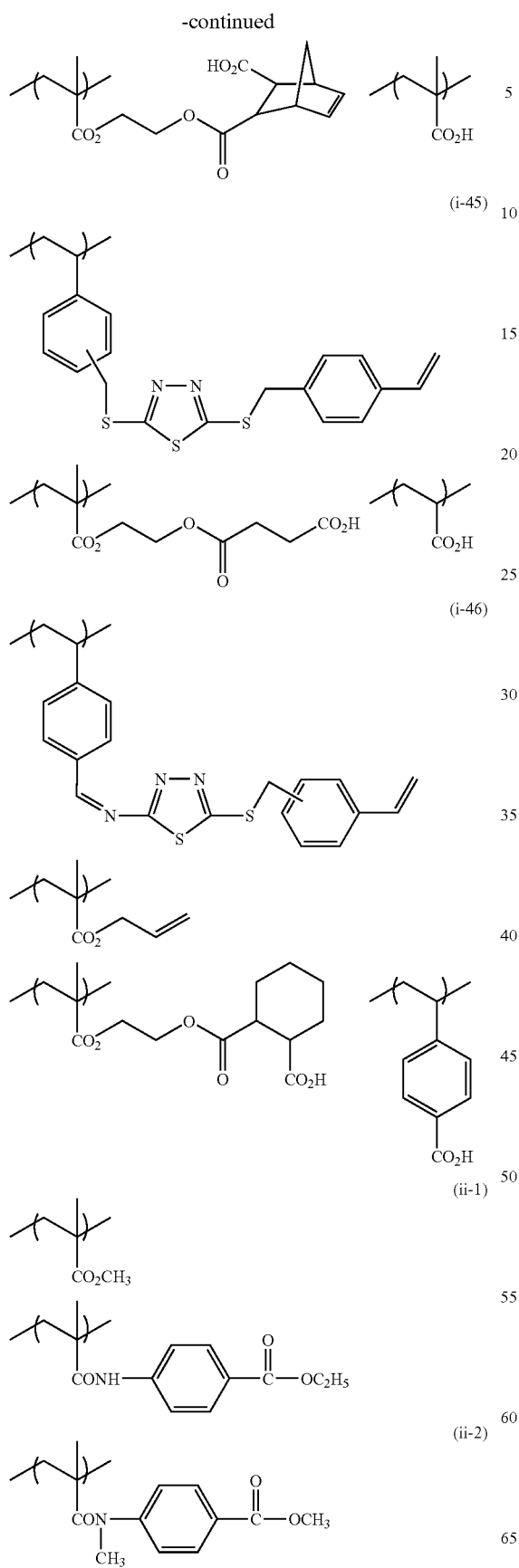
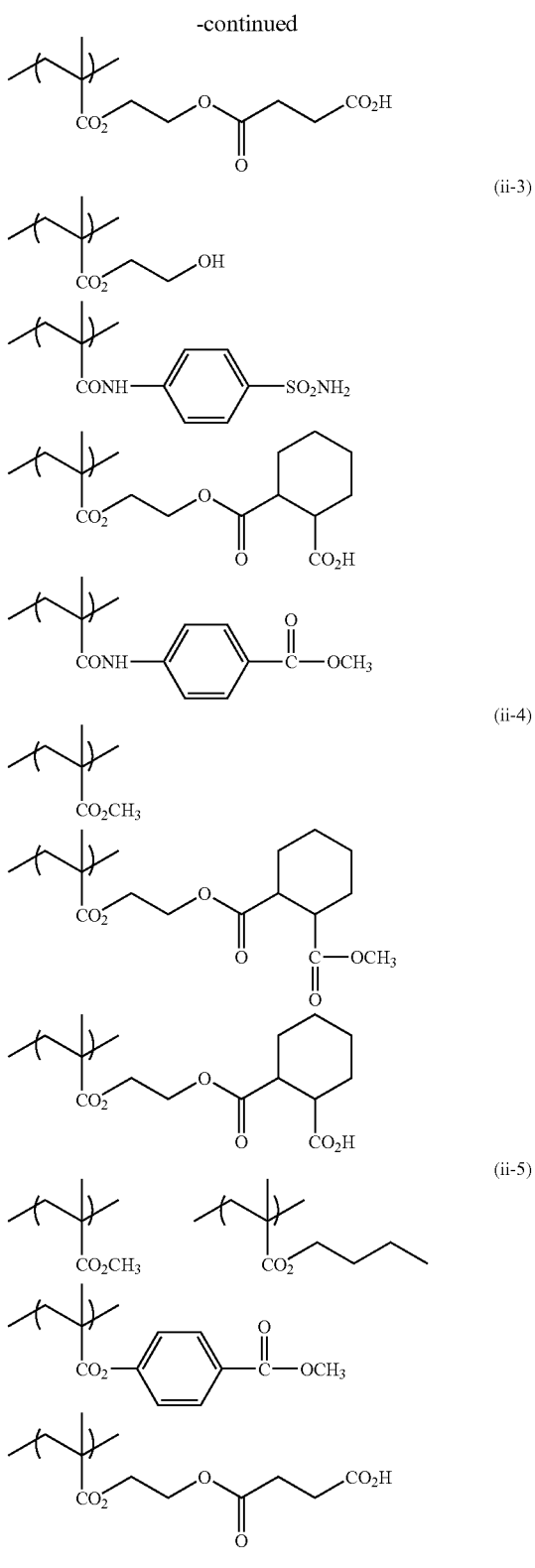
When these components are used as the photosensitive layer component of a lithographic printing plate precursor, the molecular weight of the binder polymer in the invention is arbitrarily determined from the viewpoints of an image forming property and press life. In general, when a molecular weight increases, press life is excellent but an image forming property is liable to lower. Contrary to this, a molecular weight decreases, an image forming property betters but press life lowers. The molecular weight of an organic polymer is preferably in the range of from 400 to 6,000,000 in a weight average molecular weight, and more preferably in the range of from 900 to 600,000.

(C) A Compound having an Addition Polymerizable Ethylenic Unsaturated Bond:

(C) A compound having an addition polymerizable ethylenic unsaturated bond (an addition polymerizable compound) in the invention is an addition polymerizable compound having at least one ethylenic unsaturated double bond, and such a compound is selected from compounds having at least one terminal ethylenic unsaturated bond, preferably having two or more. Such compound groups are well known in the industry and these compounds can be used with no particular limitation in the invention. Such an addition polymerizable compound takes the chemical form of, e.g., a monomer, a prepolymer, i.e., a dimer, a trimer, an oligomer, or a mixture and a copolymer of them. As the examples of monomers and the copolymers thereof, unsaturated carboxylic acids (e.g., acrylic acid, methacrylic acid, itaconic acid, crotonic acid, isocrotonic acid, maleic acid, etc.), and esters and amides of these unsaturated carboxylic acids are exemplified, and preferably the esters of unsaturated carboxylic acids and aliphatic polyhydric alcohol compounds, and amides of unsaturated carboxylic acids and aliphatic polyhydric amine compounds are used. Further, the addition reaction products of unsaturated carboxylic acid esters or amides having a nucleophilic substituent such as a hydroxyl group, an amino group or a mercapto group with monofunctional or polyfunctional isocyanates or epoxies, and the dehydration condensation reaction products with monofunctional or polyfunctional carboxylic acids are also preferably used. Further, the addition reaction products of unsaturated carboxylic esters or amides having an electro-philic substituent such as an isocyanate group or an epoxy group with monofunctional or polyfunctional alcohols, amines or thiols, and the substitution reaction products of unsaturated carboxylic esters or amides having a separable substituent such as a halogen group or a tosyloxy group with monofunctional or polyfunctional alcohols, amines or thiols are also preferably used. As another example, it is also possible to use a compound group in which the unsaturated carboxylic acids are replaced with unsaturated phosphonic acid, styrene, vinyl ether, etc.

The specific examples of the monomers of the esters of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylol-propane triacrylate, trimethylolpropane tri(acryloyloxy-propyl) ether, trimethylolethane triacrylate, hexanediol diacrylate, 1,4-cyclohexanediol diacrylate, tetraethylene glycol diacrylate, pentaerythritol diacrylate, penta-erythritol triacrylate, pentaerythritol tetraacrylate, dipentaerythritol diacrylate, dipentaeryduritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc.

As methacrylates, the examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetra-methacrylate, dipentaerythritol dimethacrylate, dipenta-erythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxy-ethoxy)phenyl]dimethylmethane, etc.

As itaconates, the examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, the examples include ethylene glycol dicrotonate, tetrarethylene glycol dicrotonate, pentaerythritol dicrotonate, sorbitol tetradicrotonate, etc.

As isocrotonates, the examples include ethylene glycol diisocrotonate, pentaerydiritol diisocrotonate, sorbitol tetraisocrotonate, etc.

As maleates, the examples include ethylene glycol dimaleate, triethylene glycol dimaleate, pentaerythritol dimaleate, sorbitol tetramaleate, etc.

As the examples of other esters, e.g., the aliphatic alcohol-based esters disclosed in JP-B-46-27926, JP-B-51-47334 and JP-A-57-196231, the esters having an aromatic skeleton disclosed in JP-A-59-5240, JP-A-59-5241 and JP-A-2-226149, and the esters containing an amino group disclosed in JP-A-1-165613 are also preferably used in the invention. Further, the above ester monomers can also be used as mixtures.

Further, the specific examples of the amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As other preferred amide monomers, those having a cyclohexylene structure disclosed in JP-B-54-21726 can be exemplified.

A urethane-based addition polymerizable compound manufactured by the addition reaction of isocyanate and a hydroxyl group is also preferred. As the specific example of urethane-based addition polymerizable compound, e.g., a vinyl urethane compound containing two or more polymerizable vinyl groups in a molecule obtained by the addition of a vinyl monomer having a hydroxyl group represented by the following formula (i) to a polyisocyanate compound having two or more isocyanate groups in a molecule as disclosed in JP-B-48-41708 is exemplified.

wherein $R^4$ and $R^5$ each represents H or $CH_3$.

Further, the urethane acrylates as disclosed in JP-A-51-37193, JP-B-2-32293 and JP-B-2-16765, and the urethane compounds having an ethylene oxide-based skeleton as disclosed in JP-B-58-49860, JP-B-56-17654, JP-B-62-39417 and JP-B-62-39418 are also preferably used.

In addition, by using addition polymerizable compounds having an amino structure and a sulfide structure in the molecule as disclosed in JP-A-63-277653, JP-A-63-260909 and JP-A-1-105238, extremely high speed photopolymerizable compositions can be obtained.

As other examples, the polyfunctional acrylates and methacrylates, such as polyester acrylates, and epoxy acrylates obtained by reacting epoxy resins with (meth)acrylic acids as disclosed in JP-A-48-64183, JP-B-4943191 and JP-B-52-30490 can be exemplified. The specific unsaturated compounds disclosed in JP-B-46-43946, JP-B-1-40337 and JP-B-

1-40336, and the vinyl sulfonic acid compounds disclosed in JP-A-2-25493 can also be exemplified. Further, according to cases, the structures containing a perfluoroalkyl group disclosed in JP-A-61-22048 are preferably used. Moreover, the photo-curable monomers and oligomers introduced into Bulletin of Nippon Setchaku Kyokai, Vol. 20, No. 7, pp. 300-308 (1984) can also be used.

The details in usage of these addition polymerizable compounds in the invention, e.g., what a structure is to be used, whether the compounds are to be used alone or in combination, or what an amount is to be used, can be optionally set up according to the final design of the performances of the polymerizable composition. For example, the conditions are selected from the viewpoints as follows when the polymerizable composition is used as the recording layer (photosensitive layer) of a negative lithographic printing plate precursor. As for the photosensitive speed, a structure containing many unsaturated groups per molecule is preferred and bifunctional or higher functional groups are preferred in many cases. For increasing the strength of an image area, i.e., a cured film, trifunctional or higher functional groups are preferred, and it is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but they are in some cases not preferred in the point of development speed and precipitation in a developing solution. Further, the selection and usage of the addition polymerizable compounds are important factors for the compatibility with other components (e.g., a binder polymer of (B) component, a photo- or thermal polymerization initiator of (D) component, a colorant, etc.) in the photosensitive layer and dispersibility, for example, sometimes compatibility can be improved by using a low purity compound or two or more compounds in combination.

Further, when the polymerizable composition of the invention is used as the recording layer (photosensitive layer) of a lithographic printing plate precursor, it is also possible to select a specific structure for the purpose of improving the adhesion property of a support and an overcoat layer described later. Concerning the blending ratio of the addition polymerizable compound in the photosensitive layer, the more is the better for sensitivity, but too much an amount results in unfavorable phase separation, manufacturing problems due to stickiness of the photosensitive layer (e.g., transfer of photosensitive layer components, manufacturing failure due to stickiness), and precipitation from a developing solution. From these points of view, addition polymerizable compounds are used preferably in an amount of from 5 to 80 mass % to the non-volatile components in the photosensitive layer, and more preferably from 25 to 75 mass %. The addition polymerizable compounds may be used alone, or two or more compounds may be used in combination. In addition, the appropriate structures, blending ratios and addition amounts of the addition polymerizable compounds to be used can be arbitrarily selected from the light of the degree of polymerization hindrance by oxygen, resolution, a fogging property, refractive index change and surface stickiness. Further, according to cases, layer constitution and coating method of an undercoat layer and an overcoat layer may be taken.

(D) Photo- or Thermal Polymerization Initiator:

As the photopolymerization initiators in the invention, various well-known photopolymerization initiators and the systems of combined use of two or more photopolymerization initiators can be arbitrarily selected and used according to the wavelengths of the light sources to be used.

When a blue color semiconductor laser, an Ar laser, second harmonic of an infrared semiconductor laser, and an SHG-YAG laser are used as light sources, various kinds of photopolymerization initiators are supposed, for example, a certain kind of photoreduction dyes disclosed in U.S. Pat. No. 2,850, 445, e.g., Rose Bengale, Eosine, erythrosine (Erythrocin), systems of the combination of dyes and initiators, e.g., composite initiator systems of dyes and amines (JP-B-44-20189), combination systems of hexaarylbiimidazole, radical generators and dyes (JP-B-45-37377), systems of hexaarylbiimidazole and p-dialxylaminobenzylidene ketone (JP-B-47-2528, JP-A-54-155292), systems of cyclic cis-α-dicarbonyl compounds and dyes (JP-A-48-84183), systems of cyclic triazine and merocyanine dyestuffs (JP-A-54-151024), systems of 3-ketocoumarin and activators (JP-A-52-112681, JP-A-58-15503), systems of biimidazole, styrene derivatives and thiols (JP-A-59-140203), systems of organic peroxides and dyestuffs (JP-A-59-1504, JP-A-59-140203, JP-A-59-189340, JP-A-62-174203, JP-B-62-1641, U.S. Pat. No. 4,766,055), systems of dyes and active halogen compounds (JP-A-63-1718105, JP-A-63-258903, JP-A-3-264771), systems of dyes and borate compounds (JP-A-62-143044, JP-A-62-150242, JP-A-64-13140, JP-A-64-13141, JP-A-64-13142, JP-A-64-13143, JP-A-64-13144, JP-A-17048, JP-A-1-229003, JP-A-1-298348, JP-A-1-138204), systems of dyestuffs having a rhodanine ring and radical generators (JP-A-2-179643, JP-A-2-244050), systems of titanocene and 3-ketocoumarin dyestuffs (JP-A-63-221110), systems of combining addition polymerizable ethylenic unsaturated compounds having an amino group or a urethane group with titanocene and xanthene dyestuffs (JP-A-4-221958, JP-A-4-219756), systems of titanocene and specific merocyanine dyestuffs (JP-A-6-295061), and systems of titanocene and dyestuffs having a benzopyran ring (JP-A-8-334897) can be exemplified.

Especially preferred photopolymerization initiators (systems) in the invention contain at least one kind of titanocene. Titanocene compounds for use in the invention as photopolymerization initiators (systems) are not restricted so long as they are titanocene compounds capable of generating active radicals when they are coexistent with other sensitizing dyestuffs and exposed with light, and well-known compounds as disclosed, for example, in JP-A-59-152396, JP-A-61-151197, JP-A-6341483, JP-A-63-41484, JP-A-2-249, JP-A-2-291, JP-A-3-27393, JP-A-3-12403, and JP-A-6-41170 can be arbitrarily selected and used.

More specifically, dicyclopentadienyl-Ti-dichloride, dicyclopentadienyl-Ti-bisphenyl, dicyclopentadienyl-Ti-bis-2,3, 4,5,6-pentafluorophen-1-yl (hereinafter also referred to as "T-1"), dicyclopentadienyl-Ti-bis-2,3,5,6-tetrafluoro-phen-1-yl, dicyclopentadienyl-Ti-bis-2,4,6-trifluorophen-1-yl, dicyclopentadienyl-Ti-bis-2,6Mifluorophen-1-yl, dicyclopentadienyl-Ti-bis-2,4-Mifluorophen-1-yl, dimethyl-cyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, and bis(cyclopentadienyl)bis[2,6-difluoro-3-(pyr-1-yl)-phenyl] titanium (hereinafter also referred to as "T-2") can be exemplified.

It is also possible for these titanocene compounds to be subjected to various chemical modifications to further improve the characteristics of a photosensitive layer. For example, methods of combination with radical generating parts such as a sensitizing dyestuff, an addition polymerizable unsaturated compound and the like, introduction of a hydrophilic site, introduction of a substituent for the purpose of the improvement of compatibility and the inhibition of crystal precipitation, introduction of a substituent for the improvement of adhesion, and polymerization can be utilized.

The use method of titanocene compounds can also be arbitrarily set up in accordance with the design of performances of a polymerizable composition and the later-described lithographic printing plate precursor to which the polymerizable composition is applied, similarly to the above-described addition polymerizable compounds. When a titanocene compound is used in the photosensitive layer of a lithographic printing plate precursor, for example, by using two or more kinds of titanocene compounds in combination, the compatibility with the photosensitive layer can be heightened. In general, the more the use amount of a photopolymerization initiator such as a titanocene compound, the more advantageous is it in the point of photosensitivity, and by the use of the amount of a titanocene compound in a polymerizable composition of from 0.5 to 80 mass parts per 100 mass parts of the non-volatile components, and preferably from 1 to 50 mass parts, sufficient photosensitivity can be obtained, also in the case of using in the photosensitive layer of a lithographic printing plate precursor. On the other hand, when used under a yellow lamp or a white lamp, the use amount of titanocene is preferably little in view of the fogging due to light in the vicinity of 500 nm. By the combination with other sensitizing dyestuffs, sufficient photosensitivity can be obtained even when the use amount of titanocene is reduced to 6 mass parts or less, further to 1.9 mass parts or less, and still further to 1.4 mass parts or less.

As thermal polymerization initiators for use in the invention for initiating and accelerating the curing reaction of the addition polymerizable compound, thermal decomposition type radical generators that are decomposed by heat and generate radicals are advantageous. By the combination of such radical generators with the later-described infrared absorbers, the infrared absorbers generate heat at the time of infrared laser exposure, and radicals are generated by heat, so that recording becomes possible by the combination.

As the radical generators, onium salts, triazine compounds having a trihalomethyl group, peroxides, azo-based polymerization initiators, azide compounds, quinonediazide, oxime ester compounds, triaryl monoalkyl borate compounds, etc., are exemplified, and onium salts and oxime ester compounds are high sensitivity and preferred. Onium salts preferably used in the invention as polymerization initiators are explained below. As preferred onium salts, iodonium salts, diazonium salts, and sulfonium salts are exemplified. These onium salts function as radical polymerization initiators not acid generators in the invention. Onium salts preferably used in the invention are onium salts represented by the following formulae (F) to (H).

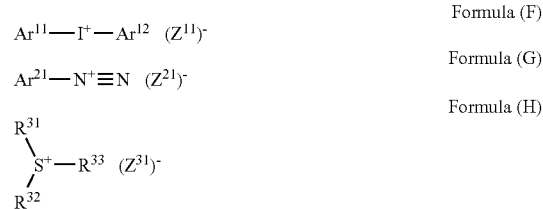

In formula (F), $Ar^{11}$ and $Ar^{12}$ each represents an aryl group having 20 or less carbon atoms that may have a substituent. When the aryl group has a substituent, a halogen atom, a nitro group, an alkyl group having 12 or less carbon atoms, an alkoxyl group having 12 or less carbon atoms, and an aryloxy group having 12 or less carbon atoms are exemplified as preferred examples of the substituents. $Z^{11-}$ represents a counter ion selected from the group consisting of a halogen ion, a perchlorate ion, a tetrafluoroborate ion, a hexafluorophosphate ion, a carboxylate ion, and a sulfonate ion, preferably a perchlorate ion, a hexafluorophosphate ion, a carboxylate ion, and an arylsulfonate ion.

In formula (G), $Ar^{21}$ represents an aryl group having 20 or less carbon atoms that may have a substituent. As the examples of the preferred substituents, a halogen atom, a nitro group, an alkyl group having 12 or less carbon atoms, an alkoxyl group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms are exemplified. $Z^{21-}$ represents a counter ion having the same meaning as $Z^{11-}$.

In formula (H), $R^{31}$, $R^{32}$ and $R^{33}$, which may be the same or different, each represents a hydrocarbon group having 20 or less carbon atoms that may have a substituent. As the examples of the preferred substituents, a halogen atom, a nitro group, an alkyl group having 12 or less carbon atoms, an alkoxyl group having 12 or less carbon atoms, and an aryloxy group having 12 or less carbon atoms are exemplified. $Z^{31-}$ represents a counter ion having the same meaning as $Z^{11-}$.

As the specific examples of the onium salts that can be preferably used as polymerization initiators (radical generators) in the invention, those disclosed in JP-A-2001-133696 are exemplified. The specific examples of the onium salts represented by formula (F) ([OI-1] to [OI-10]), the onium salts represented by formula (G) ([ON-1] to [ON-5]), and the onium salts represented by formula (H) ([OS-1] to [OS-7]) that can be preferably used in the invention are shown below, but the invention is not restricted to these examples.

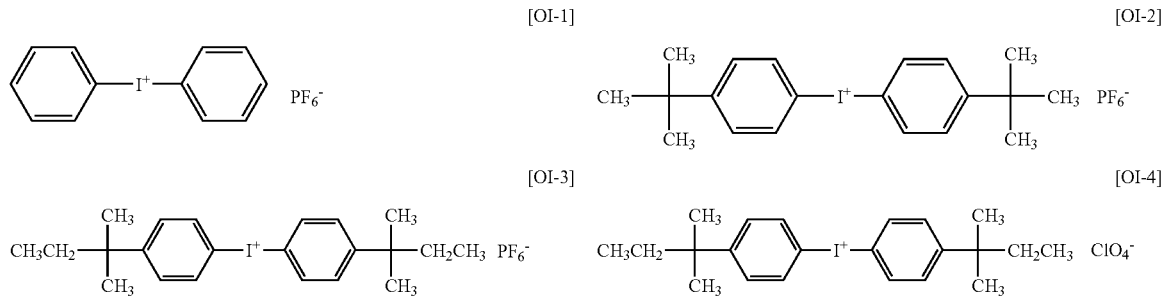

-continued
[OI-5]
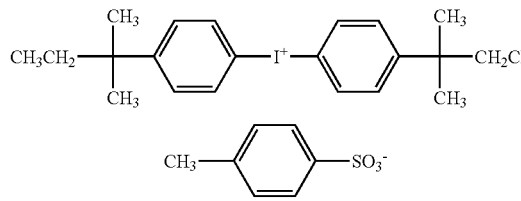
[OI-6]
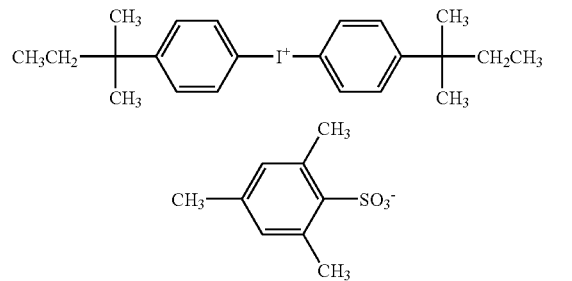
[OI-7]
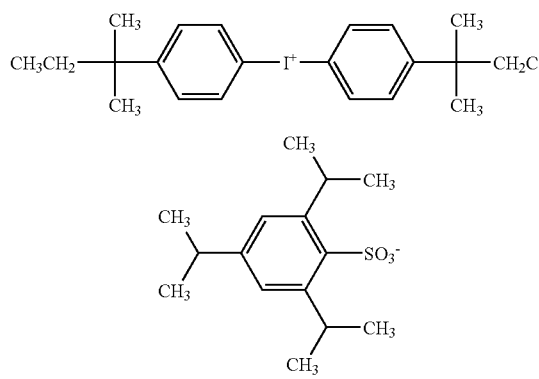
[OI-8]
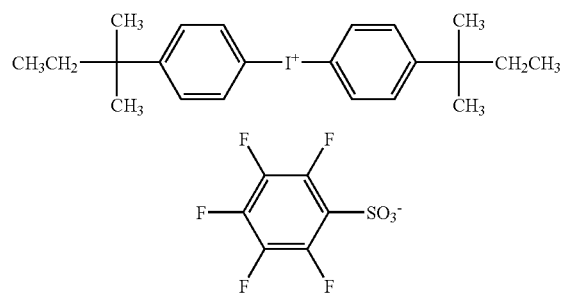
[OI-9]
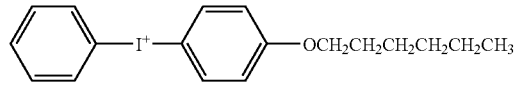
[OI-10]
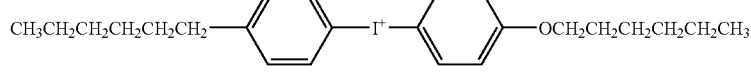
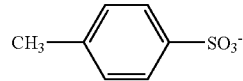
[ON-1]
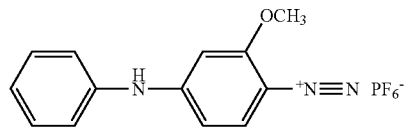
[ON-2]
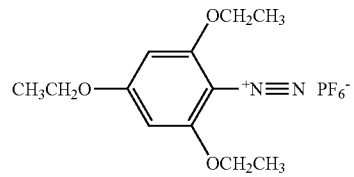
[ON-3]
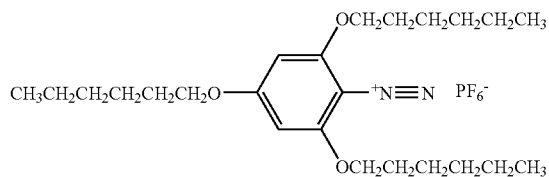
[ON-4]
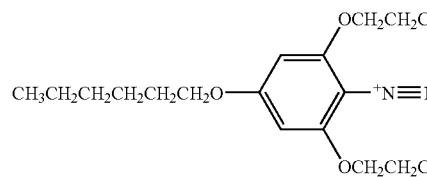
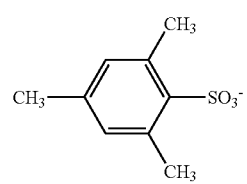

-continued
[ON-5]
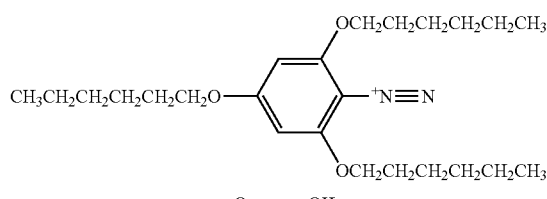
[OS-1]
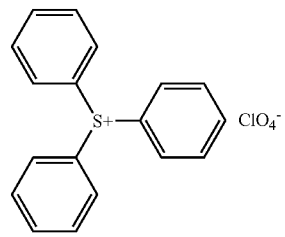
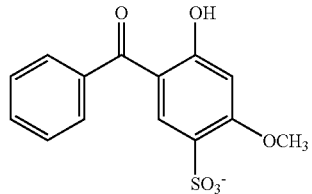
[OS-2]
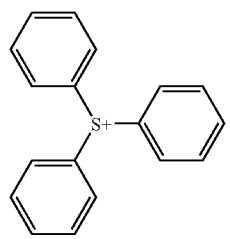 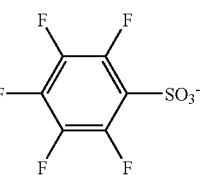
[OS-3]
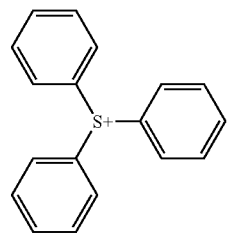 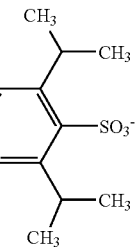
[OS-4]
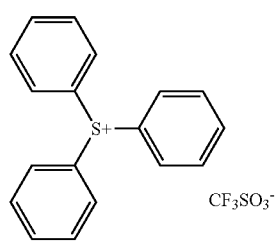
[OS-5]
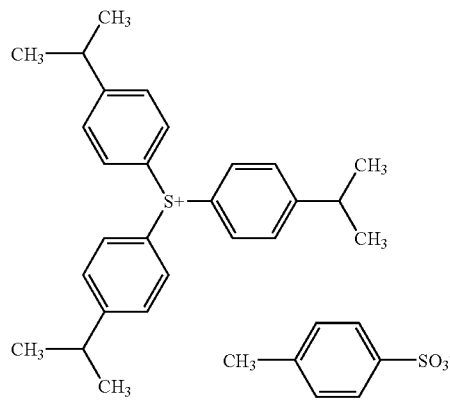
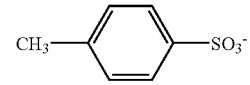
[OS-6]
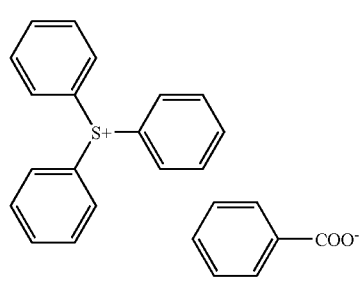
[OS-7]
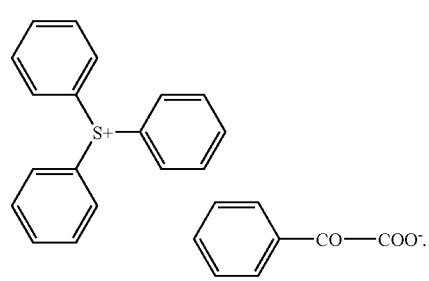
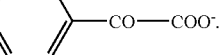

It is preferred for polymerization initiators for use in the invention to have maximum absorption wavelengths of 400 nm or less, more preferably 360 nm or less. By bringing the absorption wavelengths into ultraviolet region, a lithographic printing plate precursor can be handled under a white lamp.

As other preferred polymerization initiators, specific aromatic sulfonium salts disclosed in Japanese Patent Application Nos. 2000-266797, 2001-177150, 2000-160323, and 2000-184603 are exemplified. The representative compounds are shown below.

Further, the representative compounds of other preferred polymerization initiators applicable to the invention are shown below.

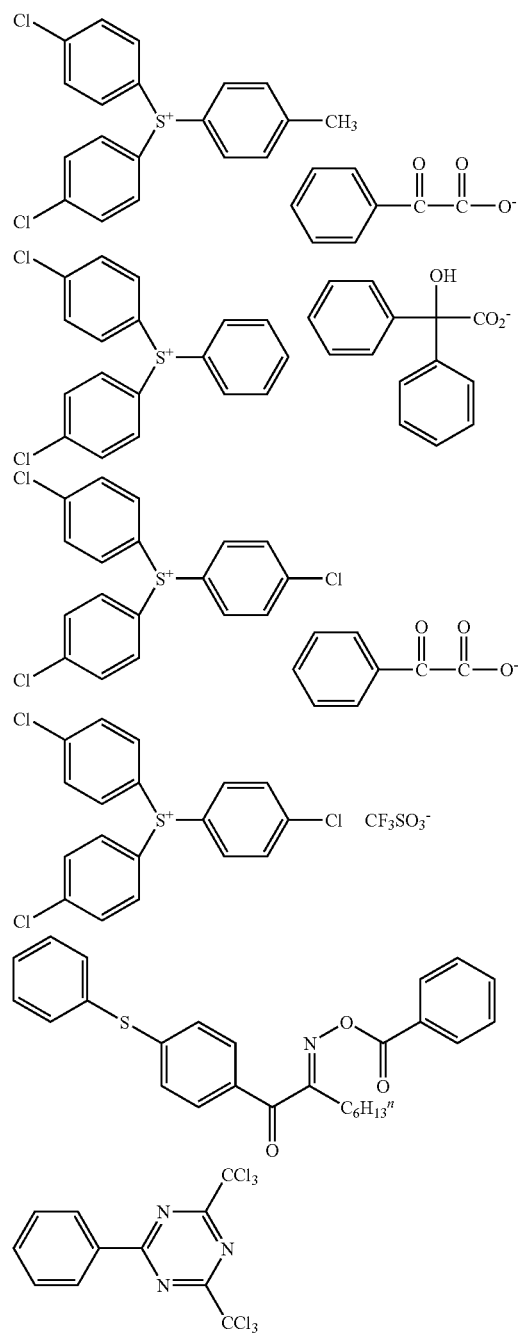

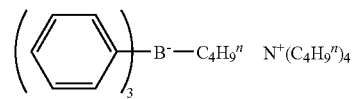

Oxime ester compounds that can be preferably used in the invention as polymerization initiators are explained. As a preferred oxime ester compound, the following formula (I) can be exemplified.

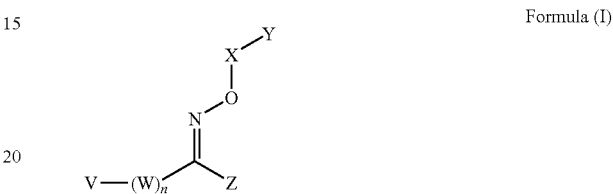

Formula (I)

In formula (I), X represents a carbonyl group, a sulfon group, or a sulfoxide group; and Y represents a cyclic alkyl group having from 1 to 12 carbon atoms, an alkenyl group, an alkynyl group, an aryl group having from 6 to 18 carbon atoms, or a heterocyclic group. The aryl group is an aromatic hydrocarbon group, e.g., a benzene ring, a naphthalene ring, a phenanthrene group, a pyrene group, or a triphenylene group. The heterocyclic group is an aromatic compound having at least one nitrogen atom, sulfur atom or oxygen atom in the ring structure, and compounds, e.g., a pyrrole group, a furan group, a thiophene group, a selenophene group, a pyrazole group, an imidazole group, a triazole group, a tetrazole group, an oxazole group, a thiazole group, an indole group, a benzofuran group, a benzimidazole group, a benzoxazole group, a benzothiazole group, a pyridine group, a pyrimidine group, a pyrazine group, a triazine group, a quinoline group, a carbazole group, an acridine group, phenoxazine, and phenothiazine are exemplified. These substituents represented by Y can be substituted with a halogen atom, a hydroxyl group, a nitrile group, a nitro group, a carboxyl group, an aldehyde group, an alkyl group, a thiol group, or an aryl group, or a compound containing an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, a urethane group, an alkyl group, a thiol group, an aryl group, a phosphoroso group, a phospho group, or a carbonyl ether group.

Z in formula (I) has the same meaning as Y, or represents a nitrile group, a halogen atom, a hydrogen atom, or an amino group, and the compound of Z can be substituted with a halogen atom, a hydroxyl group, a nitrile group, a nitro group, a carboxyl group, an aldehyde group, an alkyl group, a thiol group, or an aryl group, or a compound containing an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, a urethane group, an alkyl group, a thiol group, an aryl group, a phosphoroso group, a phospho group, or a carbonyl ether group.

W in formula (I) represents a divalent organic group, e.g., a methylene group, a carbonyl group, a sulfoxide group, a sulfone group, or an imino group, and the methylene group and the imino group can be substituted with a compound containing an alkyl group, an aryl group, an ester group, a nitrile group, a carbonyl ether group, a sulfo group, a sulfo ether group, or an ether group. n represents an integer of 0 or 1.

V in formula (I) represents a cyclic or chain alkyl group having from 1 to 12 carbon atoms, an alkenyl group, an alkynyl group, an aryl group having from 6 to 18 carbon atoms, an alkoxyl group, or an aryloxy group, and as the aryl group, an aromatic hydrocarbon group, e.g., a benzene ring, a naphthalene ring, anthracene ring, a phenanthrene group, a pyrene group, and a triphenylene group, and a hetero atom-containing aromatic compound, e.g., a pyrrole group, a furan group, a thiophene group, a selenophene group, a pyrazole group, an imidazole group, a triazole group, a tetrazole group, an oxazole group, a thiazole group; an indole group, a benzofuran group, a benzimidazole group, a benzoxazole group, a benzothiazole group, a pyridine group, a pyrimidine group, a pyrazine group, a triazine group, a quinoline group, a carbazole group, an acridine group, a phenoxazine group, and a phenothiazine group are exemplified. These groups represented by V can be substituted with a halogen atom, a hydroxyl group, a nitrile group, a nitro group, a carboxyl group, an aldehyde group, an alkyl group, a thiol group, or an aryl group, or a compound containing an alkenyl group, an alkynyl group, an ether group, an ester group, a urea group, an amino group, an amido group, a sulfide group, a disulfide group, a sulfoxide group, a sulfo group, a sulfone group, a hydrazine group, a carbonyl group, an imino group, a halogen atom, a hydroxyl group, a nitrile group, a nitro group, a carboxyl group, a carbonyl group, a urethane group, an alkyl group, a thiol group, an aryl group, a phosphoroso group, a phospho group, or a carbonyl ether group.

V and Z may be bonded to each other to form a ring.

As the oxime ester compound represented by formula (I), in view of sensitivity, it is preferred that X represents a carbonyl group, Y represents an aryl group or a benzoyl group, Z represents an alkyl group or an aryl group, W represents a carbonyl group, and V represents an aryl group. It is more preferred that the aryl group represented by V has a thio ether substituent.

The structure of N—O bond in formula (I) may be E body or Z body.

Oxime ester compounds that can be preferably used in the invention are described in Progress in Organic Coatings, 13, 123-150 (1985), J. C. S. Perkin II, 1653-1660 (1979), Journal of Photopolymer Science and Technology, 205-232 (1995), J. C. S. Perkin II, 156-162 (1979), JP-A-2000-66385 JP-A-2000-80068.

The specific examples of oxime ester compounds that can be preferably used in the invention are shown below, but the invention is not limited to these compounds.

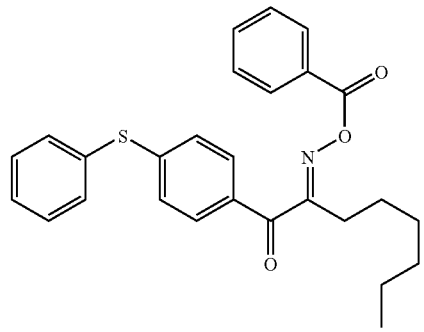

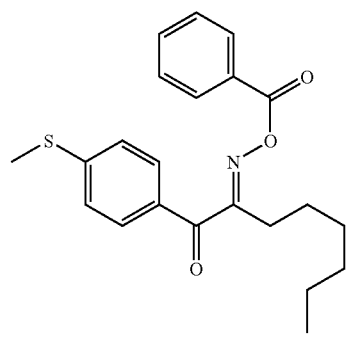

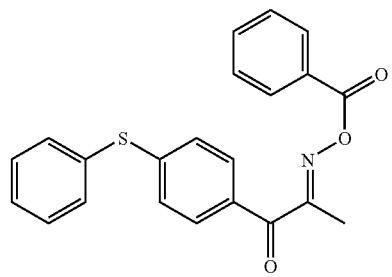

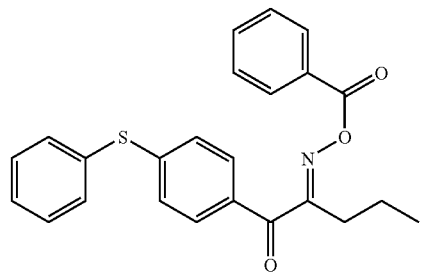

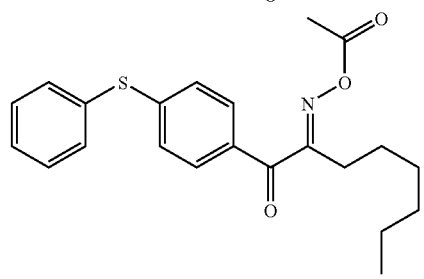

-continued
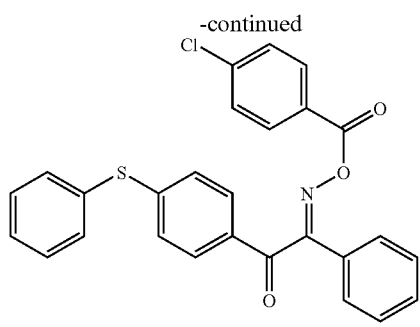
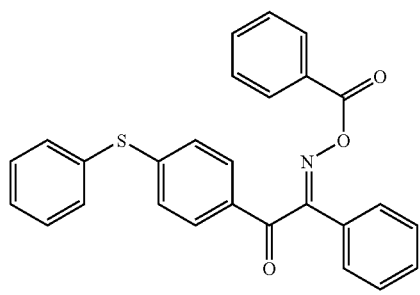
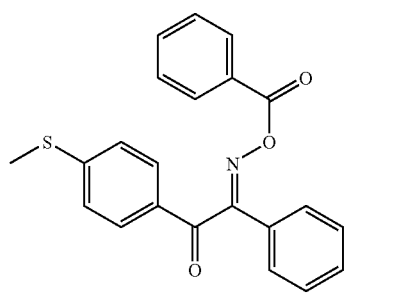
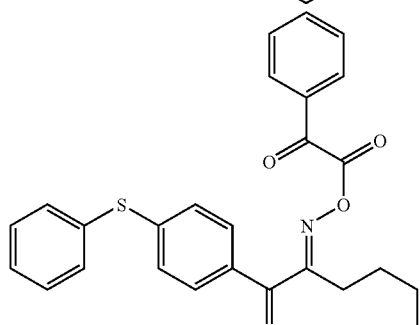
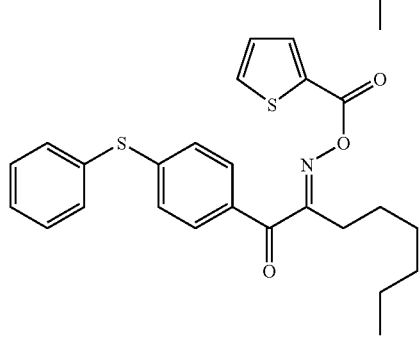
-continued
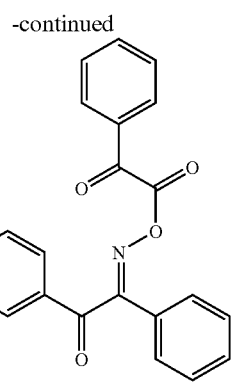
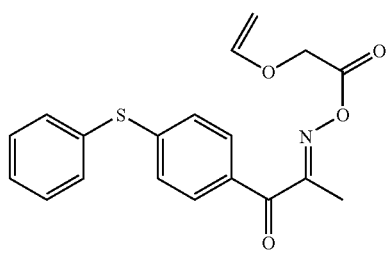
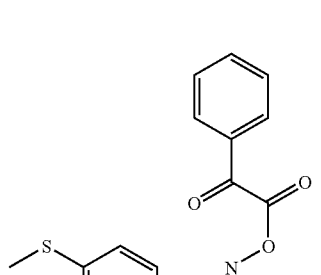
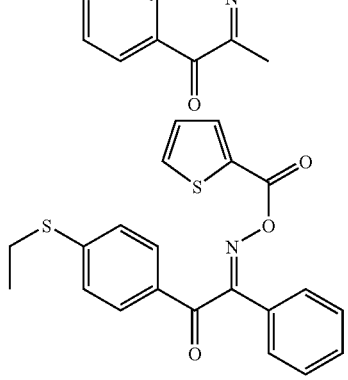
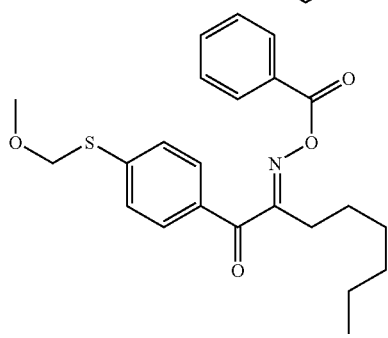

-continued
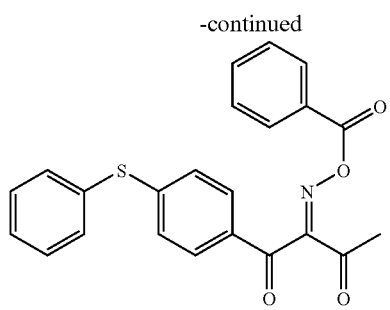
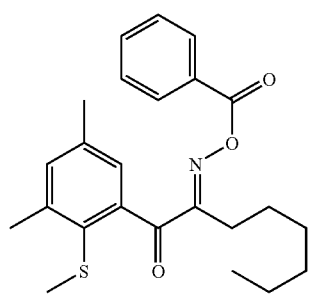
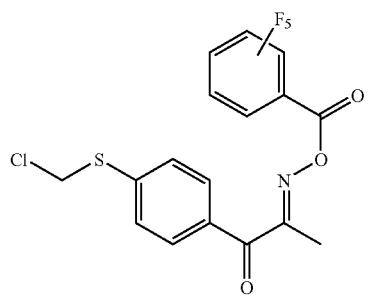
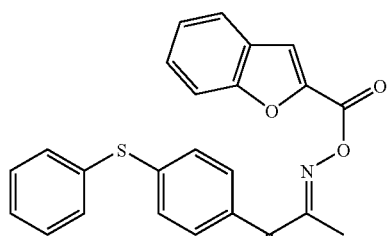
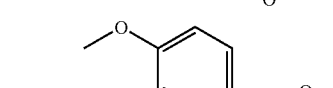
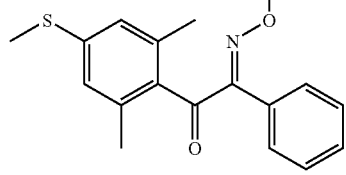
-continued
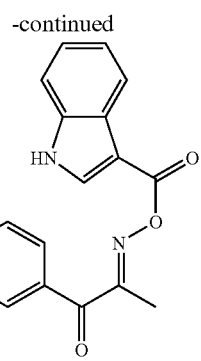
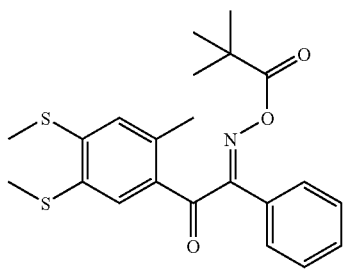
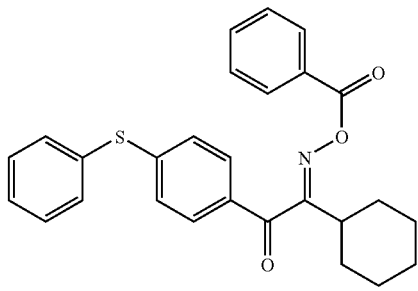
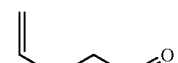
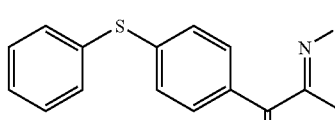
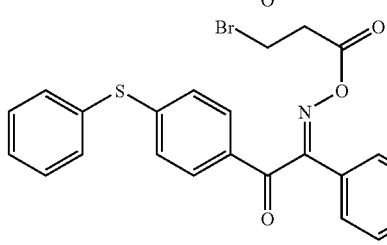
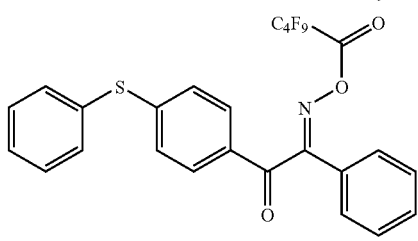

-continued
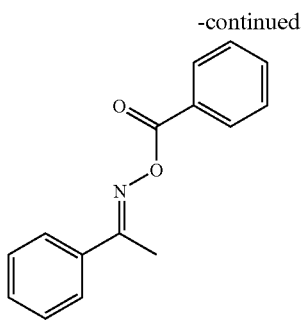
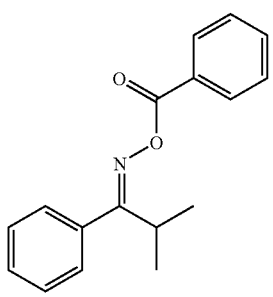
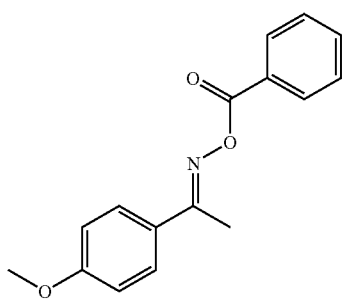
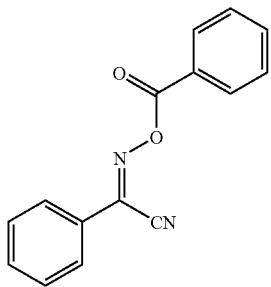
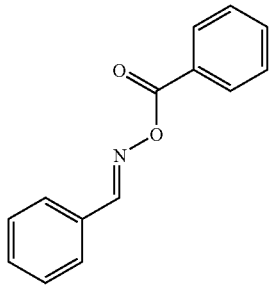
-continued
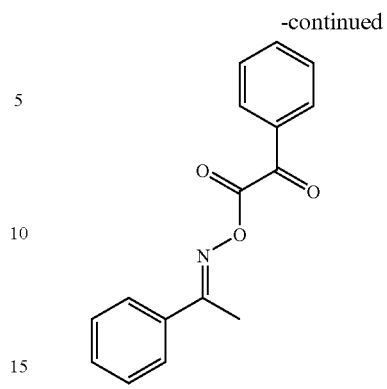
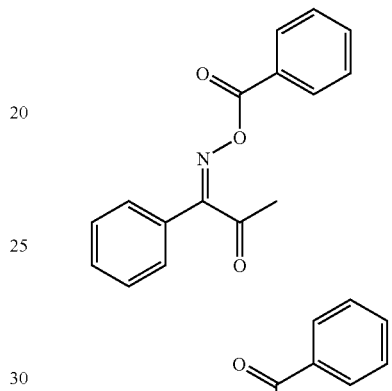
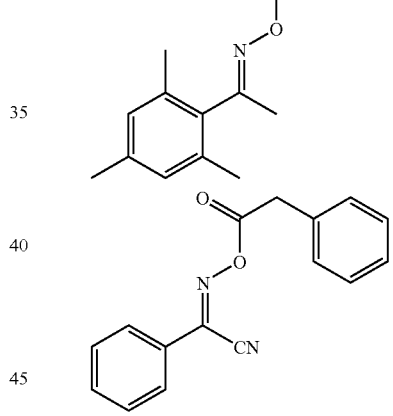
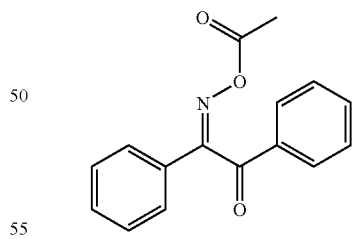
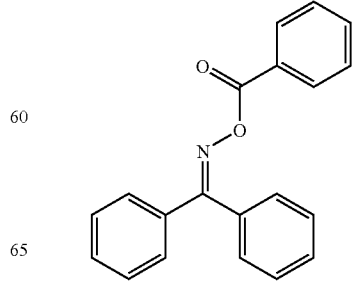

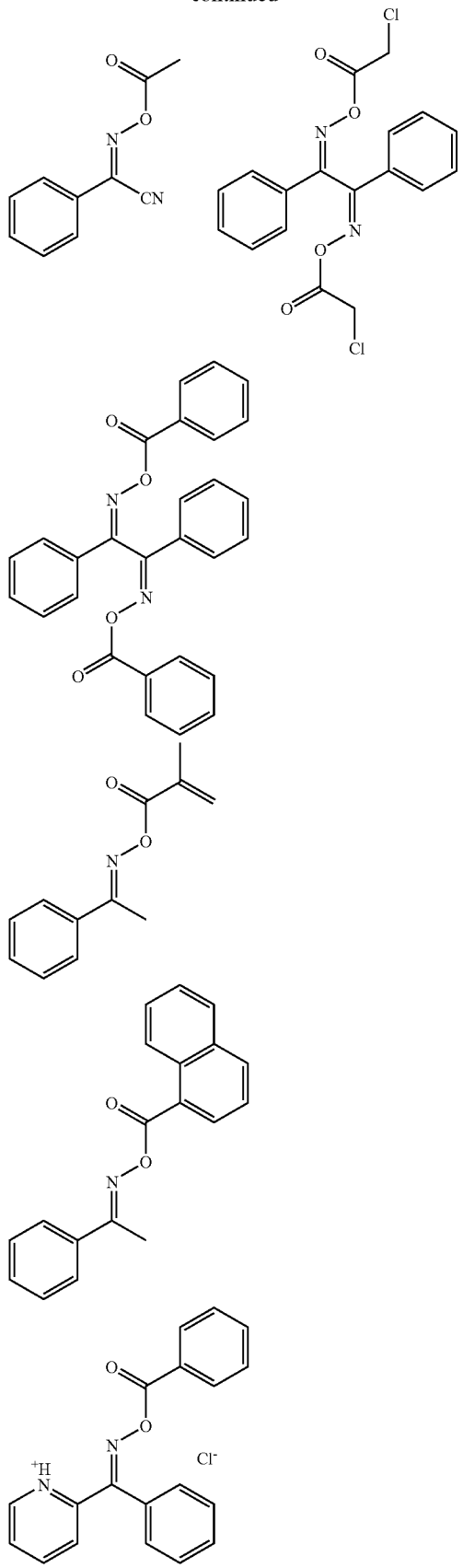
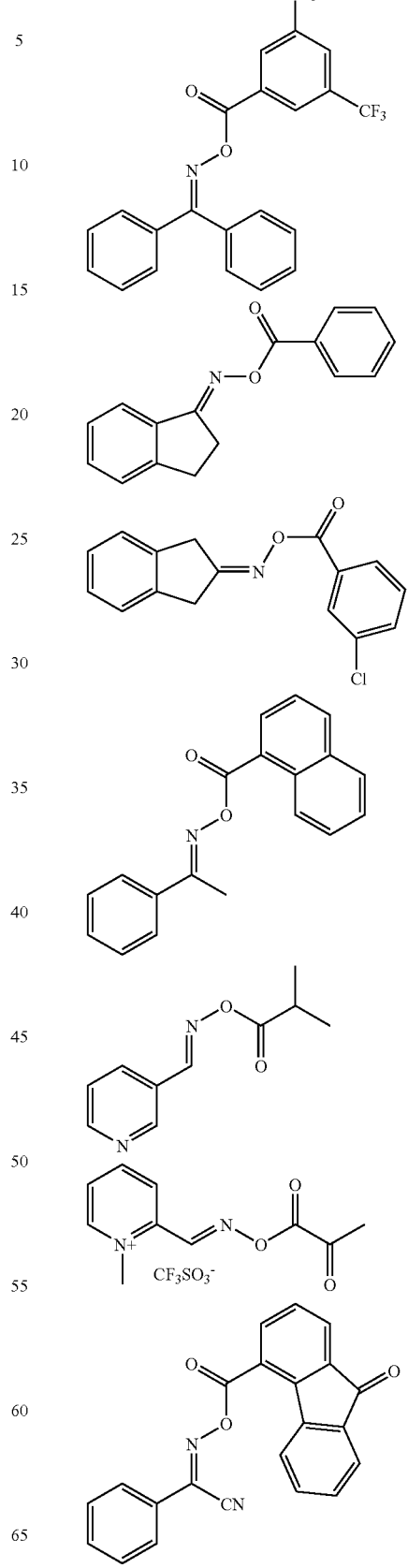

-continued
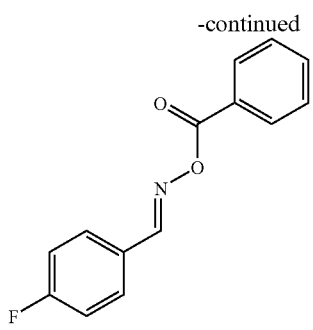
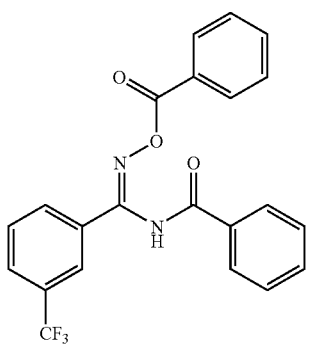
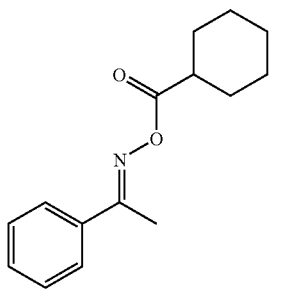
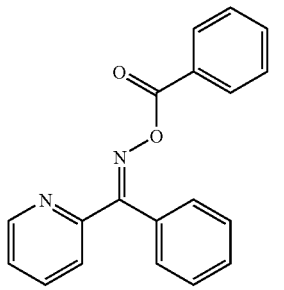
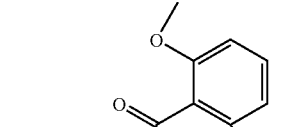
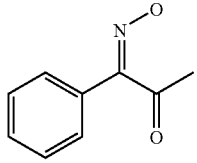
-continued
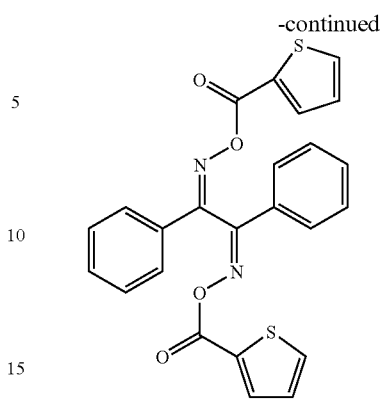
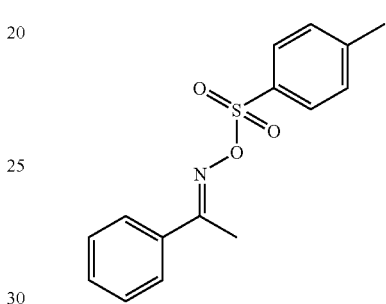
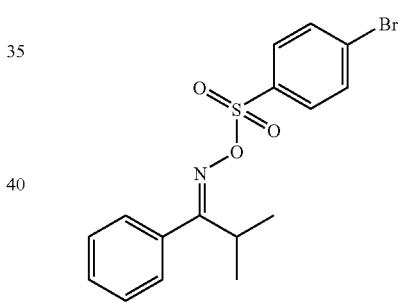
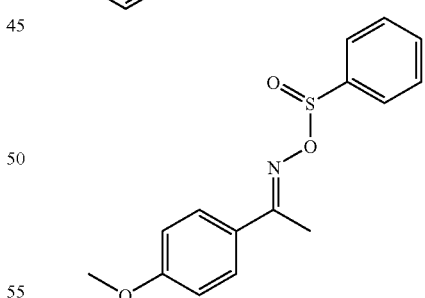
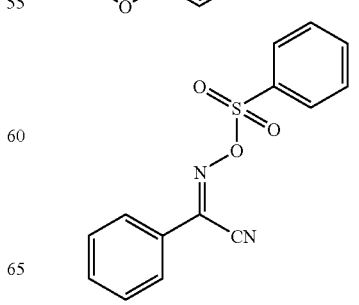

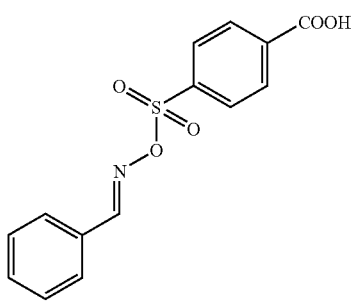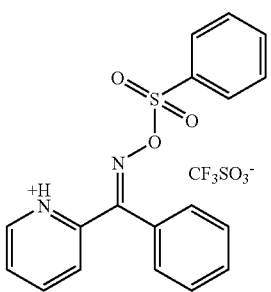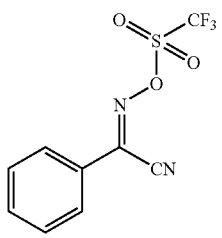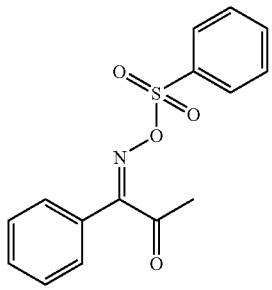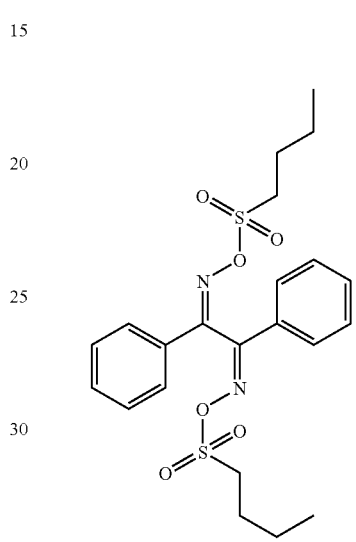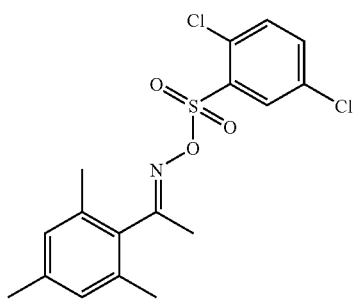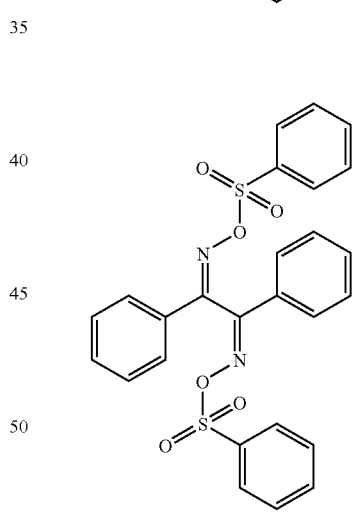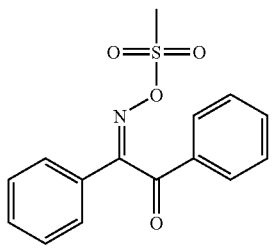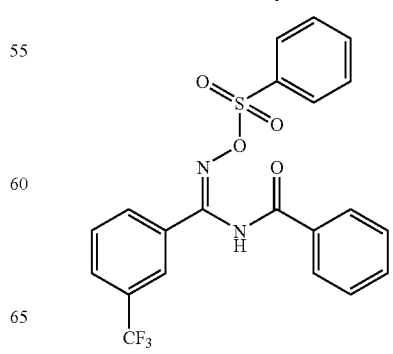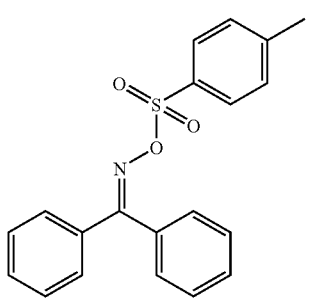

-continued
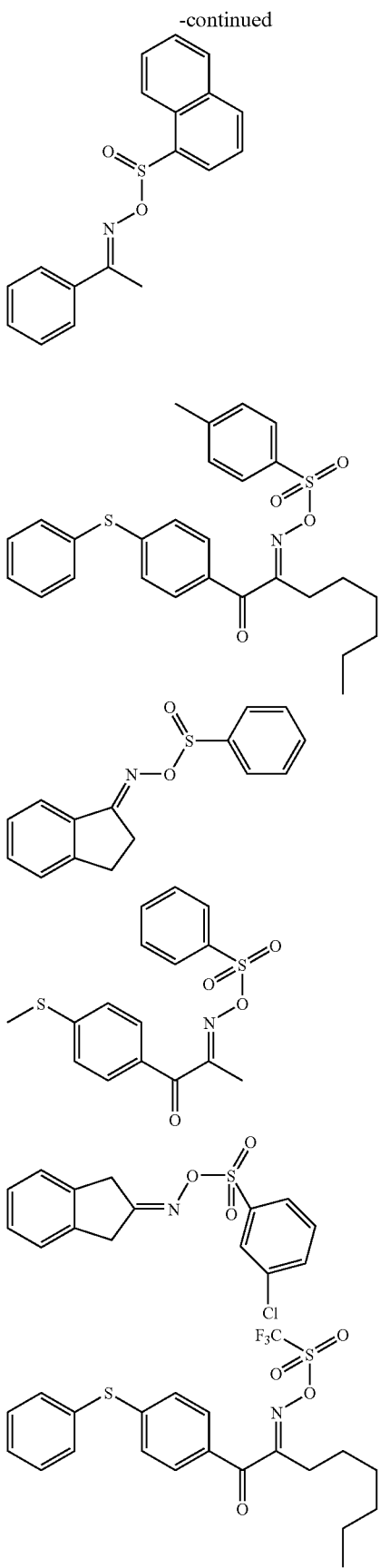
-continued
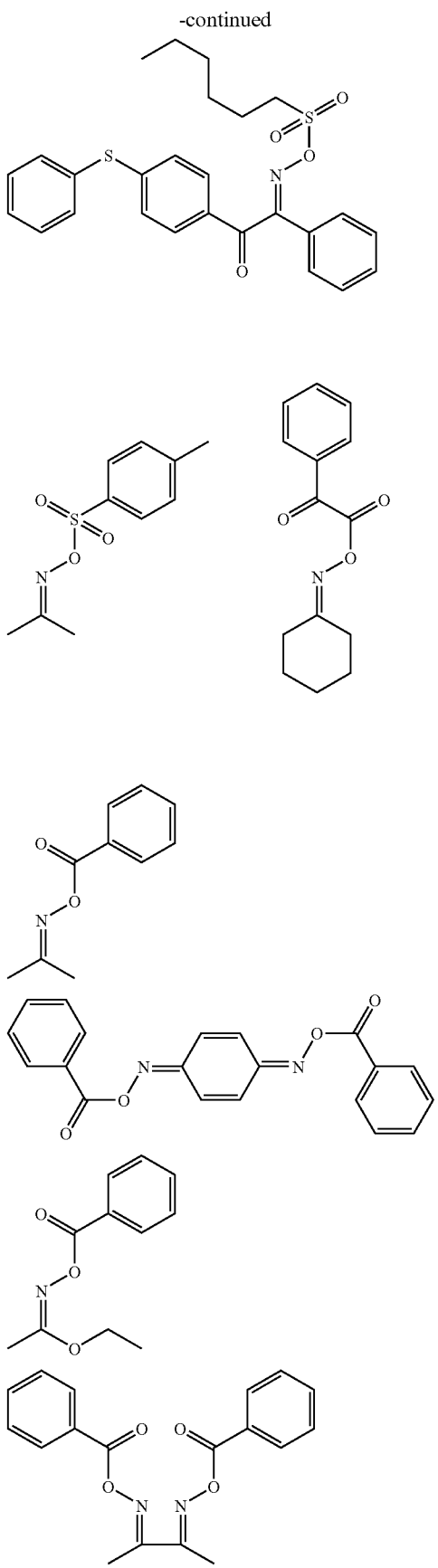

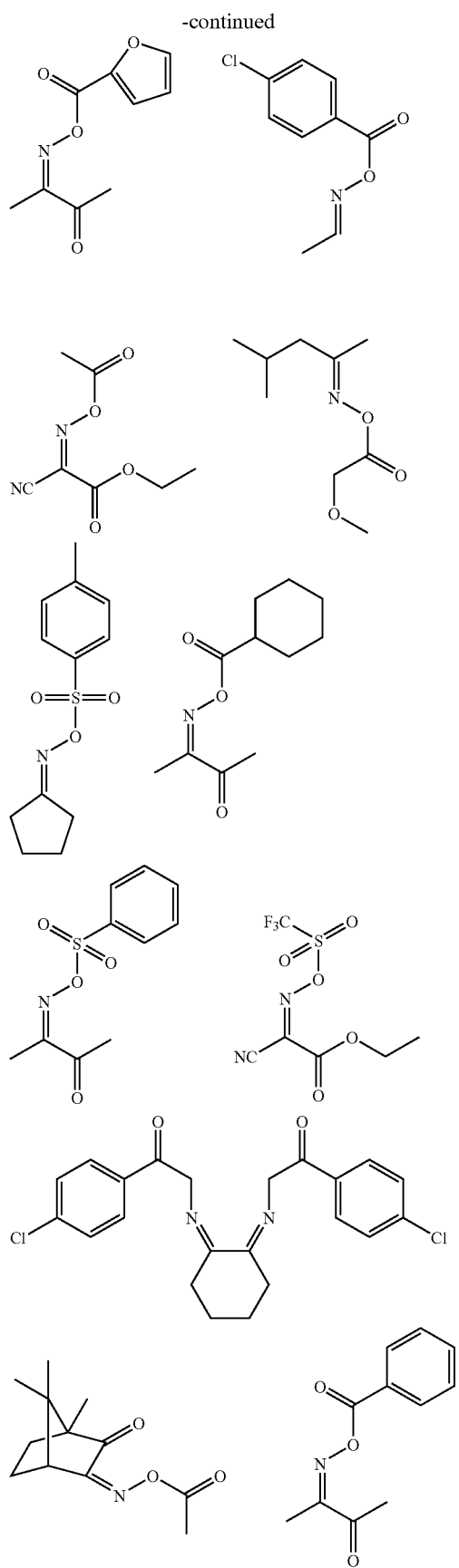
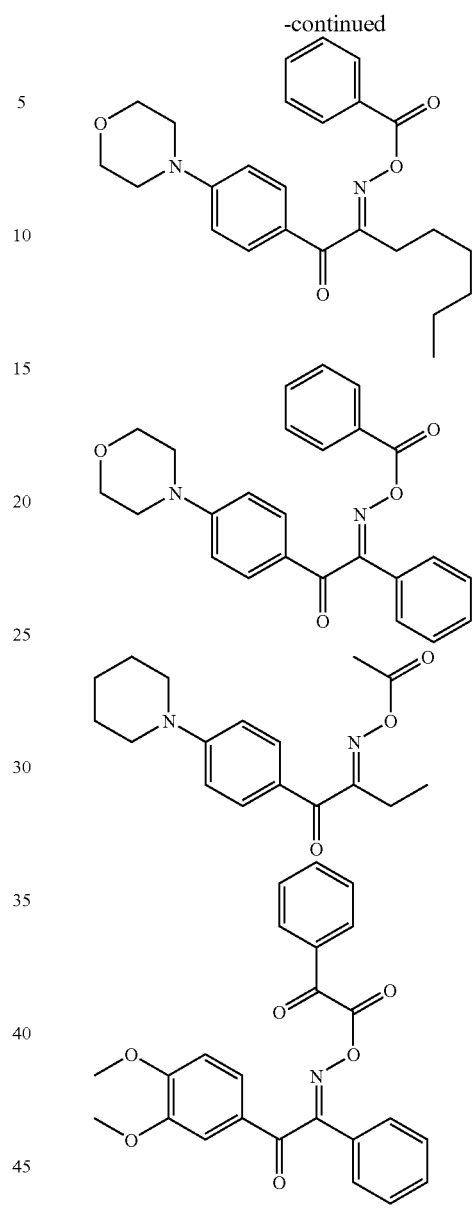

From the viewpoint of the polymerization initiation efficiency at the time of exposure, it is more preferred in the invention to use titanocene compounds, sulfonium compounds, or hexaarylbiimidazole compounds of the above polymerization initiators, the use of hexaarylbiimidazole compounds is more preferred.

In the light of sensitivity and soiling resistance of a non-image area occurring at the time of printing in a case where a polymerizable composition of the invention is used as the photosensitive layer of a negative lithographic printing plate precursor, these polymerization initiators can be used in proportion of from 0.1 to 50 mass % to all the solids content constituting a polymerizable composition or a photosensitive layer, preferably from 0.5 to 30 mass %, and particularly preferably from 1 to 20 mass %. Polymerization initiators may be used one kind alone, or two or more kinds may be used in combination. Polymerization initiators may be added to the same layer with other components, or a separate layer may be provided for the addition of polymerization initiators.

(E) Sensitizing Dyestuff:

Sensitizing dyestuffs can be used in a polymerizable composition of the invention. As the sensitizing dyestuffs, those having an absorption peak at wavelengths in the range of from 300 to 850 nm are preferred, and more preferably those having an absorption peak in the range of from 300 to 600 nm. As such sensitizing dyestuffs, spectral sensitizing dyestuffs, and dyes or pigments that absorb the light of light sources and interact with a photopolymerization initiator as shown below are exemplified.

As preferred spectral sensitizing dyestuffs or dyes, polynuclear aromatic compounds (e.g., pyrene, perylene, triphenylene), xanthenes (e.g., fluorescein, eosine, erythrolan, rhodamine B, Rose Bengale), cyanines (e.g., thiacarbocyanine, oxacarbocyanine), merocyanines (e.g., merocyanine, carbomerocyanine), thiazines (e.g., thioene, Methylene Blue, Toluidine Blue), acridines (e.g., Acridine Orange, chloroflavine, acriflavine), phthalocyanines (e.g., phthalocyanine, metalphthalocyanine), porphyrins (e.g., tetraphenyl porphyrin, central metal-substituted porphyrin), chlorophylls (e.g., chlorophyll, chlorophyllin, central metal-substituted chlorophyll), metal complexes, anthraquinones (e.g., anthraquinone), and stariums (e.g., starium) are exemplified.

As more preferred examples of spectral sensitizing dyestuffs or dyes, styryl dyestuffs disclosed in JP-B-37-13034, cationic dyes disclosed in JP-A-62-143044, quinoxalinium salts disclosed in JP-B-59-24147, novel Methylene Glue compounds disclosed in JP-A-64-33104, anthraquinones disclosed in JP-A-64-56767, benzoxanthene dyes disclosed in JP-A-2-1714, acridines disclosed in JP-A-2-226148 and JP-A-2-226149, pyrylium salts disclosed in JP-B-40-28499, cyanines disclosed in JP-B-46-42363, benzofuran dyestuffs disclosed in JP-A-2-63053, conjugate ketone dyestuffs disclosed in JP-A-2-85858 and JP-A-2-216154, dyestuffs disclosed in JP-A-57-10605, azocinnamylidene derivatives disclosed in JP-B-2-30321, cyanine dyestuffs disclosed in JP-A-1-287105, xanthene dyestuffs disclosed in JP-A-62-31844, JP-A-62-31848 and JP-A-62-143043, aminostyryl ketones disclosed in JP-B-59-28325, merocyanine dyestuffs disclosed in JP-B-61-9621, dyestuffs disclosed in JP-A-2-179643, merocyanine dyestuffs disclosed in JP-A-2-244050, merocyanine dyestuffs disclosed in JP-B-59-28326, merocyanine dyestuffs disclosed in JP-A-59-89803, merocyanine dyestuffs disclosed in JP-A-8-129257, and benzopyran dyestuffs disclosed in JP-A-8-334897 can be exemplified.

The sensitizing dyestuff for use in the invention is more preferably represented by the following formula (12).

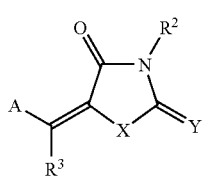

Formula (12)

In formula (12), A represents an aromatic ring or a heterocyclic ring that may have a substituent; X represents an oxygen atom, a sulfur atom, or —N($R^1$)—; Y represents an oxygen atom or —N($R^1$)—; and $R^1$, $R^2$ and $R^3$ each represents a hydrogen atom or a monovalent nonmetallic atomic group. A and $R^1$, $R^2$ or $R^3$ may be bonded to each other to form an aliphatic or aromatic ring.

When $R^1$, $R^2$ and $R^3$ each represents a monovalent nonmetallic atomic group, which preferably represents a substituted or unsubstituted alkyl group or an aryl group.

The preferred examples of $R^1$, $R^2$ and $R^3$ are specifically described. As preferred examples of alkyl groups, straight chain, branched or cyclic alkyl groups having from 1 to 20 carbon atoms can be exemplified, specifically a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these alkyl groups, straight chain alkyl groups having from 1 to 12 carbon atoms, branched alkyl groups having from 3 to 12 carbon atoms, and cyclic alkyl groups having from 5 to 10 carbon atoms are more preferred.

As the substituents of the substituted alkyl groups, monovalent non-metallic atomic groups exclusive of a hydrogen atom are-used, and the preferred examples include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acyloxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkyl-ureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxy-carbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-aryl-carbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a sulfonato group), an alkoxysulfonyl group, an aryloxysulfonyl group, a sulfinamoyl group, an N-alkyl-sulfinamoyl group, an N,N-dialkylsufinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfanoyl group, a phosphono group (—$PO_3H_2$) and a conjugate base group thereof (hereinafter referred to as a phosphonato group), a dialkylphosphono group (—PO₃(alkyl)₂), a diarylphosphono group (—PO₃(aryl)₂), an alkylarylphosphono group (—PO₃(alkyl)(aryl)), a monoalkylphosphono group (—PO₃H(alkyl)) and a conjugate base group thereof (hereinafter referred to as an alkylphosphonato group), a monoarylphosphono group (—PO₃H (aryl)) and a conjugate base group thereof (hereinafter referred to as an arylphosphonato group), a phosphonoxy group (—OPO₃H₂) and a conjugate base group thereof (hereinafter referred to as a phosphonatoxy group), a dialkylphosphonoxy group (—OPO₃(alkyl)₂), a diaryl-phosphonoxy group (—OPO₃(aryl)₂), an alkylarylphosphonoxy group (—OPO₃(alkyl)(aryl)), a monoalkylphosphonoxy group (—OPO₃H(alkyl)) and a conjugate base group thereof (herein-after referred to as an alkylphosphonatoxy group), a monoaryl-phosphonoxy group (—OPO₃H(aryl)) and a conjugate base group thereof (hereinafter referred to as an arylphosphonatoxy group), a cyano group, a nitro group, an aryl group, a heteroaryl group, an alkenyl group, an alkynyl group, and a silyl group. As the specific examples of the alkyl groups in these substituents, the above-described alkyl groups are exemplified, and these substituents may further be substituted.

The specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylammophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a cyanophenyl group, a sulfophenyl group, a sulfonatophenyl group, a phosphonophenyl group, and a phosphonatophenyl group.

As the heteroaryl groups, groups derived from monocyclic or polycyclic aromatic rings containing at least one of nitrogen, oxygen and sulfur atoms are used. As the examples of especially preferred heteroaryl rings in the heteroaryl groups include, e.g., thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indoyl, indazole, purine, quinoline, isoquinoline, phthalazine, naphthyridine, quinazoline, cinnoline, pteridine, carbazole, carboline, phenanthrine, acridine, perimidine, phenanthroline, phthalazine, phenarsazine, phenoxazine, and furazane. These heteroaryl rings may further be benzo-condensed or may have a substituent.

As the examples of the alkenyl groups, a vinyl group, a 1-propenyl group, a 1-butenyl group, a cinnamyl group, and a 2-chloro-1-ethenyl group can be exemplified, and as the examples of the alkynyl groups, an ethynyl group, a 1-propynyl group, a 1-butynyl group, and a trimethylsilylethynyl group can be exemplified. As $G^1$ in the acyl group ($G^1CO$—), a hydrogen atom and the above alkyl groups and aryl groups can be exemplified. Of these substituents, more preferred examples include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diaryl-phosphono group, a monoalkylphosphono group, an alkylphosphonato group, a monoarylphosphono group, an aryl-phosphonato group, a phosphonoxy group, a phosphonatoxy group, an aryl group, an alkenyl group, and an alkylidene group (a methylene group).

On the other hand, as the alkylene group in the substituted alkyl groups, divalent organic residues obtained by removing any one hydrogen atom on the above alkyl groups having from 1 to 20 carbon atoms can be exemplified, preferably straight chain alkylene groups having from 1 to 12 carbon atoms, branched alkylene groups having from 3 to 12 carbon atoms, and cyclic alkylene groups having from 5 to 10 carbon atoms are exemplified.

The specific examples of the preferred substituted alkyl groups represented by $R^1$, $R^2$ or $R^3$ obtained by combining the above substituents and alkylene groups include a chloromethyl group, a bromomethyl group, a 2-chloroethyl group, a trifluoro-methyl group, a methoxymethyl group, a methoxyethoxyethyl group, an allyloxymethyl group, a phenoxymethyl group, a methylthiomethyl group, a tolylthiomethyl group, an ethyl-aminoethyl group, a diethylaminopropyl group, a morpholino-propyl group, an acetyloxymethyl group, a benzoyloxymethyl group, an N-cyclohexylcarbamoyloxyethyl group, an N-phenyl-carbamoyloxyethyl group, an acetylaminoethyl group, an N-methylbenzoylaminopropyl group, a 2-oxyethyl group, a 2-oxypropyl group, a carboxypropyl group, a methoxycarbonyl-ethyl group, an allyloxycarbonylbutyl group, a chlorophenoxy-carbonylmethyl group, a carbamoylmethyl group, an N-methyl-carbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatopropyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethyl-phosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenyl-methyl group, a 2-propynyl group, a 2-butynyl group, and a 3-butynyl group.

As the examples of preferred aryl groups represented by $R^1$, $R^2$ or $R^3$, a ring formed by condensation of 1 to 3 benzene rings, and a ring formed by condensation of a benzene ring and a 5-membered unsaturated ring are exemplified. Specifically, a phenyl group, a naphthyl group, an anthryl group, a phenanthryl group, an indenyl group, an acenaphthenyl group, a fluorenyl group, etc., can be exemplified, and of these groups a phenyl group and a naphthyl group are more preferred.

As the examples of preferred substituted aryl groups represented by $R^1$, $R^2$ or $R^3$, aryl groups having monovalent nonmetallic atomic groups (exclusive of a hydrogen atom) as the substituents on the above ring-forming carbon atoms of aryl groups are exemplified. As the examples of preferred substituents, the above alkyl groups, substituted alkyl groups, and the groups described above as the substituents of the substituted alkyl groups can be exemplified. The specific examples of preferred substituted aryl groups, a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxy-phenyl group, an allyloxyphenyl group, a phenoxyphenyl group, a methylthiophenyl group, a tolylthiophenyl group, an ethylamiophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylamino-phenyl group, an N-methylbenzoylaminophenyl group, a carboxyphenyl group, a methoxycarbonylphenyl group, an allyloxycarbonylphenyl group, a chlorophenoxycarbonyl-phenyl group, a carbamoylphenyl group, an N-methylcarbamoyl-phenyl group, an N,N-dipropylcarbamoylphenyl group, an N-methoxyphenyl) carbamoylphenyl group, an N-methyl-N-(sulfophenyl)carbamoylphenyl group, a sulfophenyl group, a sulfonatophenyl group, a sulfamoylphenyl group, an N-ethyl-sulfamoylphenyl group, an N,N-dipropylsulfamoylphenyl group, an N-tolylsulfamoylphenyl group, an N-methyl-N(phosphonophenyl)sulnoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenyl-methylphenyl group, a 2-butenylphenyl group, a 2-methylallyl-phenyl group, a 2-methylpropenylphenyl group, a 2-propynyl-phenyl group, a 2-butynylphenyl group; and a 3-butynylphenyl group can be exemplified.

As the more preferred examples of $R^2$ and $R^3$, substituted or unsubstituted alkyl groups are exemplified. As the more preferred examples of $R^1$, substituted or unsubstituted aryl groups are exemplified. Although the reason is not clear, it is presumed that due to having these substituents, the interaction between the electronic excitation state caused by light absorption and the initiating compounds becomes especially great, as a result the efficiency of the initiating compounds to generate radicals, acids or bases is improved.

In the next place, A in formula (12) is explained. A represents an aromatic ring or a heterocyclic ring that may have a substituent. As the specific examples of the aromatic ring or the heterocyclic ring that may have a substituent, the same examples as exemplified in $R^1$, $R^2$ and $R^3$ in formula (12) can be exemplified.

As preferred A, aryl groups having an alkoxyl group, a thioalkyl group, or an amino group are exemplified, and as especially preferred A, aryl groups having an amino group are exemplified.

Y in formula (12) is explained. Y represents a nonmetallic atomic group necessary to form a heterocyclic ring together with the above A and contiguous carbon atoms. As such a heterocyclic ring, 5-, 6- or 7-membered nitrogen-containing, or sulfur-containing heterocyclic rings that may have a condensed ring are exemplified, and 5- or 6-membered heterocyclic rings are preferred.

As the examples of the nitrogen-containing heterocyclic rings, e.g., those described in L. G. Brooker et al., Journal of American Chemical Society (J. Am. Chem. Soc.), Vol. 73, pp. 5326 to 5358 (1951), and those known as constituting the basic nuclei in the merocyanine dyestuffs described in the literature can be preferably used.

The specific examples include thiazoles (e.g., thiazole, 4-methylthiazole, 4-phenylthiazole, 5-methylthiazole, 5-phenylthiazole, 4,5-dimethylthiazole, 4,5-diphenyl-thiazole, 4,5-di(p-methoxyphenylthiazole), 4-(2-thienyl)-thiazole, 4,5-di(2-furyl)thiazole, etc.), benzothiazoles (e.g., benzothiazole, 4-chlorobenzothiazole, 5-chloro-benzothiazole, 6-chlorobenzothiazole, 7-chlorobenzothiazole, 4-methylbenzothiazole, 5-methylbenzothiazole, 6-methyl-benzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-diodobenzothiazole, 6-diodobenzothiazole, 4-thoxybenzothiazole, 5-thoxybenzo-thiazole, tetrahydrobenzothiazole, 5,6-dimethoxybenzo-thiazole, 5,6-dioxymethylenebenzothiazole, 5-hydroxybenzo-thiazole, 6-hydroxybenzothiazole, 6-dimethylaminobenzo-thiazole, 5-thoxycarbonylbenzothiazole, etc.), naphtho-thiazoles (e.g., naphtho[1,2] thiazole, naphtho[2,1]thiazole, 5-methoxynaphtho[2,1] thiazole, 5-thoxynaphtho[2,1]thiazole, 8-methoxynaphtho [1,2]thiazole, 7-methoxynaphtho[1,2]-thiazole, etc.), thianaphtheno-7',6',4,5-thiazoles (e.g., 4'-methoxythianaphtheno-7',6',4,5-thiazole, etc.), oxazoles (e.g., 4-methyloxazole, 5-methyloxazole, 4-phenyloxazole, 4,5-diphenyloxazole, 4-ethyloxazole, 4,5-dimethyloxazole, 5-phenyloxazole, etc.), benzoxazoles (e.g., benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxy-benzoxazole, 4-thoxybenzoxazole, 5-chlorobenzoxazole, 6-methoxybenzoxazole, 5-hydroxybenzoxazole, 6-hydroxybenz-oxazole, etc.), naphthoxazoles (e.g., naphtho[1,2] oxazole, naphtho[2,1]-oxazole, etc.), selenazoles (e.g., 4-methylselenazole, 4-phenylselenazole, etc.), benzoselenazoles (e.g., benzoselenazole, 5-chlorobenzoselenazole, 5-methoxybenzo-selenazole, 5-hydroxybenzoselenazole, tetrahydrobenzo-selenazole, etc.), naphthoselenazoles (e.g., naphtho[1,2]-selenazole, naphtho[2,1]selenazole, etc.), thiazolines (e.g., thiazoline, 4-methylthiazoline, 4,5-dimethylthiazoline, 4-phenylthiazoline, 4,5-di(2-furyl)thiazoline, 4,5-diphenylthiazoline, 4,5-di(p-methoxyphenyl)thiazoline, etc.), 2-quinolines (e.g., quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, 8-hydroxyquinoline, etc.), 4-quinolines (e.g., quinoline, 6-methoxyquinoline, 7-methylquinoline, 8-methylquinoline, etc.), 1-disoquinolines (e.g., isoquinoline, 3,4-dihydroisoquinoline, etc.), 3-disoquinolines (e.g., isoquinoline, etc.), benzimidazoles (e.g., 1,3-dimethylbenzimidazole, 1,3-diethylbenzimidazole, 1-ethyl-3-phenylbenzimidazole, etc.), 3,3-dialkyl-dindolenines (e.g., 3,3-dimethylindolenine, 3,3,5-trimethyl-dindolenine, 3,3,7-trimethylindolenine, etc.), 2-pyridines (e.g., pyridine, 5-methylpyridine, etc.), and 4-pyridines (e.g., pyridine, etc.). The substituents of these rings may be bonded to each other to form a ring.

As the examples of the sulfur-containing heterocyclic rings, e.g., the dithiol partial structures in dyestuffs disclosed in JP-A-3-296759 can be exemplified.

Specifically, benzodithiols (e.g., benzodithiol, 5-t-butylbenzodithiol, 5-methylbenzodithiol, etc.), naphthodithiols (e.g., naphtho[1,2]dithiol, naphtho[2,1]-dithiol, etc.), and dithiols (e.g., 4,5-dimethyldithiols, 4-phenyldithiols, 4-methoxycarbonyldithiols, 4,5-dimethoxy-carbonyldithiols, 4,5-diethoxycarbonyldithiols, 4,5-ditri-fluoromethyldithiol, 4,5-dicyanodithiol, 4-methoxycarbonyl-methyldithiol, 4-boxymethyldithiol, etc.) can be exemplified.

Of the above-described examples of nitrogen-containing or sulfur-containing heterocyclic rings formed by Y together with A and contiguous carbon atoms, a dyestuff having a structure represented by the following partial structural formula (13) is especially preferred for the reason that it can providr a photosensitive composition having very excellent preservation stability besides high sensitizing performance.

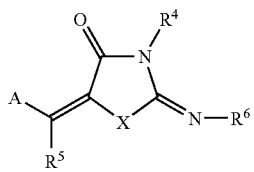

Formula (13)

In formula (13), A represents an aromatic ring or a heterocyclic ring that may have a substituent; X represents an oxygen atom, a sulfur atom, or —N(R$^1$)—; and R$^1$, R$^4$, R$^5$ and R$^6$ each represents a hydrogen atom or a monovalent nonmetallic atomic group. A and R$^1$, R$^4$, R$^5$ or R$^6$ may be bonded to each other to form an aliphatic or aromatic ring.

In formula (13), A and R$^1$ have the same meaning as those in formula (12), R$^4$ as R$^2$ in formula (12), R$^5$ as R$^3$ in formula (12), and R$^6$ as R$^1$ in formula (12), respectively have the same meaning.

A compound represented by formula (12) is more preferably a compound represented by the following formula (14).

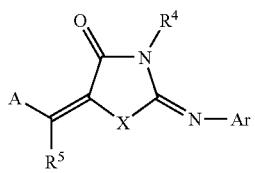

Formula (14)

In formula (14), A represents an aromatic ring or a heterocyclic ring that may have a substituent; X represents an oxygen atom, a sulfur atom, or —N(R$^1$)—; and R$^1$, R$^4$ and R$^5$ each represents a hydrogen atom or a monovalent nonmetallic atomic group. A and R$^1$, R$^4$ or R$^5$ may be bonded to each other to form an aliphatic or aromatic ring. Ar represents an aromatic ring or a heterocyclic ring having a substituent, provided that it is necessary that the sum total of the Hammett's values of the substituent on the Ar skeleton is greater than 0. The terminology "the sum total of the Hammett's values is greater than 0" may be either a case of having one substituent and the Hammett's value of the substituent is greater than 0, or a case of having a plurality of substituents and the sum total of the Hammett's values of these substituents is greater than 0.

In formula (14), A and R$^1$ have the same meaning as those in formula (12), R$^4$ as R$^2$ in formula (12), and R$^5$ as R$^3$ in formula (12), respectively have the same meaning. Ar represents an aromatic ring or a heterocyclic ring having a substituent, and as the specific examples thereof, of the examples of A in formula (12) described above, the specific examples of the aromatic ring or the heterocyclic ring having a substituent can be exemplified. However, as the substituents capable of being introduced to Ar in formula (14), it is essential that the sum total of the Hammett's values of the substituent is 0 or higher. As the examples of such substituents, a trifluoromethyl group, a carbonyl group, an ester group, a halogen atom, a nitro group, a cyano group, a sulfoxide group, an amido group, and a carboxyl group are exemplified. The Hammett's values of these substituents are shown below: a trifluoromethyl group (—CF$_3$, m: 0.43, p: 0.54), a carbonyl group (e.g., —COH, m: 0.36, p: 0.43), an ester group (—COOCH$_3$, m: 0.37, p: 0.45), a halogen atom (e.g., Cl, m: 0.37, p: 0.23), a cyano group (—CN, m: 0.56, p: 0.66), a sulfoxide group (e.g., —SOCH$_3$, m: 0.52, p: 0.45), an amido group (e.g., —NHCOCH$_3$, m: 0.21, p: 0.00), and a carboxyl group (—COOH, m: 0.37, p: 0.45) are exemplified. Those shown in the parentheses are the introducing position on the aryl skeleton and the Hammett's value of the substituent, and (m: 0.50) means that the Hammett's value is 0.50 when the substituent is introduced on the meta-position. As a preferred example of Ar, a phenyl group having a substituent can be exemplified, and preferred substituents on the Ar skeleton are an ester group and a cyano group. As the position of substitution, it is particularly preferred to substitute at the ortho-position on the Ar skeleton.

The preferred specific examples of the sensitizing dyestuffs represented by formula (12) (Exemplified Compounds D1 to D57) are shown below, but the invention is not restricted to these compounds. Incidentally, of these compounds, those corresponding to the compound represented by formula (13) are Exemplified Compounds D2, D6, D10, D18, D21, D28, D31, D33, D35, D38, D41, D45 to D57.

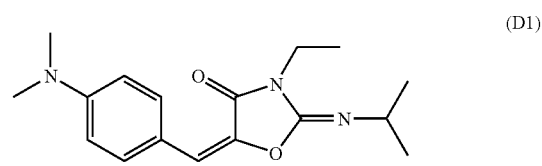

(D1)

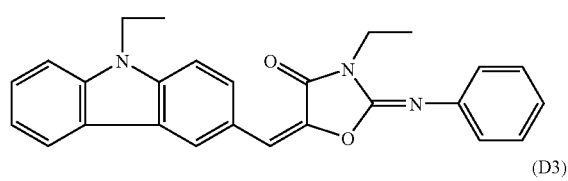

(D2)

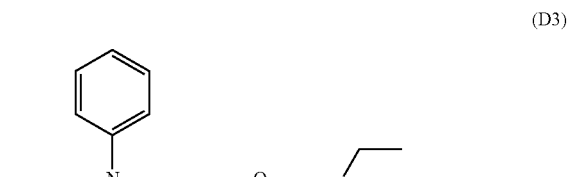

(D3)

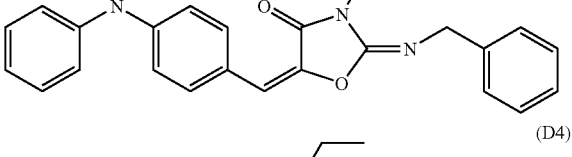

(D4)

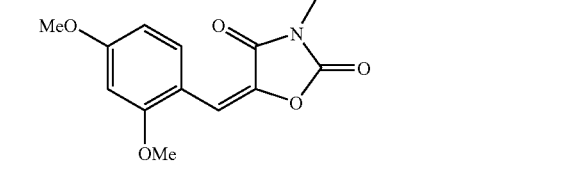

(D5)

-continued
(D6) 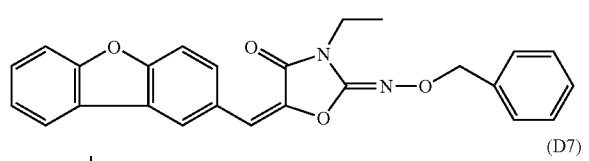
(D7) 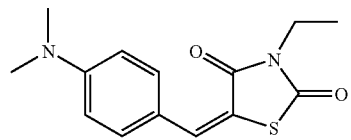
(D8) 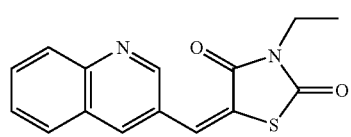
(D9) 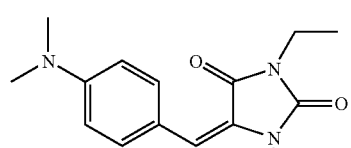
(D10) 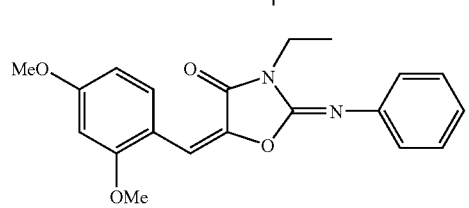
(D11) 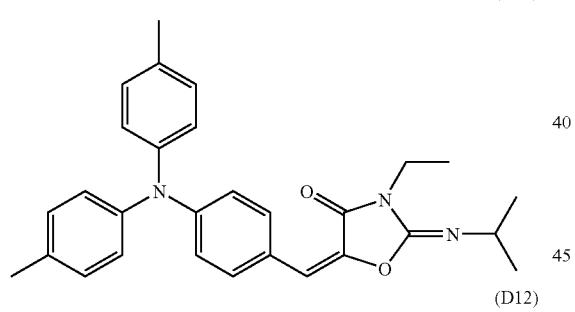
(D12) 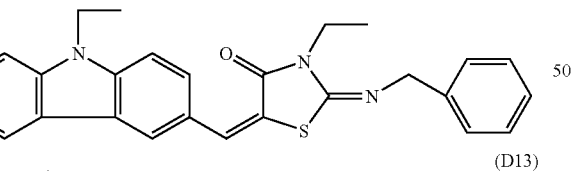
(D13) 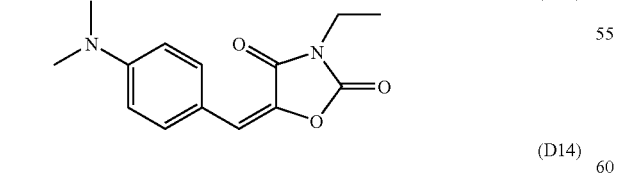
(D14) 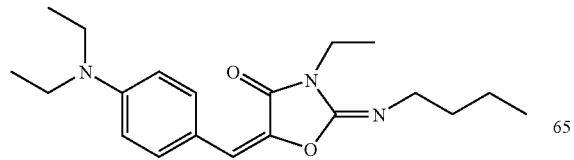
-continued
(D15) 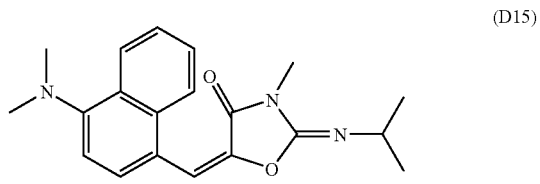
(D16) 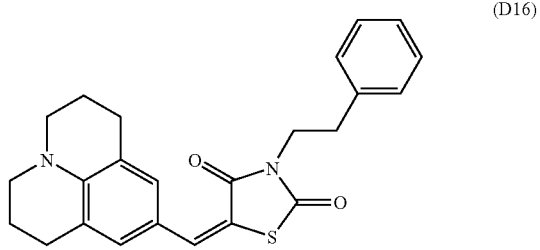
(D17) 
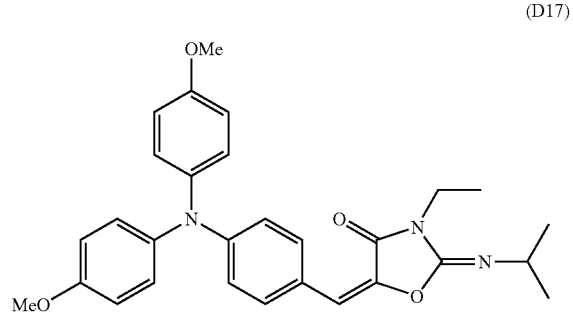
(D18) 
(D19) 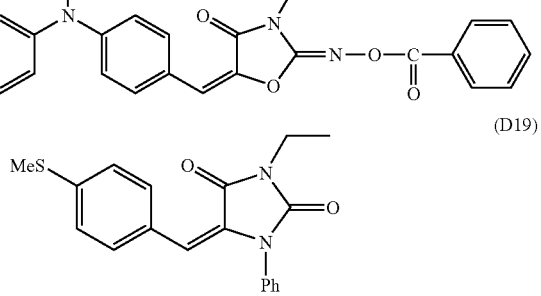
(D20) 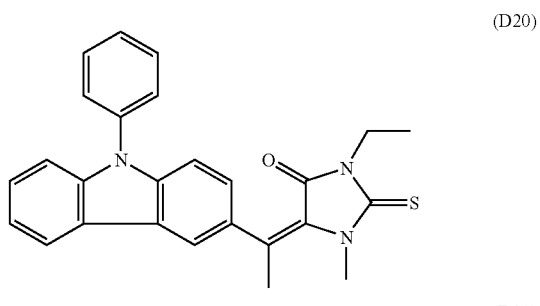
(D21) 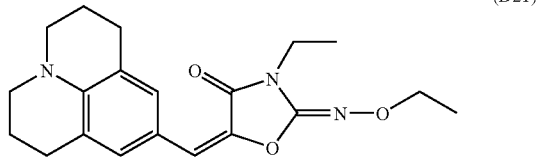

-continued
(D22)
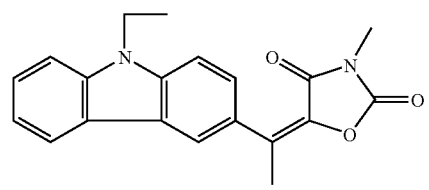
(D23)
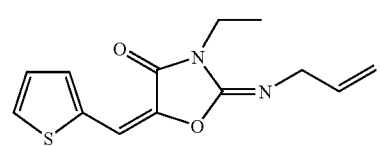
(D24)
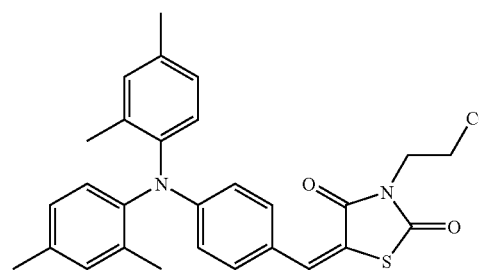
(D25)
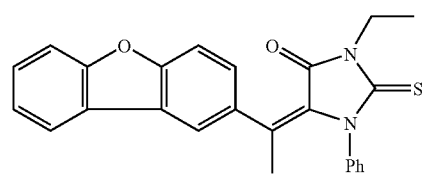
(D26)
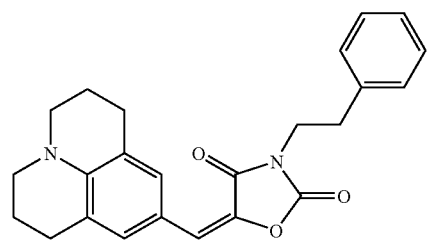
(D27)
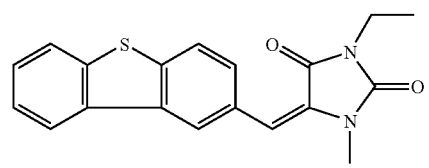
(D28)
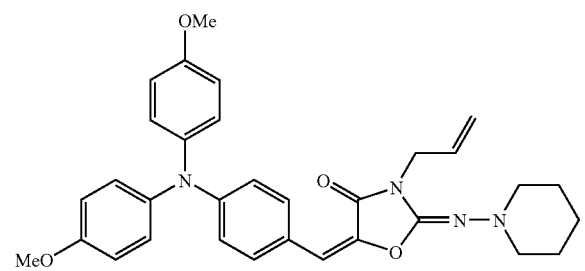
-continued
(D29)
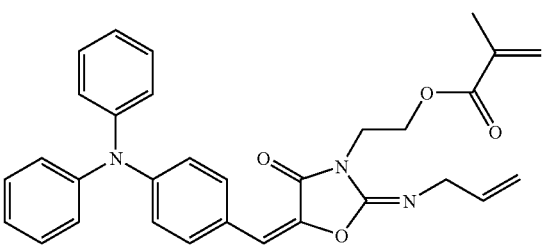
(D30)
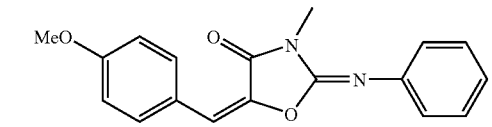
(D31)
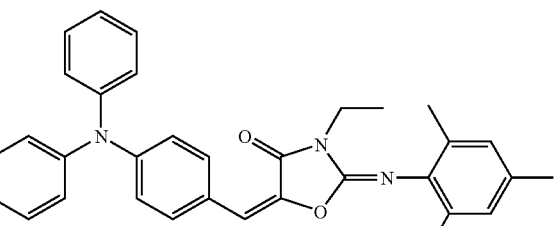
(D32)
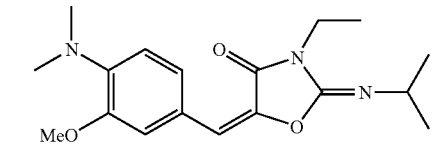
(D33)
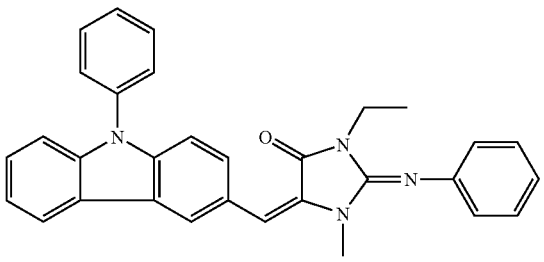
(D34)
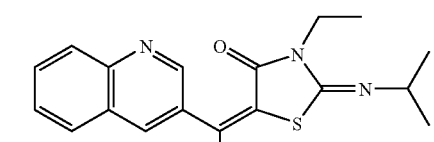
(D35)
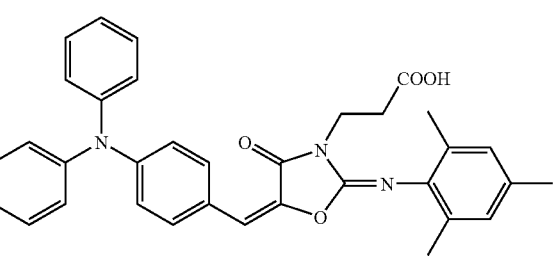

-continued
(D36)
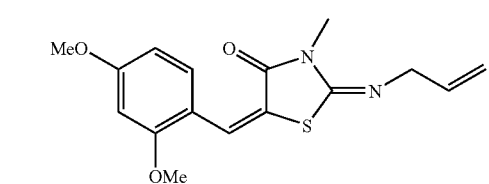
(D37)
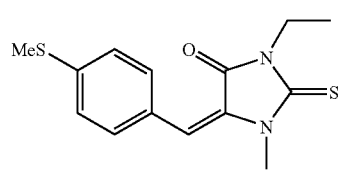
(D38)
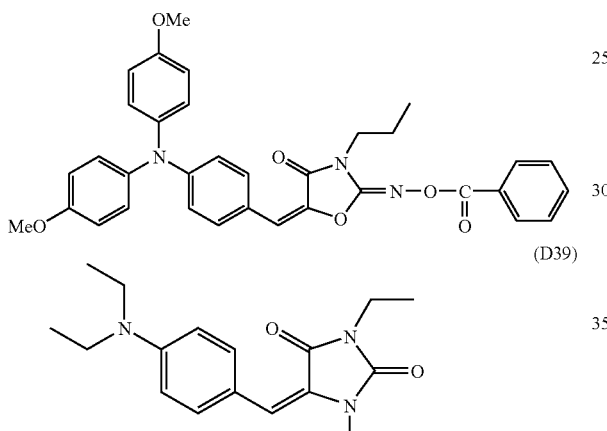
(D39)
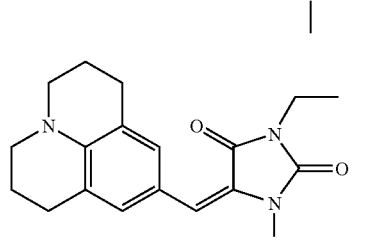
(D40)
(D41)
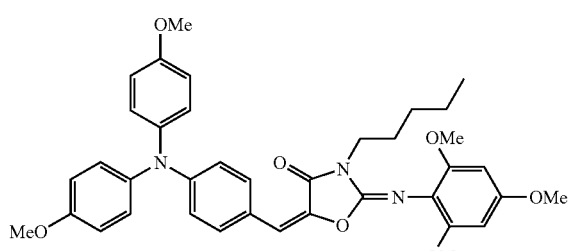
(D42)
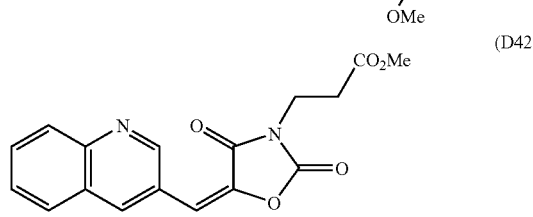
-continued
(D43)
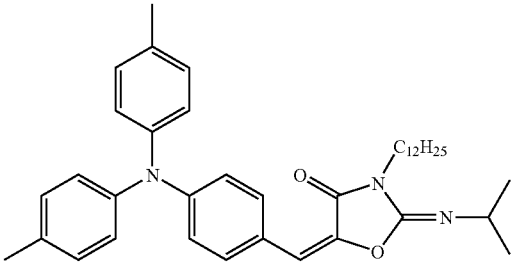
(D44)
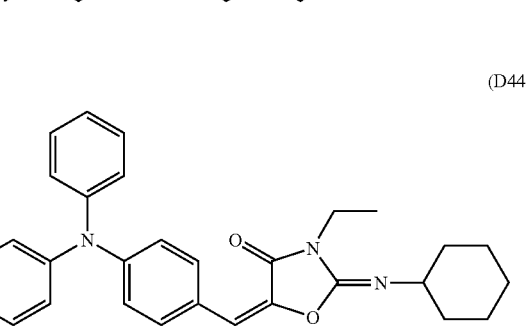
(D45)
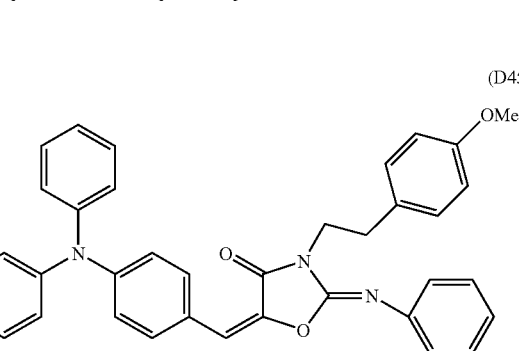
(D46)
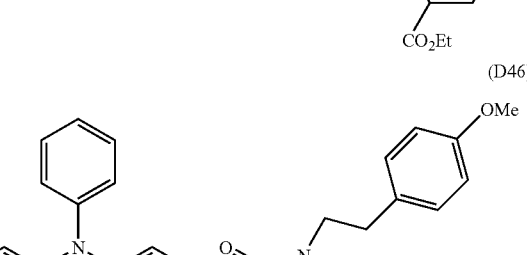
(D47)
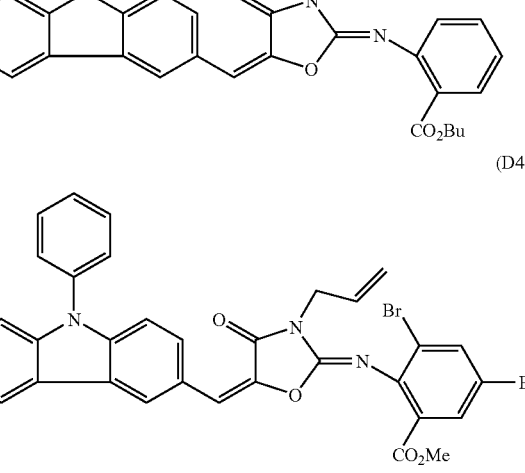

-continued (D48)
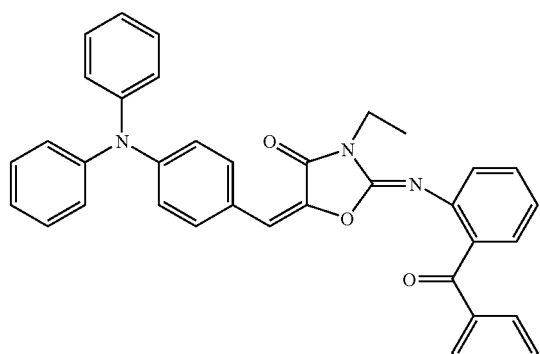

(D49)
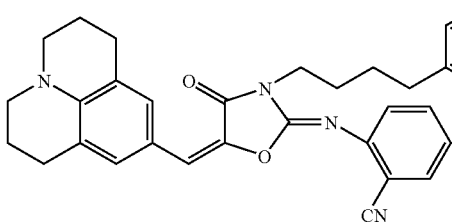

(D50)

(D51)
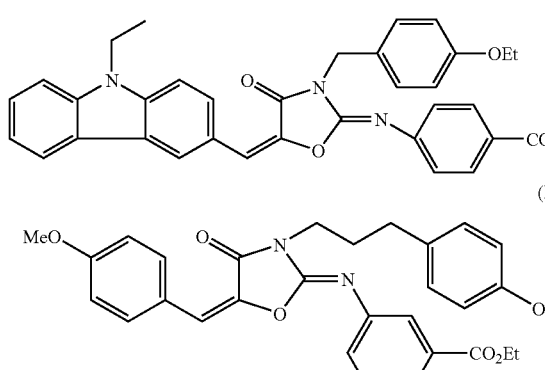

(D52)

(D53)
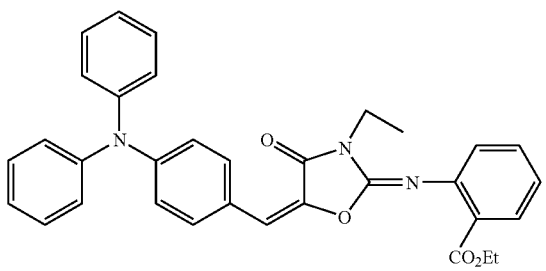

(D54)
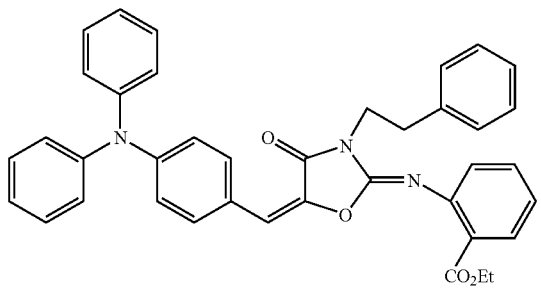

(D55)

(D56)
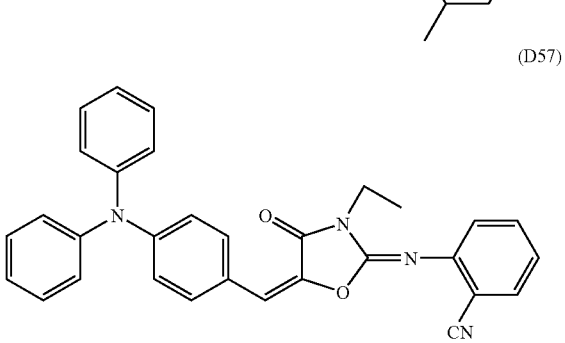

(D57)

The synthesis methods of a compound represented by formula (12) are described.

A compound represented by formula (12) is generally obtained by condensation reaction of an acid nucleus having an active methylene group and a substituted or unsubstituted aromatic ring or heterocyclic ring, and JP-B-59-28329 can be referred to. For example, as shown in the following reaction scheme (1), a synthesis method of utilizing the condensation reaction of an acid nuclear compound and a basic nuclear material having an aldehyde group or a carbonyl group on the heterocyclic ring is exemplified. The condensation reaction is, if necessary, carried out in the presence of a base. As the base, generally used bases, e.g., amine, pyridines (trialkylamine, dimethylaminopyridine, diazabicycloundecene DBU, etc.), metal amides (lithium diisopropylamide, etc.), metal alkoxides (sodium methoxide, potassium t-butoxide, etc.), and metal hydrides (sodium hydride, potassium hydride, etc.) can be used with no restriction.

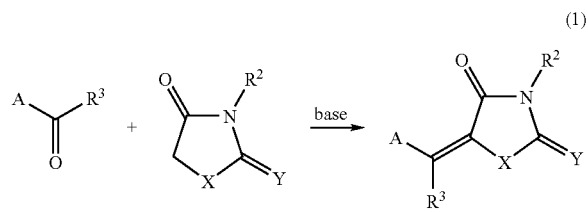

(1)

As another preferred synthesis method, a method according to the following reaction scheme (2) is exemplified. That is, as the acid nuclear compound in reaction scheme (1), an acid nuclear compound in which Y is a sulfur atom is used as a starting material, and the reaction is performed by the same way as the reaction scheme (1) until the process of synthesizing a dyestuff precursor by the condensation reaction of an acid nuclear compound and a basic nuclear material having an aldehyde group or a carbonyl group on the heterocyclic ring, and then a metal salt capable of chemical interaction with a sulfur atom and forming a metal sulfide and water or a primary amine compound (R—$NH_2$, where R represents a monovalent nonmetallic atomic group) are made act on the dyestuff precursor.

Of these synthesis methods, the reaction shown by the reaction scheme (2) is high in yield of each reaction and preferred from the synthesis efficiency. The reaction shown by the reaction scheme (2) is especially useful in synthesizing a compound represented by formula (13).

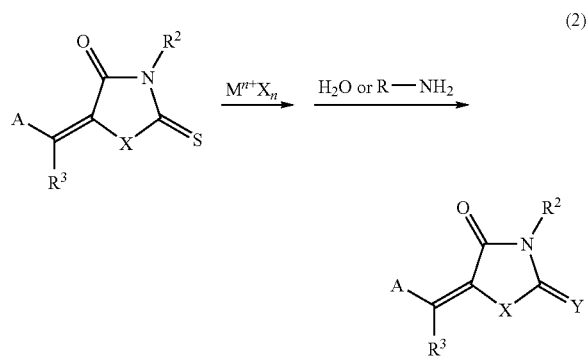

(2)

In the reaction scheme (2), $M^{n+}X_n$ represents a metal salt capable of chemical interaction with the sulfur atom of a thiocarbonyl group and forming a metal sulfide. As the specific compounds, M is Al, Au, Ag, Hg, Cu, Zn, Fe, Cd, Cr, Co, Ce, Bi, Mn, Mo, Ga, Ni, Pd, Pt, Ru, Rh, Sc, Sb, Sr, Mg, or Ti and X is F, Cl, Br, I, $NO_3$, $SO_4$, $NO_2$, $PO_4$, or $CH_3CO_2$, i.e., compounds such as AgBr, AgI, AgF, AgO, AgCl, $Ag_2O$, $Ag(NO_3)$, $AgSO_4$, $AgNO_2$, $Ag_2CrO_4$, $Ag_3PO_4$, $Hg_2(NO_3)_2$, $HgBr_2$, $Hg_2Br_2$, HgO, $HgI_2$, $Hg(NO_3)_2$, $Hg(NO_2)_2$, $HgBr_2$, $HgSO_4$, $Hg_2I_2$, $Hg_2SO_4$, $Hg(CH_3CO_2)_2$, AuBr, $AuBr_2$, AuI, $AuI_3$, $AuF_3$, $Au_2O_3$, AuCl, $AuCl_3$, CuCl, CuI, $CuI_2$, $CuF_2$, CuO, $CuO_2$, $Cu(NO_3)_2$, $CuSO_4$, and $Cu_3(PO_4)_2$ are exemplified. Of these compounds, the most preferred metal salt is a silver salt in the point that it is easy of interaction with a sulfur atom.

It is also possible for a sensitizing dyestuff represented by formula (12) for use in the invention to be subjected to various chemical modifications for the purpose of further improving the characteristics of a photosensitive layer. For example, the strength of an exposed film can be heightened and unnecessary precipitation of dyestuffs from an exposed film can be inhibited by combining a sensitizing dyestuff with an addition polymerizable compound structure (e.g., an acryloyl group and a methacryloyl group) according to the methods, e.g., covalent bonding, ionic bonding or hydrogen bonding.

Further, by combining a sensitizing dyestuff with the partial structure having a radical generating property in the above-described initiating compound (e.g., the reduction decomposition sites of alkyl halide, onium, peroxide, and biimidazole, and the oxidation cleavage sites of borate, amine, trimethylsilylmethyl, carboxymethyl, carbonyl, and imine), photosensitivity in a state of the initiating compound in low density can be conspicuously raised.

When a photosensitive composition of the invention is used as the photosensitive layer of a lithographic printing plate precursor, which is a preferred way of use, the introduction of a hydrophilic site (acid groups or polar groups such as a carboxyl group and the ester thereof, a sulfonic acid group and the ester thereof, an ethylene oxide group, etc.) is effective for the purpose of increasing the processing aptitude in an alkali or aqueous developing solution. In particular, ester type hydrophilic groups have a relatively hydrophobic structure in the photosensitive layer, so that they are excellent in compatibility, and generate acid groups by hydrolysis in a developing solution to thereby increase hydrophilicity.

In addition, substituents can be arbitrarily introduced in order to improve the compatibility and inhibit crystal precipitation in the photosensitive layer. For example, unsaturated bonds of an aryl group and an allyl group are in some cases very effective for the improvement of compatibility in certain kinds of photosensitive systems, and crystal precipitation can be remarkably restrained by the introduction of steric hindrance between π flat surfaces of dyestuffs by a method of introduction of a branched alkyl structure. Further, the adhesion to inorganic substances, e.g., metals and metallic oxides, can be bettered by the introduction of a phosphonic acid group, an epoxy group, and a trialkoxysilyl group. In addition, a method of polymerization of sensitizing dyestuffs can also be utilized according to purposes.

As the sensitizing dyestuffs for use in the invention, it is preferred to use at least one kind of a sensitizing dyestuff represented by formula (12). So long as the sensitizing dyestuff is represented by formula (12), the details in usage of the dyestuff, e.g., what a structure of dyestuff is to be used as to the chemically modified sensitizing dyestuff, whether the sensitizing dyestuff is to be used alone or in combination of two or more, and what an amount is to be used, can be arbitrarily set up according to the final design of the performances of the photosensitive material. For example, the compatibility with the photosensitive layer can be heightened by the use of two or more kinds of sensitizing dyestuff in combination.

In the selection of sensitizing dyestuffs, the molar extinction coefficient at the emission wavelength of the light source to be used is an important factor, in addition to photosensitivity. By the use of a dyestuff having a large molar extinction coefficient, the addition amount of the dyestuff can be relatively reduced, which is not only economical but also advantageous from the viewpoint of the physical properties of the photosensitive layer.

In the invention, in addition to sensitizing dyestuffs represented by formula (12), general purpose sensitizing dyestuffs can also be used so long as the effect of the invention is not hindered.

Since the photosensitivity and the resolution of a photosensitive layer and the physical properties of an exposed film are largely influenced by the absorbance at a light source wavelength, the addition amount of sensitizing dyestuffs is arbitrarily selected taking these factors into consideration. For example, sensitivity decreases in a low region of absorbance of 0.1 or less. Further, resolution decreases by the influence of halation. However, such low absorbance is sometimes rather effective for the purpose of increasing hardness in curing a film of a thick of 5 μm or more. In a high region of absorbance of 3 or more, almost all the light is absorbed on the surface of a photosensitive layer, so that curing at more inside of the film is hindered and, when the photosensitive composition is used as a printing plate, the film strength and the adhesion strength to a substrate is insufficient.

For example, when the photosensitive composition of the invention is used as the photosensitive layer of a lithographic printing plate precursor used in a comparatively thin film thickness, it is preferred to set up the addition amount of a sensitizing dyestuff such that the absorbance of the photosensitive layer is from 0.1 to 1.5, and preferably from 0.25 to 1. Since the absorbance is determined by the addition amount of a sensitizing dyestuff and the photosensitive layer thickness, a desired absorbance can be obtained by the control of both conditions. The absorbance of a photosensitive layer can be measured by ordinary methods. As measuring methods, a method of forming, on a transparent or white support, a photosensitive layer having a necessary dry coating weight as a lithographic printing plate determined in an arbitrary range, and measuring the absorbance with a transmission type optical densitometer, and a method of forming a photosensitive layer on a reflective support such as aluminum, and measuring the reflection density are exemplified.

When the photosensitive composition of the invention is used as the photosensitive layer of a lithographic printing plate precursor, the addition amount of the sensitizing dyestuff is generally from 0.05 to 30 mass parts per 100 mass parts of all the solids content constituting the photosensitive layer, preferably from 0.1 to 20 mass parts, and more preferably from 0.2 to 10 mass parts.

Infrared Absorber:

When exposure is performed in the invention with lasers radiating infrared rays of from 760 to 1,200 nm as light sources, infrared absorbers are generally used. Infrared absorbers have a function of converting the absorbed infrared rays to heat. A radical generator (a polymerization initiator) is pyrolytically decomposed by heat generated at this time to generate radicals. The infrared absorbers for use in the invention are dyes or pigments having an absorption maximum in the wavelength range of from 760 to 1,200 nm.

As dyes for this purpose, commercially available dyes and well-known dyes described in literatures, e.g., Senryo Biaran (Dye Handbook), compiled by Yuki Gosei Kagaku Kyokai (1970) can be used. Specifically, azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squaryhum dyes, pyrylium salts and metal thiolate complexes are exemplified.

As preferred dyes, e.g., the cyanine dyes disclosed in JP-A-58-125246, JP-A-59-84356, JP-A-59-202829 and JP-A-60-78787, the methine dyes disclosed in JP-A-58-173696, JP-A-58-181690 and JP-A-58-194595, the naphthoquinone dyes disclosed in JP-A-58-112793, JP-A-58-224793, JP-A-59-48187, JP-A-59-73996, JP-A-60-52940 and JP-A-60-63744, the squarylium dyes disclosed in JP-A-58-112792, and the cyanine dyes disclosed in British Patent 434,875 are exemplified.

Further, the near infrared-absorbing sensitizers disclosed in U.S. Pat. No. 5,156,938 are also preferably used, in addition, the substituted arylbenzo(thio)pyrylium salts disclosed in U.S. Pat. No. 3,881,924, the trimethine thiapyrylium salts disclosed in JP-A-57-142645 (corresponding to U.S. Pat. No. 4,327,169), the pyrylium-based compounds disclosed in JP-A-58-181051, JP-A-58-220143, JP-A-5941363, JP-A-59-84248, JP-A-59-84249, JP-A-59-146063 and JP-A-59-146061, the cyanine dyestuffs disclosed in JP-A-59-216146, the pentamethine thiopyrylium salts disclosed in U.S. Pat. No. 4,283,475, and the pyrylium compounds disclosed in JP-B-5-13514 and JP-B-5-19702 are also preferably used in the invention. As other examples of preferred dyes, the near infrared absorbing dyes disclosed in U.S. Pat. No. 4,756,993 as the compounds represented by formulae (I) and (II) can be exemplified.

As other examples of preferred infrared absorbing dyestuffs in the invention, the specific indolenine cyanine dyes disclosed in Japanese Patent Application Nos. 2001-6326 and 2001-237840 as shown below are exemplified.

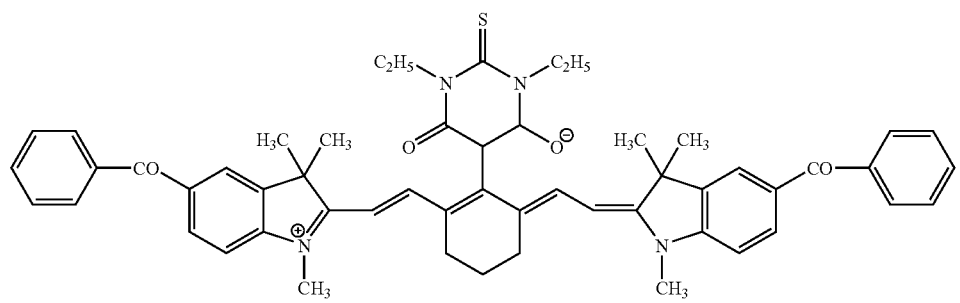

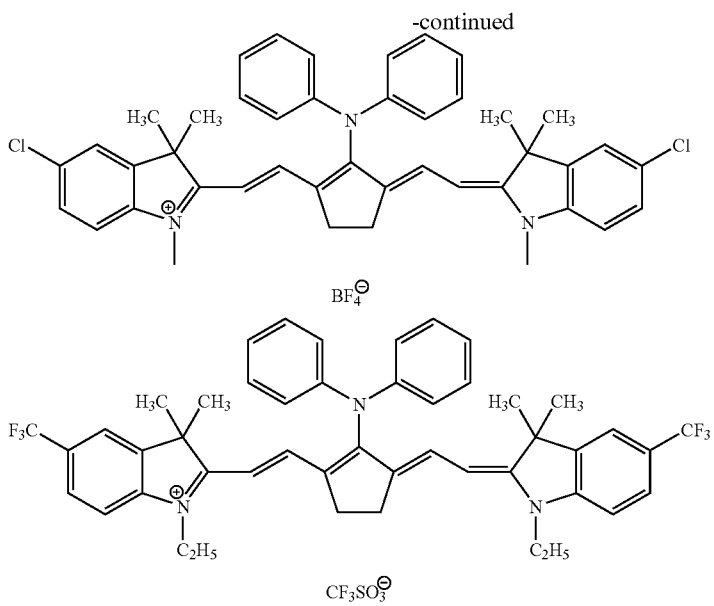

Of these dyes, cyanine dyestuffs, squarylium dyestuffs, pyrylium salts, nickel thiolate complexes and indolenine cyanine dyestuffs are very preferred. Cyanine dyestuffs and indolenine cyanine dyestuffs are more preferred, and cyanine dyestuffs represented by the following formulae (a) to (e) are particularly preferred.

Formula (a)

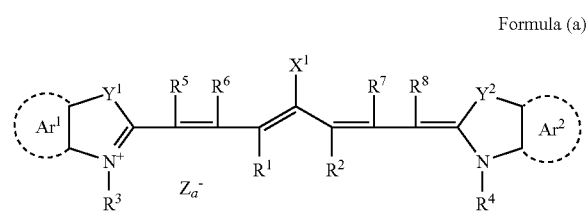

In formula (a), $X^1$ represents a hydrogen atom, a halogen atom, —$NPh_2$, $X^2$-$L^1$, or a group shown below; $X^2$ represents an oxygen atom, a nitrogen atom or a sulfur atom; and $L^1$ represents a hydrocarbon group having from 1 to 12 carbon atoms, an aromatic ring having a hetero atom, or a hydrocarbon group containing a hetero atom and having from 1 to 12 carbon atoms. The hetero atoms here show N, S, O, a halogen atom, and Se. $X_a^-$ is defined as the same with $Z_a^-$ described later, and $R^a$ represents a substituent selected from a hydrogen atom, an alkyl group, an aryl group, a substituted or unsubstituted amino group, and a halogen atom.

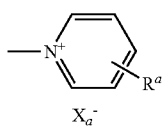

In the above formula, $R^1$ and $R^2$ each represents a hydrocarbon group having from 1 to 12 carbon atoms. In view of the preservation stability of a photosensitive layer coating solution, $R^1$ and $R^2$ each preferably represents a hydrocarbon group having 2 or more carbon atoms, and especially preferably $R^1$ and $R^2$ are bonded to each other to form a 5- or 6-membered ring.

$Ar^1$ and $Ar^2$, which may be the same or different, each represents an aromatic hydrocarbon group that may have a substituent. The examples of preferred aromatic hydrocarbon groups include a benzene ring and a naphthalene ring. The preferred examples of the substituents of the aromatic hydrocarbon groups include a hydrocarbon group having 12 or less carbon atoms, a halogen atom, and an alkoxyl group having 12 or less carbon atoms. $Y^1$ and $Y^2$, which may be the same or different, each represents a sulfur atom or a dialkylmethylene group having 12 or less carbon atoms. $R^3$ and R4, which may be the same or different, each represents a hydrocarbon group having 20 or less carbon atoms that may have a substituent. The preferred examples of the substituents of the hydrocarbon groups include an alkoxyl group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms, and preferably a hydrogen atom because of easy availability of the material. $Z_a^-$ represents a counter anion, provided that when a cyanine dyestuff represented by formula (a) has an anionic substituent in the structure and the neutralization of electric charge is not necessary, $Z_a^-$ is not necessary. Preferably $Z_a^-$ represents a halogen ion, a perchlorate ion, a tetafluoro-borate ion, a hexafluorophosphate ion, or a sulfonate ion in view of the preservation stability of a photosensitive layer solution, and especially preferably, a perchlorate ion, a hexafluorophosphate ion, or an arylsulfonate ion.

As the specific examples of the cyanine dyestuffs represented by formula (a) that can be preferably used in the invention, besides the dyestuffs shown below, the compounds disclosed in Japanese Patent Application No. 11-310623, paragraphs [0017] to [0019], Japanese Patent Application No. 2000-224031, paragraphs [0012] to [0038], and Japanese Patent Application No. 2000-211147, paragraphs [0012] to [0023] can be exemplified.

113
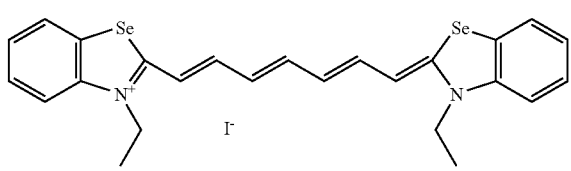
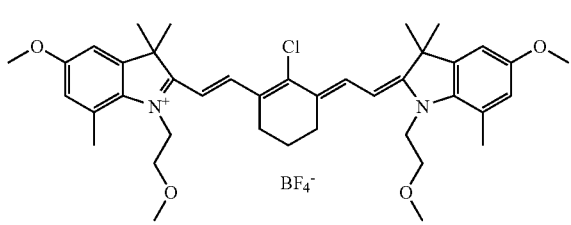
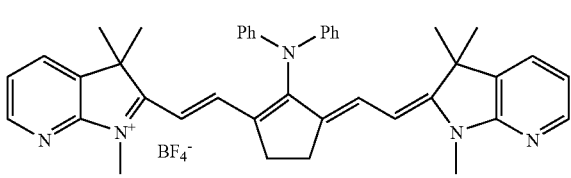
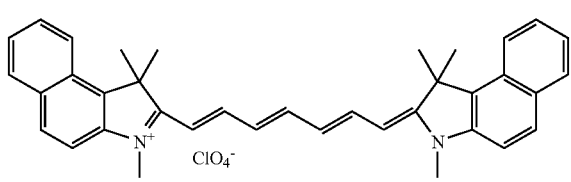
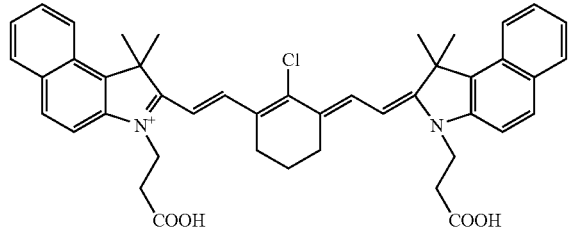
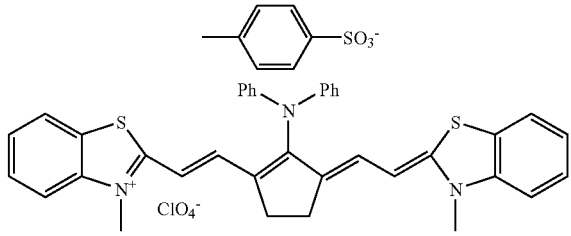
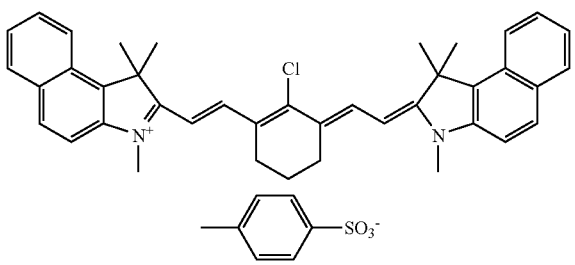
114
-continued
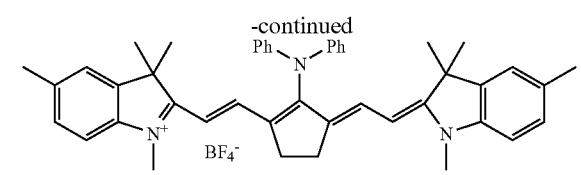
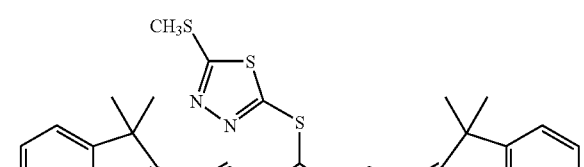
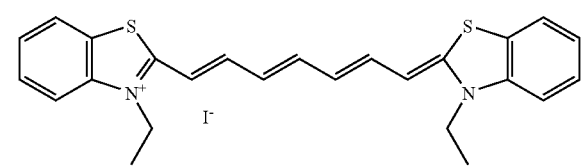
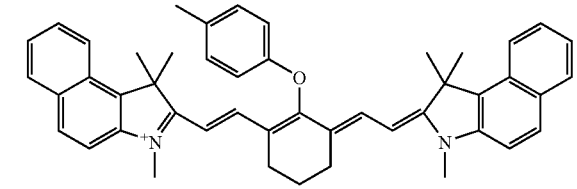
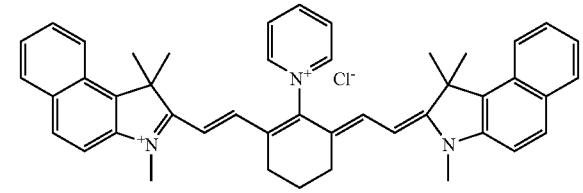
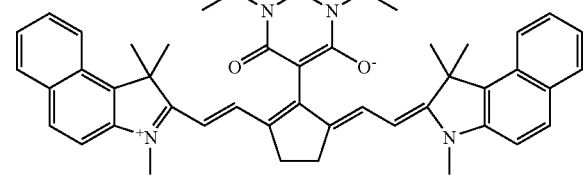
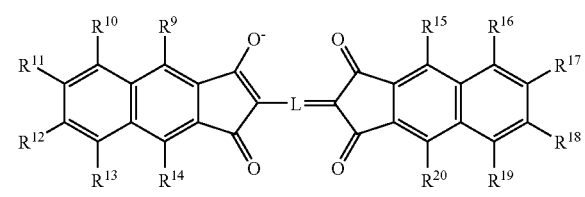
Formula (b)

In formula (b), L represents a methine chain having 7 or more conjugated carbon atoms, which methine chain may have substituents, and the substituents may be bonded to each other to form a cyclic structure. $Zb^+$ represents a counter cation. As preferred counter cations, ammonium, iodonium, sulfonium, phosphonium, pyridinium, alkali metal cations ($Na^+$, $K^+$, $Li^+$) are exemplified. $R^9$ to $R^{14}$ and $R^{15}$ to $R^{20}$ each represents a hydrogen atom, or a substituent selected from a halogen atom, a cyano group, an alkyl group, an aryl group, an alkenyl group, an alkynyl group, a carbonyl group, a thio group, a sulfonyl group, a sulfinyl group, an oxy group, and an amino group, or a substituent comprising two or three of these groups, and they may be bonded to each other to form a cyclic structure. A compound represented by formula (b) wherein L represents a methine chain having 7 conjugated carbon atoms, and all of $R^9$ to $R^{14}$ and $R^{15}$ to $R^{20}$ represent a hydrogen atom is preferred for easy availability and the effects of the compound.

As the specific examples of the dyes represented by formula (b) that can be preferably used in the invention, the following compounds can be exemplified.

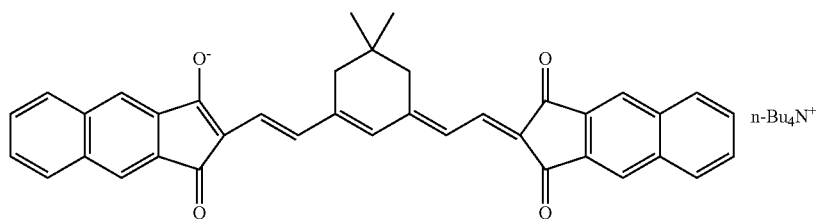

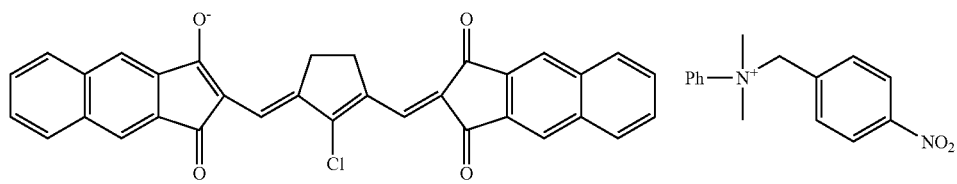

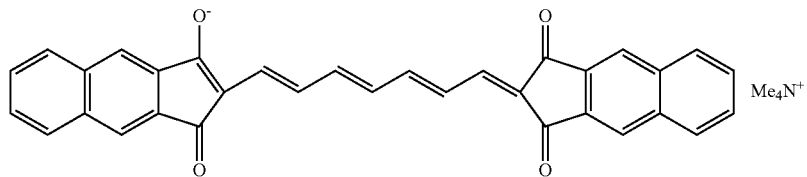

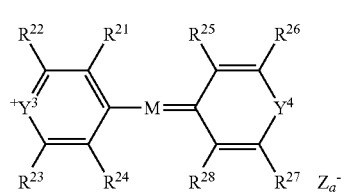

Formula (c)

In formula (c), $Y^3$ and $Y^4$ each represents an oxygen atom, a sulfur atom, a selenium atom, or a tellurium atom; M represents a methine chain having 5 or more conjugated carbon atoms; $R^{21}$ to $R^{24}$ and $R^{25}$ to $R^{28}$, which may be the same or different, each represents a hydrogen atom, a halogen atom, a cyano group, an alkyl group, an aryl group, an alkenyl group, an alkynyl group, a carbonyl group, a thio group, a sulfonyl group, a sulfinyl group, an oxy group, or an amino group; and $Za^-$ represents a counter anion and has the same meaning as $Za^-$ in formula (a).

As the specific examples of the dyes represented by formula (c) that can be preferably used in the invention, the following compounds can be exemplified.

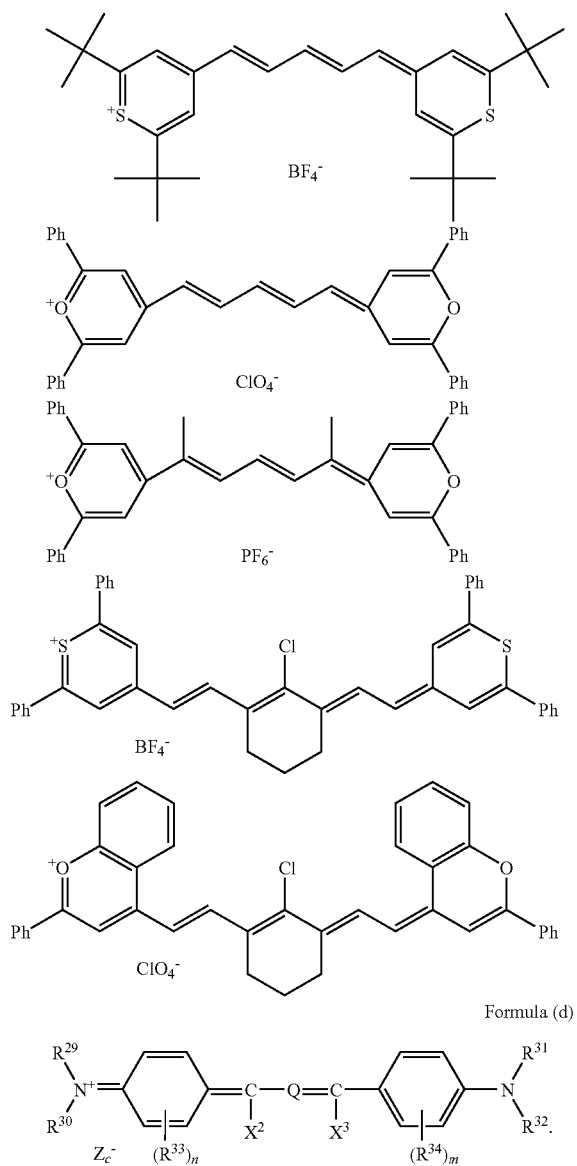

Formula (d)

In formula (d), $R^{29}$ to $R^{32}$ each represents a hydrogen atom, an alkyl group, or an aryl group; $R^{33}$ and $R^{34}$ each represents an alkyl group, a substituted oxy group, or a halogen atom; n and m each represents an integer of from 0 to 4; $R^{29}$ and $R^{30}$, or $R^{31}$ and $R^{32}$ may be bonded to each other to form a ring, $R^{29}$ and/or $R^{30}$ may be bonded to $R^{33}$ to form a ring, and $R^{31}$ and/or $R3^2$ may be bonded to $R^{34}$ to form a ring, when there are a plurality of $R^{33}$ and $R^{34}$, a plurality of $R^{33}$'s and a plurality of $R^{34}$'s may be bonded to each other to form a ring respectively. $X^2$ and $X^3$ each represents a hydrogen atom, an alkyl group, or an aryl group, and at least one of $X^2$ and $X^3$ represents a hydrogen atom or an alkyl group; Q represents a trimethine group or a pentamethine group that may have a substituent, and Q may form a cyclic structure with a divalent organic group. $Zc^-$ represents a counter anion and has the same meaning as $Za^-$ in formula (a).

As the specific examples of the dyes represented by formula (d) that can be preferably used in the invention, the following compounds can be exemplified.

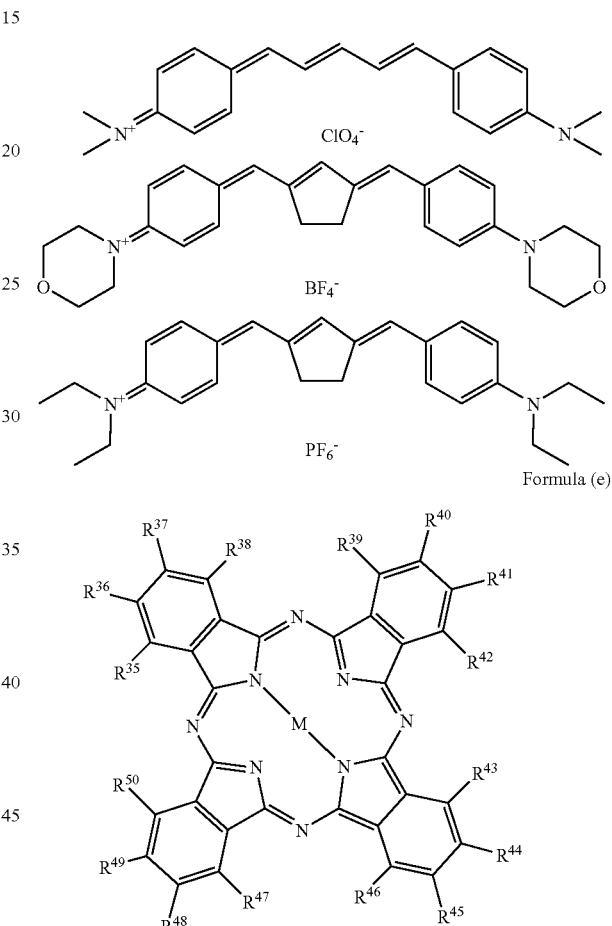

Formula (e)

In formula (e), $R^{35}$ to $R^{50}$ each represents a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group, or an onium salt structure, and these groups may each have a substituent, if substitution is possible. M represents two hydrogen atoms or metal atoms, a halo-metal group, or an oxy metal group, and as the metal atoms contained therein, the atoms belonging to groups IA, IIA, IIIB and IVB of the Periodic Table, the transition metals of first, second, and third periods, and a lanthanide element are exemplified, and copper, magnesium, iron, zinc, cobalt, aluminum, titanium, and vanadium are preferred.

As the specific examples of the dyes represented by formula (e) that can be preferably used in the invention, the following compounds can be exemplified.

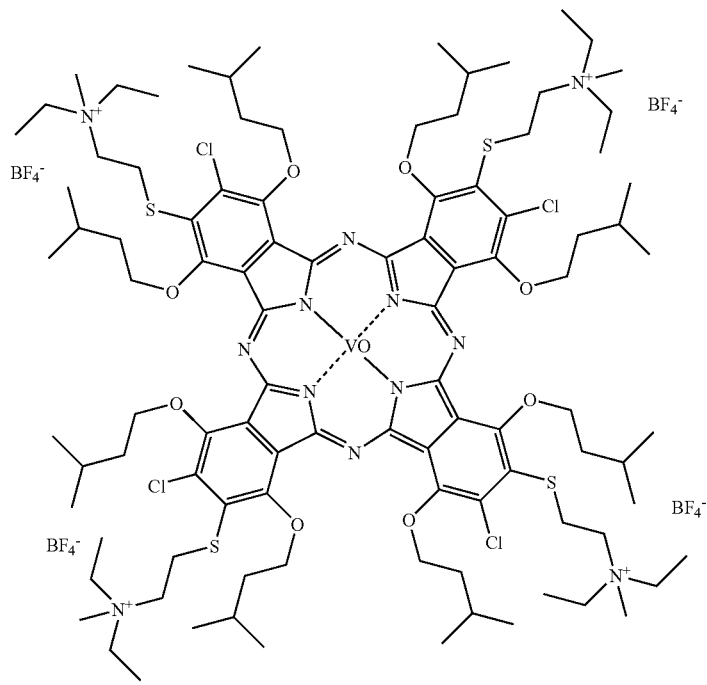
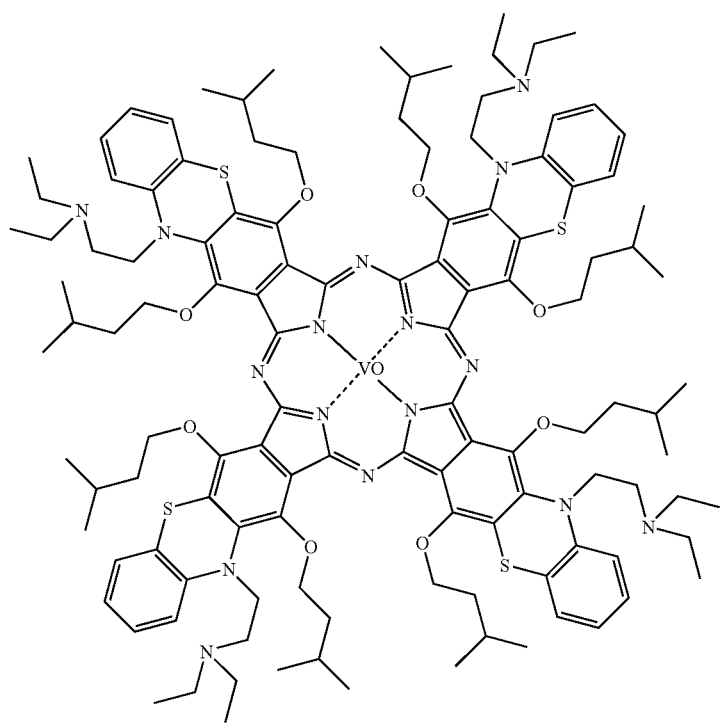

As the pigments for use in the invention, commercially available pigments and the pigments described in Color Index (C.I.) Binaan (Color Index Bulletin), Shaishin Ganryo Binran (The Latest Pigment Handbook), compiled by Nippon Ganryo Gijutsu Kyokai (1977), Shaishin. Ganryo Oyo Gijutsu (The Latest Pigment Applied Techniques), CMC Publishing Co. Ltd. (1986), and Insatsu Ink Gijutsu (Printing Ink Techniques), CMC Publishing Co. Ltd. (1984) can be used.

As the pigments for use in the invention, black pigments, yellow pigments, orange pigments, brown pigments, red pigments, purple pigments, blue pigments, green pigments, fluorescent pigments, metallic powder pigments, and polymer-bonded dyestuffs can be exemplified. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, lake pigments, azine pigments, nitroso pigments, nitro pigments, natural pigments, fluorescent pigments, inorganic pigments, and carbon blacks can be used. Of these pigments, carbon blacks are preferred.

These pigments can be used without surface treatment or may be surface-treated. As the methods of surface treatments, a method of coating the surfaces of pigments with resins and waxes, a method of adhering surfactants, and a method of bonding reactive substances (e.g., silane coupling agents, epoxy compounds, polyisocyanate, etc.) on the surfaces of pigments can be exemplified. These surface treatment methods are described in Kinzoku Sekken no Seishitsu to Oyo (Natures and Applications of Metal Soaps), Saiwai Shobo Co., Ltd., Insatsu Ink Gijutsu (Printing Ink Techniques), CMC Publishing Co., Ltd. (1984), and Shaishin Ganryo Oyo Gijutsu (The Latest Pigment Applied Techniques), CMC Publishing Co., Ltd. (1986).

The particle size of pigments is preferably in the range of from 0.01 to 10 µm, more preferably from 0.05 to 1 µm, and especially preferably from 0.1 to 1 µM. When the particle size of pigments is 0.01 µn or greater, stability of the pigment dispersion in an image photosensitive layer increases, and when 10 µm or smaller, the uniformity of an image photosensitive layer can be bettered.

Well-know dispersing techniques used in the manufacture of inks and toners can be used as the dispersing methods of pigments. The examples of dispersing apparatus include an ultrasonic wave disperser, a sand mill, an attritor, a pearl mill, a super-mill, a ball mill, an impeller, a disperser, a KD mill, a colloid mill, a dynatron, a three-roll mill, and a pressure kneader, and the details are described in Shaishin Ganryo Oyo Gijutsu (The Latest Pigment Application Techniques), CMC Publishing Co., Ltd. (1986).

When a polymerizable composition of the invention is used as the photosensitive layer of a negative lithographic printing plate precursor, these infrared absorbers added to accelerate the curing of the polymerizable composition may be added to the photosensitive layer, or a different layer, e.g., an overcoat layer or an undercoat layer, may be provided for the addition of infrared absorbers. Further, in particular, when the polymerizable composition of the invention is applied to the photosensitive layer of a negative photosensitive lithographic printing plate precursor, from the viewpoint of sensitivity, these infrared absorbers are added so that the optical density of the photosensitive layer at absorption maximum in wavelength range of from 760 to 1,200 nm becomes preferably between 0.1 and 3.0. Since optical density is determined by the addition amount of infrared absorbers and the thickness of the photosensitive layer, a prescribed optical density can be obtained by the control of both conditions.

The optical density of a photosensitive layer can be measured according to ordinary methods. As measuring methods, a method of forming, on a transparent or white support, a photosensitive layer having a dry coating weight necessary as a lithographic printing plate determined in an arbitrary range, and measuring the optical density with a transmission type optical densitometer, and a method of forming a photosensitive layer on a reflective support such as aluminum, and measuring the reflection density are exemplified.

Other Components:

Besides the above components, a co-sensitizer, a polymerization inhibitor, a colorant, a plasticizer, and other components suitable for the use and the manufacturing method can be arbitrarily added to a polymerizable composition of the invention. Preferred additives for use in a case where a polymerizable composition of the invention is applied in particular to the recording layer of a negative image-recording material are exemplified below.

Co-sensitizer:

The sensitivity of a photosensitive layer can be bettered by the addition of a co-sensitizer to the photopolymerizable photosensitive layer. The mechanism of the function is not clear, but it is supposed to be based on the following chemical processes. That is, it is presumed that various intermediate active seeds (radicals, peroxides, oxidants, reductants, and the like) generated in the processes of the photo-reaction initiated by the light absorption of the photopolymerization initiator (system) and succeeding addition polymerization reaction are reacted with a co-sensitizer to thereby generate new active radicals. These compounds are roughly classified to (a) compounds capable of generating active radicals on reduction, (b) compounds capable of generating active radicals on oxidation, and (c) compounds that react with radicals low in activity and convert them to higher radicals, or function as chain transfer agents. However, there are many cases where common opinion is not established concerning to which group individual compound belongs.

(a) Compound Generating Active Radicals on Reduction:

Compounds having a carbon-halogen bond: It is thought that a carbon-halogen bond is cleaved on reduction to generate active radicals. Specifically, e.g., trihalomethyl-s-triazines, trihalomethyl oxadiazoles and the like can be preferably used.

Compounds having a nitrogen-nitrogen bond: It is thought that a nitrogen-nitrogen bond is cleaved on reduction to generate active radicals. Specifically, e.g., hexaarylbiimidazole and the like can be preferably used.

Compounds having an oxygen-oxygen bond: It is thought that an oxygen-oxygen bond is cleaved on reduction to generate active radicals. Specifically, e.g., organic peroxides and the like can be preferably used.

Onium compounds: It is thought that a carbon-hetero bond and an oxygen-nitrogen bond are cleaved on reduction to generate active radicals. Specifically, e.g., diaryl iodonium salts, triaryl sulfonium salts, N-alkoxy pyridinium (azinium) salts and the like can be preferably used. Ferrocene, iron allene complexs: These compounds can form active radicals on reduction.

(b) Compound Generating Active Radicals on Oxidation:

Alkylate complex: It is thought that a carbon-hetero bond is cleaved by oxidation to thereby generate active radicals. Specifically, e.g., triarylalkyl borates can be preferably used.

Alkylamine compounds: It is thought that a C—X bond on the carbon contiguous to nitrogen is cleaved by oxidation to thereby generate active radicals. A hydrogen atom, a carboxyl group, a trimethylsilyl group, a benzyl group, etc., are preferably exemplified as X. Specifically, ethanolamines, N-phenylglycines, N-trimethylsilylmethyl anilines, etc., are exemplified.

Sulfur-containing and tin-containing compounds: Compounds obtained by substituting the nitrogen atoms in the above amines with sulfur atoms and tin atoms can form active radicals by the similar function. It is also known that compounds having an S-S bond show sensitization by the cleavage of the S—S bond.

α-Substituted methylcarbonyl compounds: These compounds can form active radicals by the cleavage of a carbonyl-a-carbon bond by oxidation. The compounds obtained by substituting the carbonyl with oxime ether have also the similar function. Specifically, 2-alkyl-1-[4-(alkylthio)phenyl]-2-morpholino-pronone-1's, and oxime ethers obtained by reacting the above compounds with hydroxylamines and then etherifying N—OH can be exemplified.

Sulfinates: These compounds can form active radicals on reduction. Specifically, sodium arylsulfinate and the like can be exemplified.

(c) Compounds that React with Radicals and Convert them to Higher Active Radicals, or Function as Chain Transfer Agents:

Compounds having SH, PH, SiH, GeH in the molecules are used. These compounds can donate hydrogen to radical seeds low in activity to thereby generate radicals, or can generate radicals by deprotonation after oxidation. Specifically, 2-mercapto-benzimidazoles and the like can be exemplified.

Many specific examples of these co-sensitizers are disclosed, e.g., in JP-A-9-236913 as additives aiming to improve sensitivity. Some of these compounds are exemplified below, but co-sensitizers that are used in the photosensitive layer of a lithographic printing plate precursor of the invention are not restricted thereto.

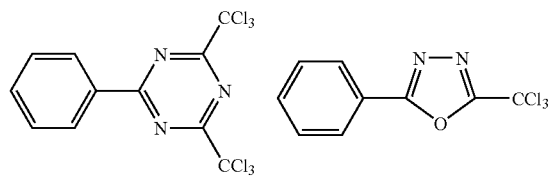

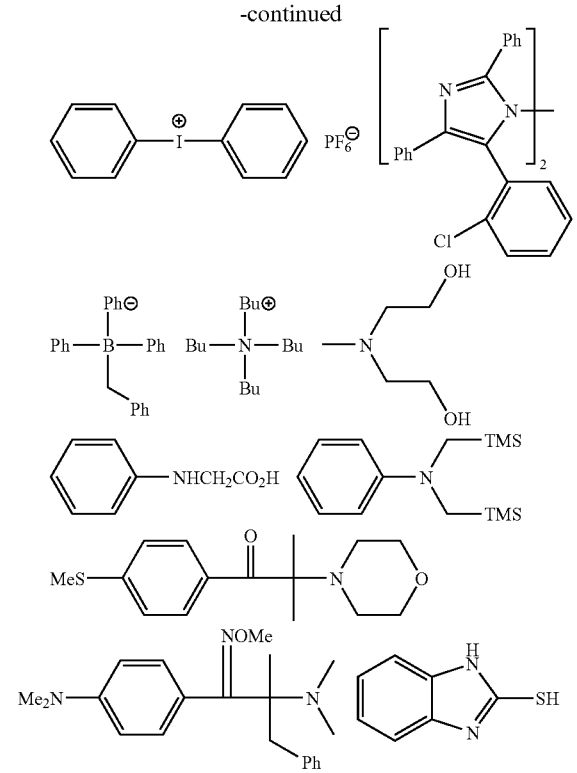

It is also possible to subject these co-sensitizers to various chemical modifications in order to improve the characteristics of a photosensitive layer. For example, the methods of bonding with sensitizing dyestuffs and titanocene, addition polymerizable unsaturated compounds and other radical-generating parts, introduction of hydrophilic sites, improvement of compatibility, introduction of substituents for restraining crystal precipitation, introduction of substituents to improve adhesion, and polymerization can be utilized.

These co-sensitizers can be used alone or two or more in combination. The use amount is from 0.05 to 100 mass parts per 100 mass parts of the compound having an ethylenic unsaturated double bond, preferably from 1 to 80 mass parts, and more preferably from 3 to 50 mass parts.

Polymerization Inhibitor:

In the photo- or thermal polymerizable negative photosensitive layer of a lithographic printing plate precursor using a polymerizable composition of the invention, it is preferred to contain a small amount of thermal polymerization inhibitor in order to inhibit unnecessary thermal polymerization of the compound having a polymerizable ethylenic unsaturated double bond during the manufacture or preservation of the negative photosensitive composition. As the proper thermal polymerization inhibitors, hydroquinone, p-methoxyphenol, di-t-butyl-p-cresol, pyrogallol, t-butyl-catechol, benzoquinone, 4,4'-thiobis(3-methyl-6-t-butyl-phenol), 2,2'-methylenebis(4-methyl-6-t-butylphenol), and N-nitrosophenylhydroxylamine primary cerium salt can be exemplified. The addition amount of thermal polymerization inhibitors is preferably from about 0.01 to about 5 mass % based on the mass of the non-volatile components in the entire composition. Further, if necessary, higher fatty acid derivatives, such as behenic acid and behenic acid amide, may be added and localize on the surface of the photosensitive layer during the drying process after coating in order to inhibit polymerization hindrance due to oxygen. The addition amount of the higher fatty acid derivatives is preferably from about 0.5 mass % to about 10 mass % to the non-volatile components in the entire composition.

Colorant:

Further, when a polymerizable composition of the invention is applied to the photosensitive layer of a lithographic printing plate precursor, a dye or a pigment may be added to the composition for the purpose of coloration. The so-called plate-inspection properties as a printing plate, e.g., the visibility after making a printing plate, and the aptitude to an image densitometer can be improved by the addition of colorants. Since many of dyes cause the reduction of sensitivity of a photopolymerizable photosensitive layer, the use of pigments is particularly preferred as the colorants. The specific examples of the colorants include pigments, e.g., phthalocyanine pigments, azo pigments, carbon black, titanium oxide, etc., and dyes, e.g., Ethyl Violet, Crystal Violet, azo dyes, anthraquinone dyes, cyanine dyes, etc. The addition amount of dyes and pigments is preferably from about 0.5 to about 5 mass % to the non-volatile components in the entire composition.

Other Additives:

Well-known additives such as inorganic fillers for improving the physical properties of a cured film, plasticizers, and, when a polymerizable composition of the invention is applied to the photosensitive layer of a lithographic printing plate precursor, sensitizing agents capable of improving the ink adhering property of the photosensitive layer surface may further be added to the photosensitive composition.

As plasticizers, e.g., dioctyl phthalate, didodecyl phthalate, triethylene glycol dicaprylate, dimethyl glycol phthalate, tricresyl phosphate, dioctyl adipate, dibutyl sebacate, glycerol triacetate are exemplified, and plasticizers can be used generally in the range of 10 mass % or less to the total mass of the binder polymer and the addition polymerizable compound.

In addition, a UV initiator and a thermal crosslinking agent can also be added to the polymerizable composition for reinforcing the effect of heating and exposure after development for the purpose of improving the film strength (elongation of press life) described later. Lithographic printing plate precursor:

A lithographic printing plate precursor in the invention comprises a support having thereon a photosensitive layer containing at least a saccharide selected from the group consisting of an oligosaccharide and a polysaccharide, a binder polymer, a compound having an addition polymerizable ethylenic unsaturated bond, and a polymerization initiator, and according to necessary, other components; or comprises a support having thereon an undercoat layer comprising at least a saccharide selected from the group consisting of an oligosaccharide and a polysaccharide, and thereon a photosensitive layer containing a binder polymer, a compound having an addition polymerizable ethylenic unsaturated bond, and a polymerization initiator, and according to necessary, other components. A lithographic printing plate precursor in the invention may further have other layers, e.g., an intermediate layer, a protective layer and the like, if necessary.

Photosensitive Layer:

The photosensitive layer in a lithographic printing plate precursor in the invention contains the above-described constitutional components of the photosensitive layer.

The photosensitive layer is formed by dissolving the constitutional components of the photosensitive layer in various organic solvents, and coating the resulting coating solution on the later-described support or the above-described undercoat layer.

The examples of the solvents used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, etc. These solvents may be used alone or may be used as mixed solvents. The appropriate concentration of the solid scontent in the coating solution is from 2 to 50 mass %.

The coating amount of the photosensitive layer primarily influences the sensitivity of the photosensitive layer, a developing property, the strength of the exposed film and press life, therefore, it is preferred to arbitrarily select the coating amount according to the purpose. Too small a coating amount results in insufficient press life. While when the amount is too large, sensitivity decreases, exposure takes long time, and longer time is required for development processing, which is not advantageous. As a lithographic printing plate precursor for scanning exposure, which is a primary object of the invention, the coating amount of the photosensitive layer is preferably from about 0.1 to about 10 $g/m^2$ in mass after drying, more preferably from 0.5 to 5 $g/m^2$.

Support:

As the support of a lithographic printing plate precursor of the invention, conventionally well-known hydrophilic supports widely used in lithographic printing plate precursors can be used without restriction.

Supports for use in the invention are preferably plate-like supports having dimensional stability. For example, paper, paper laminated with plastics (e.g., polyethylene, polypropylene, polystyrene, etc.), metals plate (e.g., aluminum, zinc, copper, etc.), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or plastic films laminated or deposited with the above metals can be exemplified. The surfaces of these supports may be physically or chemically treated by well-known methods for the purpose of providing hydrophilicity or improvement of strength, if necessary.

As particularly preferred supports, paper, polyester films and aluminum plates are exemplified, and aluminum plates, which are dimensionally stable, comparatively inexpensive, and capable of providing a highly hydrophilic and strong surface by surface treatment according to necessity, are further preferably used. A composite sheet comprising a polyethylene terephthalate film having bonded thereon an aluminum sheet as disclosed in JP-B48-18327 is also preferred.

Aluminum plates are metal plates comprising dimensionally stable aluminum as a main component, and aluminum plates are selected from, besides a pure aluminum plate, alloy plates comprising aluminum as a main component and containing a trace amount of different elements, and plastic films or paper laminated or deposited with aluminum (alloy). In the following explanation, the supports comprising the above exemplified aluminum or aluminum alloys are generally called aluminum supports. The examples of different elements contained in the aluminum alloys include silicon, iron, manganese, copper, magnesium, chromium, zinc, bismuth, nickel, titanium, etc. The content of the different element in aluminum alloys is 10 mass % or less. In the invention, a pure aluminum plate is preferred but 100% pure aluminum is difficult to manufacture from the refining technique, so that an extremely small amount of different elements may be contained. Thus, the compositions of aluminum plates used in the invention are not specified, and aluminum plates of conventionally well-known and commonly used materials, e.g., JIS A 1050, JIS A 1100, JIS A 3103 and JIS A 3005, can be optionally used.

Aluminum supports for use in the invention have a thickness of from about 0.1 to about 0.6 mm. The thickness can be arbitrarily changed according to the size of a printing press, the size of a printing plate and the desire of a user. Aluminum supports may be subjected to surface treatment as described later, if necessary, or of course may not be subjected to.

Surface Roughening Treatment:

Mechanical surface roughening, chemical etching, and electrolytic graining are disclosed in JP-A-56-28893 as surface roughening treatment methods. An electrochemical surface roughening method of performing surface roughening electrochemically in a hydrochloric acid or nitric acid electrolyte, and mechanical surface roughening methods, e.g., a wire brush graining method of scratching an aluminum surface with metal wire, a ball graining method of graining an aluminum surface with abrading balls and an abrasive, and a brush graining method of graining an aluminum surface with a nylon brush and an abrasive can be used. These surface roughening methods can be used alone or in combination. Of these methods, a useful surface roughening method is the electrochemical surface roughening method of performing surface roughening electrochemically in a hydrochloric acid or nitric acid electrolyte. A preferred quantity of anode electricity is from 50 to 400 C/dm$^2$. Further specifically, it is preferred to perform electrolysis in an electrolyte containing from 0.1 to 50% of a hydrochloric acid or a nitric acid by direct current and/or alternating current on conditions of from 20 to 80° C. for 1 second to 30 minutes and electric current density of from 100 to 400 C/dm$^2$.

The aluminum support subjected to surface roughening treatment in this manner may be then subjected to chemical etching with an acid or an alkali. Etchants preferably used in the invention are sodium hydroxide, sodium carbonate, sodium aluminate, sodium metasilicate, sodium phosphate, potassium hydroxide, and lithium hydroxide, and the preferred ranges of concentration and temperature are from 1 to 50% and from 20 to 100° C., respectively. To remove the smut remaining on the surface of the aluminum support after etching treatment, the aluminum plate is washed with an acid. As the acids used for washing, e.g., a nitric acid, a sulfuric acid, a phosphoric acid, a chromic acid, a fluoric acid, and a borofluoric acid can be exemplified. In particular, as preferred smut-removing methods after electrochemical surface roughening treatment, the method of bringing the aluminum support into contact with a 15 to 65 mass % sulfuiic acid at 50 to 90° C. as disclosed in JP-A-53-12739, and the alkali etching method as disclosed in JP-B48-28123 are exemplified. Surface roughening methods and conditions are not especially restricted so long as the center line average surface roughness (Ra) of the treated surface after treatment is from 0.2 to 0.5 µm.

Anodizing Treatment:

It is preferred that the thus-treated aluminum support be then subjected to anodizing treatment.

In anodizing treatment, an aqueous solution of a sulfuric acid, a phosphoric acid, an oxalic acid, or a boric acid/sodium borate is used alone or in combination of two or more as a main component of an electrolytic bath. In anodizing treatment, the components at least ordinarily contained in Al alloy sheets, electrodes, city water and ground water may be of course contained in the electrolyte. Further, the second and third components may be contained. "The second and third components" herein means a metal ion of, e.g., Na, K, Mg, Li, Ca, Ti, Al, V, Cr, Mn, Fe, Co, Ni, Cu or Zn; a cation, e.g., an ammonium ion; and an anion, e.g., a nitrate ion, a carbonate ion, a chlorine ion, a phosphate ion, a fluorine ion, a sulfite ion, a titanate ion, a silicate ion or a borate ion, and these ions can be contained in concentration of 0 to 10,000 ppm or so. The conditions of anodizing treatment are not especially restricted, but preferably the treating amount is from 30 to 500 g/liter, the temperature of the treating solution is from 10 to 70° C., the electric current density is from 0.1 to 40 A/dm$^2$, and the treatment is performed by direct current or alternating current electrolysis. The thickness of the anodic oxide film formed is from 0.5 to 1.5 µm, preferably from 0.5 to 1.0 µm. It is preferred that the treatment conditions should be selected so that the pore diameter of the micro pores on the anodic oxide film of the support formed by the above surface treatment is from 5 to 10 nm, and the pore density reaches the range of from $8 \times 10^{15}$ to $2 \times 10^{16}/m^2$.

As the hydrophilization treatment of the surface of a support, well-known methods can be used. Especially preferred treatment is hydrophilization treatment with silicate or polyvinylphosphonic acid. The amount of film formed is from 2 to 40 mg/m$^2$, preferably from 4 to 30 mg/m$^2$, as Si or P element. The coating amount can be measured according to a fluorescent X-ray analyzing method.

The hydrophilization treatment is carried out by immersing the aluminum support having formed thereon an anodic oxide film in an aqueous solution of alkali metal silicate or polyvinylphosphonic acid in concentration of from 1 to 30 mass %, preferably from 2 to 15 mass %, and pH at 25° C. of from 10 to 13, at 15 to 80° C. for 0.5 to 120 seconds.

As the alkali metal silicate used in hydrophilization treatment, sodium silicate, potassium silicate and lithium silicate are used. In the hydrophilization treatment, a hydroxide, e.g., a sodium hydroxide, a potassium hydroxide or a lithium hydroxide is added to the alkali metal silicate aqueous solution to increase the pH of the solution. Further, alkaline earth metal salts or metal salts belonging to IVb group may be added to the treating solution. As the alkaline earth metal salts, nitrate, e.g., calcium nitrate, strontium nitrate, magnesium nitrate, and barium nitrate, and water-soluble salts, e.g., sulfate, hydrochloride, phosphate, acetate, oxalate and borate are exemplified. As metal salts belonging to IVb group, titanium tetrachloride, titanium trichloride, potassium titanium fluoride, potassium titanium oxalate, titanium sulfate, titanium tetraiodide, zirconium chloride oxide, zirconium dioxide, zirconium oxychloride, and zirconium tetrachloride are exemplified.

Alkaline earth metal salts and metal salts belonging to IVb group can be used alone or in combination of two or more. These metal salts are preferably used in an amount of from 0.01 to 10 mass %, and more preferably from 0.05 to 5.0 mass %.

Silicate electrodeposition as disclosed in U.S. Pat. No. 3,658,662 is also effective. Surface treatments of combining the supports subjected to electrolytic graining as disclosed in JP-B46-27481, JP-A-52-58602 and JP-A-52-30503, and the above anodizing treatment and hydrophilization treatment are also useful.

Intermediate Layer:

In the lithographic printing plate precursor, an intermediate layer may be provided for the purpose of improving the adhesion of a photosensitive layer and a support, or an undercoat layer and a photosensitive layer, and soiling resistance. As the specific examples of such intermediate layers, the intermediate layers disclosed in the following patents can be exemplified: JP-B-50-7481, JP-A-51-71123, JP-A-54-72104, JP-A-59-101651, JP-A-60-149491, JP-A-60-232998, JP-A-2-304441, JP-A-3-56177, JP-A-4-282637, JP-A-5-16558, JP-A-5-246171, JP-A-5-341532, JP-A-7-159983, JP-A-7-314937, JP-A-8-202025, JP-A-8-320551, JP-A-9-34104, JP-A-9-236911, JP-A-9-269593, JP-A-10-69092, JP-A-10-115931, JP-A-10-161317, JP-A-10-260536, JP-A-10-282679, JP-A-10-282682, JP-A-11-84674, JP-A-10-69092, JP-A-10-115931, JP-A-11-38635, JP-A-11-38629, JP-A-10-282645, JP-A-10-301262, JP-A-11-24277, JP-A-11-109641, JP-A-10-319600, JP-A-11-84674, JP-A-11-327152, JP-A-2000-10292, Japanese Patent Application Nos. 11-36377, 11-165861, 11-284091 and 2000-14697.

Protective Layer:

Since a lithographic printing plate precursor having a photo- or thermal polymerizable negative photosensitive layer as in the invention is generally subjected to exposure in the air, it is preferred to further provide a protective layer (also referred to as an overcoat layer) on the photosensitive layer. The protective layer prevents low molecular weight compounds such as oxygen and basic substance in the air that hinder the image forming reaction generated in the photosensitive layer by exposure from entering into the photosensitive layer, and makes it possible to perform exposure in the air. Accordingly, the characteristics required of the protective layer are to be low in permeability of low molecular weight compounds such as oxygen, not to substantially hinder the transmission of light used for exposure, to be excellent in adhesion with a photosensitive layer, and to be capable of being removed easily in the development process after exposure. Such contrivances concerning the protective layer have so far been tried and disclosed in detail in U.S. Pat. No. 3,458,311 and JP-B-55-49729.

As the materials that can be used for the protective layer, water-soluble polymer compounds relatively excellent in crystallitability are preferably used, specifically, water-soluble polymers, such as polyvinyl alcohol, polyvinyl pyrrolidone, acid celluloses, gelatin, gum arabic, and polyacrylic acid are known. Of these polymers, when polyvinyl alcohol is used as a main component, the best results can be obtained in fundamental characteristics such as exclusion of oxygen and removal of the protective layer by development. Polyvinyl alcohols for use in the protective layer may be partially substituted with ester, ether or acetal, or may partially have other copolymerizable components so long as they contain an unsubstituted vinyl alcohol unit for imparting necessary oxygen-shielding property and solubility in water. As the specific examples of polyvinyl alcohols, those having a hydrolyzing rate of 71 to 100% and a molecular weight of from 300 to 2,400 can be exemplified.

Specifically, the examples of polyvinyl alcohols include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA405, PVA420, PVA-613, and L-8 (manufactured by Kuraray Co., Ltd.).

The components of the protective layer (the selection of PVA and the use of additives) and the coating amount are selected by considering fogging characteristic, adhesion and scratch resistance besides the oxygen-shielding property and the removal by development. In general, the higher the hydrolyzing-rate of the PVA used (the higher the unsubstituted vinyl alcohol unit content in the protective layer) and the higher the layer thickness, the higher is the oxygen-shielding property, thus advantageous in the point of sensitivity. Too high an oxygen-shielding property, however, results in the generation of unnecessary polymerization reaction during manufacture and raw preservation, or the generation of unnecessary fog and thickening of image lines at image exposure. The adhesion of the protective layer with an image area and scratch resistance are also extremely important in treating a printing plate, i.e., when a hydrophilic layer comprising water-soluble polymers is laminated on a lipophilic photosensitive layer, layer peeling due to insufficient adhesion is liable to occur, and the peeled part causes such a defect as film curing failure due to polymerization hindrance by oxygen. Various countermeasures have been proposed for improving the adhesion of the two layers. For example, it is disclosed in U.S. patent application Ser. Nos. 292,501 and 44,563 that a sufficient adhesion property can be obtained by the mixture of from 20 to 60 mass % of an acryl-based emulsion or a water-insoluble vinyl pyrrolidone/vinyl acetate copolymer with a hydrophilic polymer mainly comprising polyvinyl alcohol and lamination of the resulting product on a photosensitive layer.

Any of these well-known techniques can be applied to the protective layer in the invention. The coating methods of these protective layers are disclosed in detail, e.g., in U.S. Pat. No. 3,458,311 and JP-B-55-49729.

For making a lithographic printing plate, at least processes of exposure and development are performed.

As the exposure light sources of a negative lithographic printing plate precursor of the invention, well known light sources can be used without restriction.

Exposure mechanism may be any of an internal drum system, an external drum system or a flat bed system.

As other exposure rays for the lithographic printing plate precursor in the invention, a mercury lamp, a chemical lamp, a carbon arc lamp, a xenon lamp, a metal halide lamp of ultra-high pressure, high pressure, intermediate pressure and low pressure, and various visible and ultraviolet laser lamps, a fluorescent lamp, a tungsten lamp and sunlight can be used.

The lithographic printing plate precursor in the invention is development processed after exposure. In the development, a distilled water, an alkali aqueous solution having pH of 14 or less, or water washing water, a rinsing solution containing a surfactant, and a desensitizing solution containing gum arabic and a starch derivative disclosed in JP-A-54-8002, JP-A-55-115045 and JP-A-59-58431 can be used.

An alkali aqueous solution having pH of 14 or lower is especially preferred as the developing solution, and more preferably an alkali aqueous solution containing an anionic surfactant having pH of from 8 to 12 is used. As the examples of alkali agents, inorganic alkali agents, e.g., sodium tertiary phosphate, potassium tertiary phosphate, ammnonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide are exemplified. In addition, organic alkali agents, e.g., monomethylamine, dimethylamine, trimethylamine, monoethylainine, diethylamine, triethylainine, monoisopropylamine, diisopropylamine, triisopropylamine, n-butylamine, monoethanolamine, diethanolamine, triethanolamine, monoisopropanolamine, diisopropanolamine, ethylene-imine, ethylenediamine and pyridine are also used. These alkali agents are used alone or two or more in combination.

Further, in the development processing of a lithographic printing plate precursor of the invention, from 1 to 20 mass %, more preferably from 3 to 10 mass %, of an anionic surfactant is used is added to a developing solution. Too small an amount of anionic surfactant results in the lowering of a developing property, and too large an amount is accompanied with evils, e.g., the deterioration of the strength, such as abrasion resistance of an image. The examples of anionic surfactants include sodium lauryl alcohol sulfate, ammonium lauryl alcohol sulfate, sodium octyl alcohol sulfate, alkylaryl sulfonates, e.g., sodium isopropylnaphthalene sulfonate, sodium isobutyl-naphthalene sulfonate, sodium polyoxyethylene glycol mononaphthyl ether sulfate, sodium dodecylbenzene sulfonate, and sodium metanitrobenzene sulfonate, higher alcohol sulfates having from 8 to 22 carbon atoms, e.g., secondary sodium alkylsulfate, aliphatic alcohol phosphates, e.g., sodium cetyl alcohol phosphate, sulfonates of alkyl amide, e g., $C_{17}H_{33}CON(CH_3)CH_2CH_2SO_3Na$, and sulfonates of dibasic aliphatic ester, e.g., sodium dioctyl sulfosuccinate, and sodium dihexyl sulfosuccinate.

If necessary, an organic solvent mixable with water, e.g., benzyl alcohol, may be added to a developing solution. As the organic solvents, those having solubility in water of 10 mass % or lower, and preferably 5 mass % or lower, are preferably used. For example, 1-phenylethanol, 2-phenylethanol, 3-phenyl-propanol, 1,4-phenylbutanol, 2,2-phenylbutanol, 1,2-phenoxy-ethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclo-hexanol, and 3-methyl-cyclohexanol are exemplified. The content of organic solvents is preferably from 1 to 5 mass % to the total amount of the developing solution in use. Since the use amount of an organic solvent is closely related with the amount of a surfactant, it is preferred to increase the amount of an anionic surfactant as the amount of an organic solvent is increased. The reason for this is that if the amount of an organic solvent is increased while the amount of an anionic surfactant is small, the organic solvent is not dissolved, accordingly a good developing property cannot be ensured.

Further, if necessary, additives, e.g., a defoaming agent and a water softener, can also be added to a developing solution. As the examples of water softeners, polyphosphate, e.g., $Na_2P_2O_7$, $Na_5P_3O_3$, $Na_3P_3O_9$, $Na_2O_4P(NaO_3P)PO_3Na_2$, and Calgon (sodium polymetaphosphate), aminopolycarboxylic acids (e.g., ethylenediaminetetraacetic acid, potassium salts thereof, and sodium salts thereof; diethylenetriaminetetraacetic acid, potassium salts thereof, and sodium salts thereof, triethylenetetraminehexaacetic acid, potassium salts thereof, and sodium salts thereof, hydroxyethylethylenediamine-triacetic acid, potassium salts thereof, and sodium salts thereof, nitrilotriacetic acid, potassium salts thereof, and sodium salts thereof, 1,2-diaminocyclohexanetetraacetic acid, potassium salts thereof, and sodium salts thereof, 1,3-diamino-2-propanoltetraacetic acid, potassium salts thereof, and sodium salts thereof), other polycarboxylic acids (e.g., 2-phosphonobutanetricarboxylic acid-1,2,4, potassium salts thereof, and sodium salts thereof, 2-phosphonobutanone-tricarboxylic acid-2,3,4, potassium salts thereof, and sodium salts thereof), organic phosphonic acids (e.g., 1-phosphonoethanetricarboxylic acid-1,2,2, potassium salts thereof, and sodium salts thereof, 1-hydroxyethane-1,1-diphosphonic acid, potassium salts thereof, and sodium salts thereof, and aminotri(methylenephosphonic acid), potassium salts thereof, and sodium salts thereof) are exemplified. Although the optimal amount of these water softeners varies according to the hardness and the amount of the hard water to be used, the amount is generally from 0.01 to 5 mass % in the developing solution in use, and preferably from 0.01 to 0.5 mass %.

In addition, in the present invention, mild development process with solutions having pH of from 4 to less than 10 can be applied. Such developing solutions can be prepared by, for example, diluting a mixture solution of starch phosphate, gum arabic, dioctyl sulfosuccinate, benzyl alcohol, phosphoric acid and citric acid having an optional ratio with water so as to adjust pH to from 4 to less than 10.

Further, when a lithographic printing plate precursor is subjected to development with an automatic developer, since the developing solution becomes fatigued with the increase of the processing amount, a replenisher or a fresh developing solution may be supplied to restore the processing ability. In this case, it is preferred to perform replenishment by the method as disclosed in U.S. Pat. No. 4,882,246. Further, the developing solutions as disclosed in JP-A-50-26601, JP-A-58-54341, JP-B-56-39464, JP-B-56-42860 and JP-B-57-7427 are also preferred.

The thus-development processed lithographic printing plate precursor may be subjected to post-processes with water washing water, a rinsing solution containing a surfactant, and a desensitizing solution containing gum arabic and a starch derivative as disclosed in JP-A-54-8002, JP-A-55-115045 and JP-A-59-58431. In the post processing of the lithographic printing plate precursor of the invention, these processes may be combined variously.

As the plate-making process of a lithographic printing plate precursor in the invention, the entire surface may be heated, if necessary, before exposure, during exposure, and during the time from exposure to development. This heating accelerates the image forming reaction in the photosensitive layer, as a result the improvement of sensitivity and press life, and the stabilization of sensitivity can be ensured. Further, in order to improve image strength and press life, it is effective that the image after development is subjected to whole image post heating or whole image exposure.

In general, it is preferred that heating before development is performed on a moderate condition of 150° C. or less to avoid the generation of undesired curing reaction. A very severe condition can be used in heating after development. From the points of the strengthening function of the image and the generation of thermal decomposition of the image area, heating after development is generally performed in the range of from 200 to 500° C.

A lithographic printing plate obtained by these processes is mounted on an offset printer and used in printing of a plenty of sheets.

The soiling on a lithographic printing plate used in printing can be removed with a plate cleaner. As the plate cleaner used in printing for removing soiling on a plate, conventionally well-known PS plate cleaners are used and, e.g., CL-1, CL-2, CP, CN-4, CN, CG-1, PC-1, SR and IC (manufactured by Fuji Photo Film Co., Ltd.) are exemplified.

EXAMPLE

The invention will be described with reference to examples, but the invention is not limited thereto.

Examples 1 to 15, Comparative Examples 1 to 3

Negative lithographic printing plate precursors of Examples 1 to 15 and Comparative Examples 1 to 3 as shown in Table 1 below were manufactured according to the following procedure, and printing performance was evaluated. The results obtained are shown in Table 1.

Manufacture of Support:

JIS A 1050 aluminum plate having a thickness of 0.24 mm and a width of 1,030 mm was subjected to continuous treatment as follows.

(a) With an existing surface roughening machine, mechanical surface roughening treatment of the aluminum plate was performed by supplying an abrasive slurry of a suspension comprising water and an abrasive (pumice) having a specific gravity of 1.12 on the surface of the aluminum plate with a rotating roller-like nylon brush. The average particle size of the abrasive was from 40 to 45 µm, and the maximum particle size was 200 µm. The material of the nylon brush was 6,10 nylon, the hair length was 50 mm, and the hair diameter was 0.3 mm. A stainless steel barrel having a diameter of ϕ300 mm was perforated and nylon hair was planted densely to prepare a nylon brush. Three rotary brushes were used. The distance between two supporting rollers (ϕ200 mm) at the lower part of each brush was 300 mm. The brush rollers were pressed against the aluminum plate until the load of the driving motor rotating the brushes came to the value of the load before pressing the brush rollers against the aluminum plate plus 7 kW. The direction of rotation of brushes was the same with the moving direction of the aluminum plate. The rotation number of the brushes was 200 rpm.

(b) The above aluminum plate subjected to mechanical surface roughening treatment was subjected to spray etching treatment with sodium hydroxide in concentration of 2.6 mass %, an aluminum ion in concentration of 6.5 mass %, at 70° C., whereby 6 g/m$^2$ of the aluminum plate was dissolved. The plate was then washed with water by spraying.

(c) The aluminum plate was subjected to spray desmutting treatment with an aqueous solution containing a nitric acid in concentration of 1 mass % (containing 0.5 mass % of an aluminum ion) at 30° C., and then the plate was washed with water by spraying. The aqueous solution of nitric acid used in the desmutting treatment was the waste solution in the process of electrochemical surface roughening treatment by alternating current in the nitric acid aqueous solution.

(d) Electrochemical surface roughening treatment was carried out continuously by alternating voltage of 60 Hz. The electrolyte at this time was an aqueous solution containing 1 mass % of a nitric acid (containing 0.5 mass % of an aluminum ion and 0.007 mass % of an ammonium ion), and the temperature was 40° C. As the alternating current electric source, trapezoidal rectangular waveform alternating current was used, the time TP required for the electric current value to reach the peak from 0 was 2 msec, the duty ratio was 1/1, and electrochemical surface roughening treatment was carried out with a carbon electrode as the counter electrode. Ferrite was used as the auxiliary anode. The electric current density was 30 A/dm$^2$ at the peak value of electric current, and the quantity of electricity was 255 C/dm$^2$ in the sum total of quantity of electricity in the case where the aluminum plate was the anode. Five percent of the electric current from the electric source was diverted to the auxiliary anode. The aluminum plate was then washed with water by spraying.

(e) The aluminum plate was subjected to etching treatment by spraying with an aqueous solution comprising a sodium hydroxide in concentration of 26 mass % and an aluminum ion in concentration of 6.5 mass % at 32° C., whereby 0.2 g/m$^2$ of the aluminum plate was dissolved. A smut component mainly comprising an aluminum hydroxide which was formed when the electrochemical surface roughening treatment was performed by alternating voltage in the prior stage was removed, and also the edge parts of the pits formed were dissolved to smooth the edge parts, and then the aluminum plate was washed with water by spraying.

(f) Desmutting treatment by spraying was performed with an aqueous solution containing a nitric acid in concentration of 25 mass % (containing 0.5 mass % of an aluminum ion) at 60° C., and then the aluminum plate was washed with water by spraying.

(g) Anodizing treatment was performed with an anodizing apparatus of an existing two stage feeding electrolytic treatment system (lengths of the first and second electrolysis parts, each 6 m, length of the first feeding part: 3 m, length of the second feeding part: 3m, lengths of the first and second feeding electrodes: each 2.4 m), and the concentration of sulfuric acid of electrolysis parts of 170 g/liter (containing 0.5 mass % of an aluminum ion) at 38° C. The plate was then washed with water by spraying. In the anodizing apparatus at this time, the electric current from the electric source flows to the first feeding electrode installed at the first feeding part, flows to a plate-like aluminum through the electrolyte to form an oxide film on the surface of the plate-like aluminum at the first electrolysis part, and returns to the electric source through the electrolytic electrode installed at the first feeding part. On the other hand, the electric current from the electric source flows to the second feeding electrode installed at the second feeding part, similarly flows to the plate-like aluminum through the electrolyte to form an oxide film on the surface of the plate-like aluminum at the second electrolysis part. The quantity of electricity fed from the electric source to the first feeding part and the quantity of electricity fed from the electric source to the second feeding part are equal, and the density of feeding electric current on the oxide film at the second feeding part was about 25 A/dm$^2$. The second feeding part was to feed electricity from the oxide film of 1.35 g/m$^2$. The final oxide film amount was 2.7 g/m$^2$. The aluminum support to this stage is taken as "AS-1".

Hydrophilization Treatment:

Aluminum support "AS-1" was subjected to silicate treatment in order to heighten the hydrophilic property as the non-image area of printing plate. In the treatment, a 1.5% aqueous solution of disodium trisilicate was maintained at 70° C., and fed so that the contact time with the aluminum web was 15 seconds, and then the plate was washed with water. The adhered amount of Si was 10 mg/m$^2$. This support was taken as "AS-2".

Coating of Intermediate Layer:

A liquid composition (a sol liquid) of an SG system was prepared according to the following procedure. The following composition was weighed and put in a beaker and stirred at 25° C. for 20 minutes.

| | |
|---|---|
| Tetraethoxysilane | 38 g |
| 3-Methacryloxypropyltrimethoxysilane | 13 g |
| A 38% phosphoric acid aqueous solution | 12 g |
| Ion exchange water | 15 g |
| Methanol | 100 g |

The solution was moved to a three-neck flask, and the three-neck flask equipped with a reflux condenser was immersed in an oil bath at room temperature. The temperature was raised to 50° C. in 30 minutes while stirring the content of the three-neck flask with a magnetic stirrer. The reaction was continued for further one hour with maintaining the temperature of the bath at 50° C. to obtain a liquid composition (a sol liquid). The sol liquid was diluted to reach 0.5 mass % with 20/1 (by mass) of methanol/ethylene glycol, and the obtained solution was coated on the above aluminum substrate (AS-1) by wheeler coating, dried at 100° C. for 1 minute. The coating amount at that time was 3.5 mg/m$^2$. The amount of Si element was found as the coating amount by fluorescence X-ray analysis. The thus-manufactured support was taken as "AS-3".

Coating of Photosensitive Layer:

A coating solution of a photosensitive layer having the composition shown below was coated on support "AS-1" in a dry coating amount of from 1.0 to 1.2 g/m$^2$, and dried at 100° C. for 1 minute to thereby form a photosensitive layer.

| Photosensitive layer coating solution: | |
|---|---|
| Oligosaccharide or polysaccharide (a compound shown in Table 1) | 1.5 g |
| Addition polymerizable compound (a compound shown in Table 1) | 2.0 g |
| Binder polymer (a polymer shown in Table 1) | 2.0 g |
| Sensitizing dyestuff (a compound shown in Table 1) | 0.2 g |
| Polymerization initiator (a compound shown in Table 1) | 0.45 g |
| Other additive (a compound shown in Table 1) | 0.4 g |
| Fluorine-based nonionic surfactant (Megafac F-177, manufactured by Dainippon Ink and Chemicals Inc.) | 0.03 g |
| Thermal polymerization inhibitor (N-nitrosophenylhydroxylamine aluminum salt) | 0.01 g |
| Dispersion of coloring pigment having the composition shown below | 2.0 g |
| Methyl ethyl ketone | 10.0 g |
| Propylene glycol monomethyl ether | 20.0 g |
| Methanol | 10.0 g |
| Water (distilled water) | 3.0 g |

| Composition of coloring pigment dispersion: | |
|---|---|
| Pigment Blue 15:6 | 15 mass parts |
| Allyl methacrylate/methacrylic acid copolymer (copolymerization molar ratio: 80/20, mass average molecular weight: 40,000) | 10 mass parts |
| Cyclohexanone | 15 mass parts |
| Methoxypropyl acetate | 20 mass parts |
| Propylene glycol monomethyl ether | 40 mass parts |

Coating of Protective Layer:

A 3 mass % aqueous solution of polyvinyl alcohol (saponification degree: 98 mol %, polymerization degree: 550) was coated on the obtained photosensitive layer in a dry coating amount of 2 g/m$^2$, and dried at 100° C. for 2 minutes.

Exposure and Post Hating of Lithographic Printing Plate Precursor:

The thus-obtained lithographic printing plate precursor was subjected to solid image exposure with Violet semiconductor laser setter Vx9600 (InGaN system semiconductor laser, 405 nm±10 nm, emission/output: 30 mW, manufactured by Fuji Film Electronic Imaging Ltd.) by exposure amount of 90 µJ/cm$^2$, and dot image exposure of 1 to 99% with every 1% and resolution of 2,438 dpi. The plate was then heated at 100° C. for 10 seconds in an oven.

Development/Plate-making:

After heating, an automatic developer FLP-813 (manufactured by Fuji Photo Film Co., Ltd.) was charged with the developing solution shown in Table 1 and finisher FP-2W (manufactured by Fuji Photo Film Co., Ltd.), and the lithographic printing plate precursor was subjected to development/plate-making on the condition of the developing solution temperature of 30° C. and developing time of 18 seconds, whereby a lithographic printing plate was obtained.

Test for Press Life of Image Area:

Lithrone (manufactured by Komori Corporation) was used as the printer and Graf G (N) (manufactured by Dainippon Ink and Chemicals Inc.) was used as the ink. The solid image of the printed substance was observed, and the number of the printed sheets that the image began to be blurred was taken as the press life. The bigger the number, the better is the press life.

Test for Raw Preservation Property:

Unexposed lithographic printing plate precursor was allowed to stand at 60° C. 50% RH for three days, and then used in printing with Lithrone (manufactured by Komori Corporation). At this time, how many number of sheets could be used in printing with retaining sufficient ink density was visually observed and raw preservation property was evaluated. The results obtained are shown in Table 1 below.

Test for Raw Preservation Property:

Unexposed lithographic printing plate precursor was allowed to stand at 60° C. 50% RH for three days, subsequently subjected to exposure and development, and then printing was performed with Lithrone (manufactured by Komori Corporation). At this time, soiling of the non-image area due to printing was observed and raw preservation property was evaluated. The results obtained are shown in Table 1 below.

TABLE 1

| | No. | Oligosaccharide or Polysaccharide | Binder Polymer | Polymerizable Cpd. | Polymerization Initiator | Sensitizing Dyestuff | Other Additives | Support | Developing Soln. | Press Life (number of Sheets) | Raw Preservation Property | Light Source (nm) |
|---|---|---|---|---|---|---|---|---|---|---|---|---|
| Ex. | 1 | S-1 | B-1 | M-4 | I-3 | Dye-4 | C-2 | AS-1 | D-1 | 100,000 | Good (no soil) | 405 |
| | 2 | S-2 | B-1 | M-4 | I-3 | Dye-4 | C-2 | AS-1 | D-1 | 100,000 | Good (no soil) | 405 |
| | 3 | S-3 | B-1 | M-4 | I-3 | Dye-4 | C-2 | AS-1 | D-1 | 100,000 | Good (no soil) | 405 |
| | 4 | S-4 | B-1 | M-4 | I-3 | Dye-4 | C-2 | AS-1 | D-1 | 100,000 | Good (no soil) | 405 |
| | 5 | S-5 | B-1 | M-4 | I-3 | Dye-4 | C-2 | AS-1 | D-1 | 110,000 | Good (no soil) | 405 |
| | 6 | S-6 | B-1 | M-4 | I-3 | Dye-4 | C-2 | AS-1 | D-1 | 110,000 | Good (no soil) | 405 |
| | 7 | S-7 | B-2 | M-4 | I-3 | Dye-4 | C-2 | AS-1 | D-1 | 120,000 | Good (no soil) | 405 |
| | 8 | S-8 | B-3 | M-4 | I-3 | Dye-4 | C-2 | AS-1 | D-1 | 130,000 | Good (no soil) | 405 |
| | 9 | S-9 | B-1 | M-4 | I-3 | Dye-4 | C-2 | AS-1 | D-1 | 110,000 | Good (no soil) | 405 |
| | 10 | S-10 | B-1 | M-4 | I-3 | Dye-4 | C-2 | AS-1 | D-1 | 110,000 | Good (no soil) | 405 |
| | 11 | S-11 | B-1 | M-4 | I-3 | Dye-4 | C-2 | AS-1 | D-1 | 120,000 | Good (no soil) | 405 |
| | 12 | S-12 | B-1 | M-4 | I-3 | Dye-4 | C-2 | AS-1 | D-1 | 120,000 | Good (no soil) | 405 |
| | 13 | S-13 | B-1 | M-4 | I-3 | Dye-4 | C-2 | AS-1 | D-1 | 120,000 | Good (no soil) | 405 |
| | 14 | S-14 | B-1 | M-4 | I-3 | Dye-4 | C-2 | AS-1 | D-1 | 140,000 | Good (no soil) | 405 |
| | 15 | S-15 | B-1 | M-4 | I-3 | Dye-4 | C-2 | AS-1 | D-1 | 140,000 | Good (no soil) | 405 |
| Comp. | 1 | CS-1 | B-1 | M-4 | I-3 | Dye-4 | C-2 | AS-1 | D-1 | 80,000 | Soiled | 405 |
| | 2 | CS-2 | B-1 | M-4 | I-3 | Dye-4 | C-2 | AS-1 | D-1 | 50,000 | Soiled | 405 |
| | 3 | None | B-1 | M-4 | I-3 | Dye-4 | C-2 | AS-1 | D-1 | 50,000 | Soiled | 405 |

The oligosaccharides, polysaccharides, addition polymerizable compounds, polymerization initiators, sensitizing dyestuffs, light-heat converting dyestuffs, other additives, and developing solutions used including those that were used in the following examples (Tables 2 and 3) are shown below.

Oligosaccharides:
S-1: Maltose
S-2: Sucrose
S-3: Lactose
S4: Maltopentaose

Polysaccharides Not Containing a Carboxyl Group and a Sulfuric Acid Group:
S-5: Amylose
S-6: Schizophyllan
S-7: Curdlan
S-8: Gua gum Polysaccharides Containing a Sulfuric Acid Group:
S-9: Chondroitin sulfuric acid
S-10: κ-carrageenan
S-11: Sodium chondroitin sulfate Polysaccharides Containing a Carboxyl Group:
S-12: Chondroitin
S-13: Hyaluronic acid
S-14: Carboxymethyl cellulose
S-15: HPMCAP (hydroxypropylmethyl cellulose acetate phthalate, manufactured by Shin-Etsu Chemical Co., Ltd.)

Saccharides used in Comparative Examples:
CS-1: Glucose
CS-2: Glucuronic acid

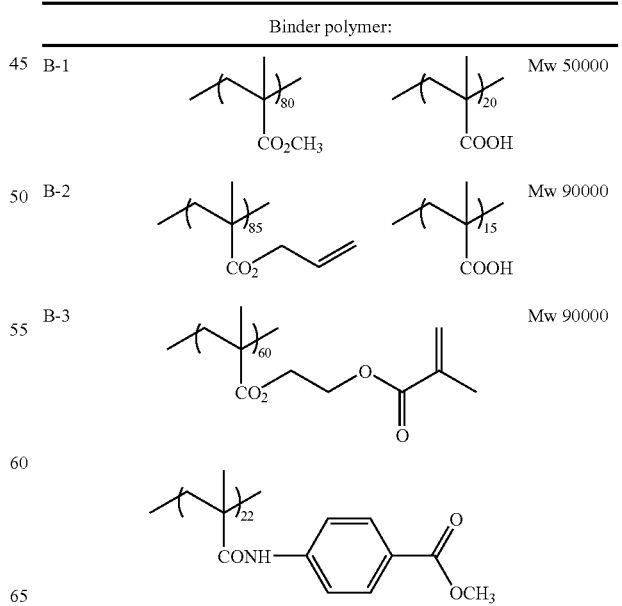

-continued

Binder polymer:

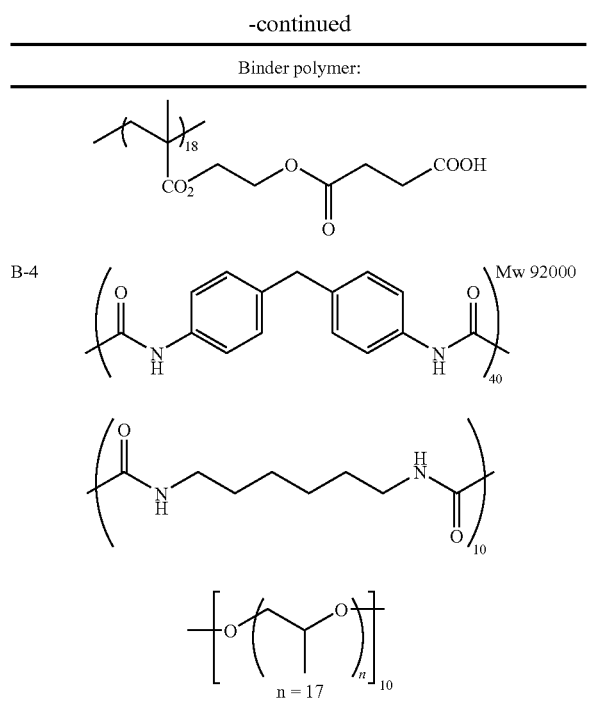

B-4

Binder polymer:

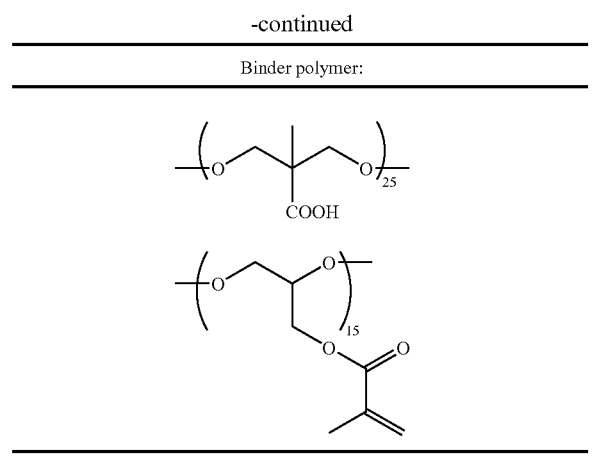

Addition Polymerizable Compounds:

M-1: Pentaerythritol tetraacrylate (NK Ester A-TMMT, manufactured by Shin Nakamura Kagaku Co., Ltd.)

M-2: Glycerin dimethacrylate hexamethylene diisocyanate urethane prepolymer (UA101H manufactured by Kyoeisha Chemical Co., Ltd.)

M-3: Dipentaerythritol acrylate (NK Ester A-9530, manufactured by Shin Nakamura Kagaku Co., Ltd.)

M-4:
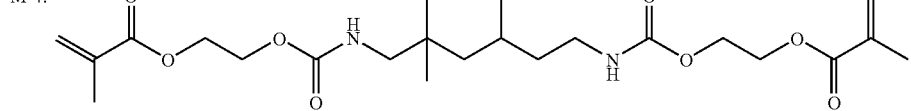

Polymerization Initiators

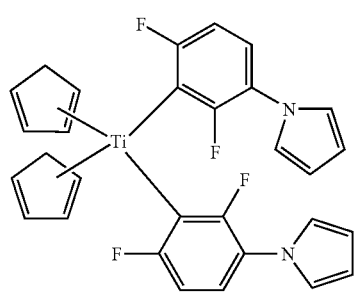
(I-1)

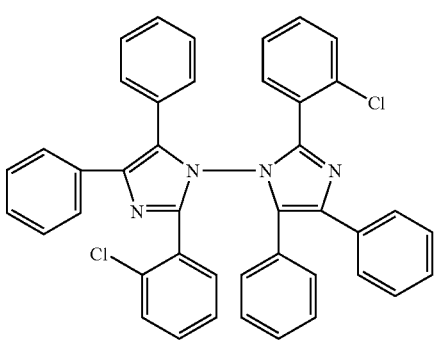
(I-3)

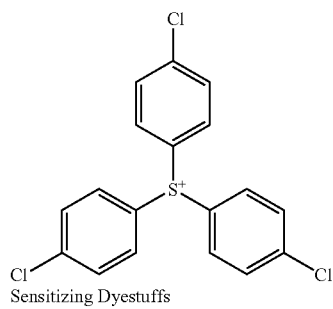

Sensitizing Dyestuffs

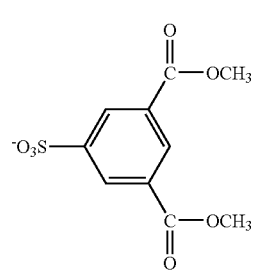
(I-4)

-continued
(Dye-1)
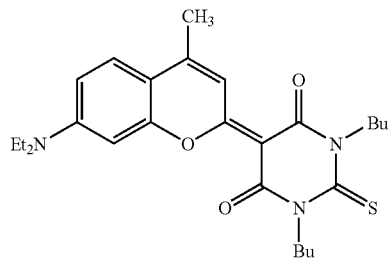
(Dye-4)
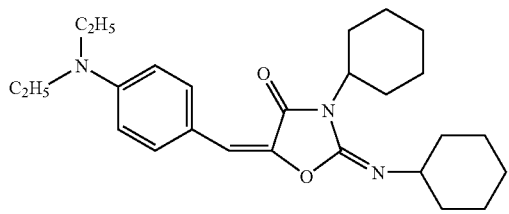
Light-Heat Converting Dyestuff
(Dye-5)
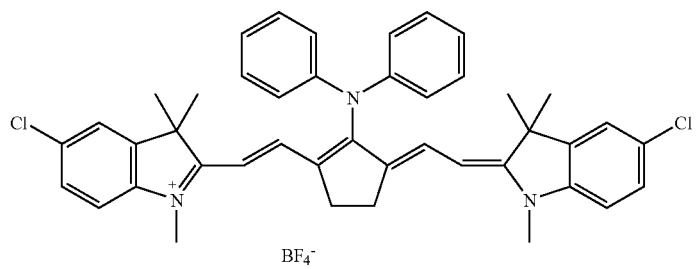
Other Additives
(C-1)
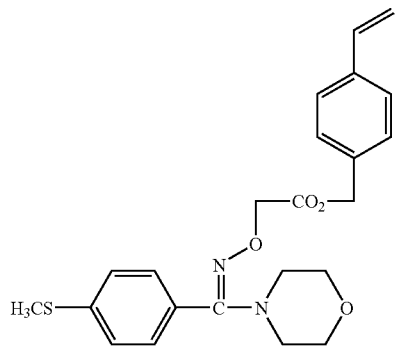
(C-2)
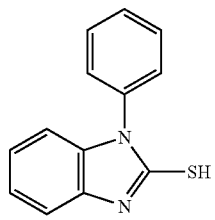
(C-3)
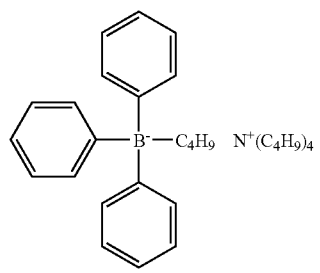
(C-4)
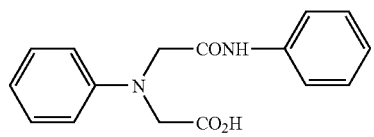

Developing Solution:

D-1:

An aqueous solution of pH 10 comprising the following composition:

| | |
|---|---|
| Monoethanolamine | 0.1 mass parts |
| Triethanolamine | 1.5 mass parts |
| Compound of formula 1 shown below | 4.0 mass parts |
| Compound of formula 2 shown below | 2.5 mass parts |
| Compound of formula 3 shown below | 0.2 mass parts |
| Water | 91.7 mass parts |

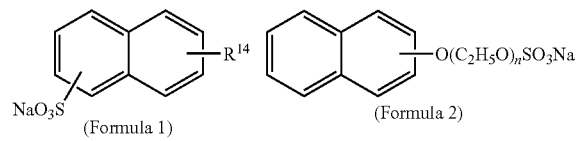

(Formula 1)    (Formula 2)

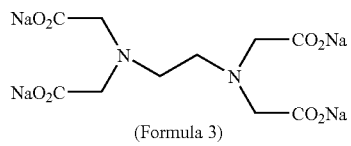

(Formula 3)

In formula 1, $R^{14}$ represents a hydrogen atom or a butyl group.

D-2:

An aqueous solution having pH of 13 comprising the following composition:

| | |
|---|---|
| 1K Potassium silicatte | 3.0 mass parts |
| Potassium hydroxide | 1.5 mass parts |
| Compound of the above formula 3 | 0.2 mass parts |
| Water | 95.3 mass parts |

D-3:

An aqueous solution having pH of 10.5 comprising the following composition:

| | |
|---|---|
| Sodium carbonate monohydrate | 10 g |
| Potassium hydrogencarbonate | 10 g |
| Sodium isopropylnaphthalenesulfonate | 15 g |
| Sodium dibutylnaphthalenesulfonate | 15 g |
| Sodium salt of ethylene glycol mononaphthyl ether monosulfate | 10 g |
| Sodium sulfite | 1 g |
| Tetrasodium ethylenediaminetetraacetate | 0.1 g |
| Ion exchange water | 938.9 g |

Examples 16 to 30, Comparative Examples 4 to 6

Negative lithographic printing plate precursors in Examples 16 to 30 and Comparative Examples 4 to 6 shown in Table 2 below were prepared in the same manner as in Examples 1 to 13 and Comparative Examples 1 to 3.

The thus-obtained lithographic printing plate precursor was subjected to solid image exposure with FD-YAG (532 nm) laser exposer (plate setter, Gutenberg, manufactured by Heidelberg Japan K.K.) by adjusting exposure power so that exposure energy density of the plate surface reached 200 μJ/cm², and dot image exposure of 1 to 99% with every 1%, by 2,540 dpi and 175 line/inch.

Each of the exposed lithographic printing plate precursors was subjected to development/plate-making in the same manner as in Examples 1 to 15 and Comparative Examples 1 to 3, and printing performance was evaluated. In the Examples and Comparative Examples, the coating solution was coated so that the dry coating amount of the photosensitive layer was from 1.3 to 1.5 g/m². The results obtained are shown in Table 2.

TABLE 2

| No. | | Oligosaccharide or Polysaccharide | Binder Polymer | Polymerizable Cpd. | Polymerization Initiator | Sensitizing Dyestuff | Other Additives | Support | Developing Soln. | Press Life (number of Sheets) | Raw Preservation Property | Light Source (nm) |
|---|---|---|---|---|---|---|---|---|---|---|---|---|
| Ex. | 16 | S-1 | B-2 | M-1 | I-1 | Dye-1 | C-1 | AS-2 | D-2 | 90,000 | Good (no soil) | 532 |
| | 17 | S-2 | B-2 | M-1 | I-1 | Dye-1 | C-1 | AS-2 | D-2 | 90,000 | Good (no soil) | 532 |
| | 18 | S-3 | B-4 | M-1 | I-1 | Dye-1 | C-1 | AS-2 | D-2 | 90,000 | Good (no soil) | 532 |
| | 19 | S-4 | B-4 | M-1 | I-1 | Dye-1 | C-1 | AS-2 | D-2 | 90,000 | Good (no soil) | 532 |
| | 20 | S-5 | B-2 | M-1 | I-1 | Dye-1 | C-1 | AS-2 | D-2 | 100,000 | Good (no soil) | 532 |
| | 21 | S-6 | B-2 | M-1 | I-1 | Dye-1 | C-1 | AS-2 | D-2 | 100,000 | Good (no soil) | 532 |
| | 22 | S-7 | B-2 | M-1 | I-1 | Dye-1 | C-1 | AS-2 | D-2 | 100,000 | Good (no soil) | 532 |
| | 23 | S-8 | B-2 | M-1 | I-1 | Dye-1 | C-1 | AS-2 | D-2 | 100,000 | Good (no soil) | 532 |
| | 24 | S-9 | B-2 | M-2 | I-1 | Dye-1 | C-3 | AS-2 | D-2 | 110,000 | Good (no soil) | 532 |
| | 25 | S-10 | B-2 | M-2 | I-1 | Dye-1 | C-3 | AS-2 | D-2 | 120,000 | Good (no soil) | 532 |
| | 26 | S-11 | B-2 | M-2 | I-1 | Dye-1 | C-3 | AS-2 | D-2 | 110,000 | Good (no soil) | 532 |

TABLE 2-continued

| No. | Oligo-saccharide or Poly-saccharide | Binder Polymer | Polymerizable Cpd. | Polymerization Initiator | Sensitizing Dye-stuff | Other Additives | Support | Developing Soln. | Press Life (number of Sheets) | Raw Preservation Property | Light Source (nm) |
|---|---|---|---|---|---|---|---|---|---|---|---|
| 27 | S-12 | B-2 | M-2 | I-1 | Dye-1 | C-3 | AS-2 | D-2 | 130,000 | Good (no soil) | 532 |
| 28 | S-13 | B-2 | M-2 | I-1 | Dye-1 | C-3 | AS-2 | D-2 | 130,000 | Good (no soil) | 532 |
| 29 | S-14 | B-2 | M-2 | I-1 | Dye-1 | C-3 | AS-2 | D-2 | 130,000 | Good (no soil) | 532 |
| 30 | S-15 | B-2 | M-2 | I-1 | Dye-1 | C-3 | AS-2 | D-2 | 140,000 | Good (no soil) | 532 |
| Comp. 4 | CS-1 | B-2 | M-1 | I-1 | Dye-1 | C-1 | AS-2 | D-2 | 80,000 | Soiled | 532 |
| 5 | CS-2 | B-2 | M-2 | I-1 | Dye-1 | C-3 | AS-2 | D-2 | 70,000 | Soiled | 532 |
| 6 | None | B-2 | M-1 | I-1 | Dye-1 | C-1 | AS-2 | D-2 | 80,000 | Soiled | 532 |

Examples 31 to 45, Comparative Examples 7 to 9

A photosensitive layer coating solution having the composition shown below was prepared, and the solution was coated on support "AS-3" with a wire bar in a dry coating amount of from 1.4 to 1.6 g/m², and the coated layer was dried with a hot air dryer at 115° C. for 45 seconds to form a photosensitive layer.

| Photosensitive layer coating solution: | |
|---|---|
| Oligosaccharide or polysaccharide (a compound shown in Table 3) | 1.5 g |
| Addition polymerizable compound (a compound shown in Table 3) | 2.0 g |
| Binder polymer (a polymer shown in Table 3) | 2.0 g |
| Light-heat converting duestuff (S-5) | 0.08 g |
| Polymerization initiator (a compound shown in Table 3) | 0.45 g |
| Other additive (a compound shown in Table 3) | 0.4 g |
| Fluorine-based nonionic surfactant (Megafac F-177, manufactured by Dainippon Ink and Chemicals Inc.) | 0.03 g |
| Naphthalenesulfonate of Victoria Pure Blue | 0.04 g |
| Methyl ethyl ketone | 10.0 g |
| Propylene glycol monomethyl ether | 20.0 g |
| Methanol | 10.0 g |
| Water (distilled water) | 10.0 g |

Coating of Protective Layer:

A 3 mass % aqueous solution of polyvinyl alcohol (saponification degree: 98 mol %, polymerization degree: 550) was coated on the obtained photosensitive layer in a dry coating amount of 2 g/m², and dried at 100° C. for 2 minutes.

Exposure of Lithographic Printing Plate Precursor:

Each of the obtained lithographic printing plate precursors was subjected to exposure with Trendsetter 3244VF (manufactured by Creo) loading a water-cooling type 40 W infrared semiconductor laser (830 nm) on the conditions of output of 9 W, external drum rotation speed of 210 rpm, plate energy of 100 mJ/cm², and resolution of 2,400 dpi.

Development/Plate-making:

After exposure, an automatic developer Stablon 900N (manufactured by Fuji Photo Film Co., Ltd.) was charged with the developing solution shown in Table 3 and finisher FN-6 (manufactured by Fuji Photo Film Co., Ltd.) diluted with water in proportion of 1/1, and the lithographic printing-plate precursor was subjected to development/plate-making at 30° C., whereby a lithographic printing plate was obtained.

Test for Press Life of Image Area:

Lithrone (manufactured by Komori Corporation) was used as the printer and Graf G (N) (manufactured by Dainippon Ink and Chemicals Inc.) was used as the ink. The solid image of the printed substance was observed, and the number of the printed sheets that the image began to be blurred was taken as the press life. The bigger the number, the better is the press life.

Test for Raw Preservation Property:

Unexposed lithographic printing plate precursor was allowed to stand at 60° C. 50% RH for three days, and then used in printing with Lithrone (manufactured by Komori Corporation). At this time, how many number of sheets could be used in printing with retaining sufficient ink density was visually observed and raw preservation property was evaluated. The results obtained are shown in Table 3 below.

TABLE 3

| | No. | Oligo-saccharide or Poly-saccharide | Binder Polymer | Polymerizable Cpd. | Polymerization Initiator | Light-Heat Converting Dye-stuff | Other Additives | Support | Developing Soln. | Press Life (number of Sheets) | Raw Preservation Property | Light Source (nm) |
|---|---|---|---|---|---|---|---|---|---|---|---|---|
| Ex. | 31 | S-1 | B-3 | M-3 | I-4 | Dye-5 | C-4 | AS-3 | D-3 | 120,000 | Good (no oil) | 830 |
| | 32 | S-2 | B-3 | M-3 | I-4 | Dye-5 | C-3 | AS-3 | D-3 | 120,000 | Good (no oil) | 830 |
| | 33 | S-3 | B-3 | M-3 | I-4 | Dye-5 | None | AS-3 | D-3 | 120,000 | Good (nosoil) | 830 |

TABLE 3-continued

| | No. | Oligo-saccharide or Poly-saccharide | Binder Polymer | Polymerizable Cpd. | Poly-merization Initiator | Light-Heat Converting Dye-stuff | Other Additives | Support | Develop-ing Soln. | Press Life (number of Sheets) | Raw Preservation Property | Light Source (nm) |
|---|---|---|---|---|---|---|---|---|---|---|---|---|
| | 34 | S-4 | B-3 | M-3 | I-4 | Dye-5 | C-4 | AS-3 | D-3 | 120,000 | Good (no oil) | 830 |
| | 35 | S-5 | B-3 | M-3 | I-4 | Dye-5 | None | AS-3 | D-3 | 130,000 | Good (no oil) | 830 |
| | 36 | S-6 | B-3 | M-3 | I-4 | Dye-5 | C-4 | AS-3 | D-3 | 130,000 | Good (no oil) | 830 |
| | 37 | S-7 | B-3 | M-3 | I-4 | Dye-5 | None | AS-3 | D-3 | 130,000 | Good (no oil) | 830 |
| | 38 | S-8 | B-3 | M-3 | I-4 | Dye-5 | C-4 | AS-3 | D-3 | 130,000 | Good (no oil) | 830 |
| | 39 | S-9 | B-3 | M-3 | I-4 | Dye-5 | None | AS-3 | D-3 | 140,000 | Good (no oil) | 830 |
| | 40 | S-10 | B-3 | M-3 | I-4 | Dye-5 | C-3 | AS-3 | D-3 | 150,000 | Good (no oil) | 830 |
| | 41 | S-11 | B-3 | M-3 | I-4 | Dye-5 | C-4 | AS-3 | D-3 | 140,000 | Good (no oil) | 830 |
| | 42 | S-12 | B-3 | M-3 | I-4 | Dye-5 | None | AS-3 | D-3 | 160,000 | Good (no oil) | 830 |
| | 43 | S-13 | B-3 | M-3 | I-4 | Dye-5 | C-4 | AS-3 | D-3 | 160,000 | Good (no oil) | 830 |
| | 44 | S-14 | B-3 | M-3 | I-4 | Dye-5 | None | AS-3 | D-3 | 160,000 | Good (no oil) | 830 |
| | 45 | S-15 | B-3 | M-3 | I-4 | Dye-5 | C-4 | AS-3 | D-3 | 170,000 | Good (no oil) | 830 |
| Comp. | 7 | CS-1 | B-3 | M-3 | I-4 | Dye-5 | C-4 | AS-3 | D-3 | 100,000 | Soiled | 830 |
| | 8 | CS-2 | B-3 | M-3 | I-4 | Dye-5 | C-3 | AS-3 | D-3 | 100,000 | Soiled | 830 |
| | 9 | None | B-3 | M-3 | I-4 | Dye-5 | None | AS-3 | D-3 | 90,000 | Soiled | 830 |

As is apparent from the results in Tables 1 to 3, every lithographic printing plate precursor provided with a photosensitive layer comprising the polymerizable composition containing an oligosaccharide or a polysaccharide of the invention showed very excellent press life, further every printing plate was confirmed to be excellent in raw preservation property. From these facts, it is seen that the lithographic printing plate precursors in the invention are suitable for high speed writing by laser exposure as performed in the invention. Accordingly, it can be said that lithographic printing plate precursors to which the invention is applied exhibit high productivity.

Examples 46 to 60, Comparative Examples 10 and 11

Negative lithographic printing plate precursors of Examples 46 to 60 and Comparative Examples 10 and 11 as shown in Table 4 below were manufactured according to the following procedure, and printing performance was evaluated. The results obtained are shown in Table 4.

Coating of Undercoat Layer:

The undercoat layer coating solution shown below was coated on support AS-2 as shown in Table 4 in dry coating amount (solids content) of 10 mg/m².

| Undercoat layer coating solution: | |
|---|---|
| Any of S-1 to S-15, CS-1 and CS-2 (shown in Table 4) | 0.017 g |
| Water (distilled water) | 10.00 g |

Coating of Photosensitive Layer:

A coating solution of a photosensitive layer having the composition shown below was coated on the aluminum support provided with the undercoat layer in a dry coating amount of from 1.0 to 1.2 g/m², and dried at 100° C. for 1 minute to thereby form a photosensitive layer.

| Photosensitive layer coating solution: | |
|---|---|
| Addition polymerizable compound (a compound shown in Table 4) | 2.0 g |
| Binder polymer (a polymer shown in Table 4) | 2.0 g |
| Sensitizing dyestuff (a compound shown in Table 4) | 0.2 g |
| Polymerization initiator (a compound shown in Table 4) | 0.45 g |
| Other additive (a compound shown in Table 4) | 0.4 g |
| Fluorine-based nonionic surfactant (Megafac F-177, manufactured by Dainippon Ink and Chemicals Inc.) | 0.03 g |
| Thermal polymerization inhibitor (N-nitrosophenylhydroxylamine aluminum salt) | 0.01 g |
| Dispersion of coloring pigment having the composition shown below | 2.0 g |
| Methyl ethyl ketone | 10.0 g |
| Propylene glycol monomethyl ether | 20.0 g |
| Methanol | 10.0 g |

| Composition of coloring pigment dispersion: | |
| --- | --- |
| Pigment Blue 15:6 | 15 mass parts |
| Allyl methacrylate/methacrylic acid copolymer (copolymerization molar ratio: 80/20, mass average molecular weight: 40,000) | 10 mass parts |
| Cyclohexanone | 15 mass parts |
| Methoxypropyl acetate | 20 mass parts |
| Propylene glycol monomethyl ether | 40 mass parts |

Coating of Protective Layer:

A 3 mass % aqueous solution of polyvinyl alcohol (saponification degree: 98 mol %/, polymerization degree: 550) was coated on the obtained photosensitive layer in a dry coating amount of 2 g/m², and dried at 100° C. for 2 minutes.

Exposure and Post Hating of Lithographic Printing Plate Precursor:

The thus-obtained lithographic printing plate precursor was subjected to solid image exposure with Violet semiconductor laser setter Vx9600 (InGaN system semiconductor laser, 405 nm±10 nm, emission/output: 30 mW, manufactured by Fuji Film Electronic Imaging Ltd.) by exposure amount of 90 μJ/cm², and dot image exposure of 1 to 99% with every 1% and resolution of 2,438 dpi. The plate was then heated at 100° C for 10 seconds in an oven.

Development/Plate-making:

After heating, an automatic developer FLP-813 (manufactured by Fuji Photo Film Co., Ltd.) was charged with the developing solution shown in Table 4 and finisher FP-2W (manufactured by Fuji Photo Film Co., Ltd.), and the lithographic printing plate precursor was subjected to development/plate-making on the condition of the developing solution temperature of 30° C. and developing time of 18 seconds, whereby a lithographic printing plate was obtained.

Test for Press Life of Image Area:

Each lithographic printing plate precursor was mounted on a printing press. At this time, Lithrone (manufactured by Komori Corporation) was used as the printer and Graf G (N) (manufactured by Dainippon Ink and Chemicals Inc.) was used as the ink. The solid image of the printed substance was observed, and the number of the printed sheets that the image began to be blurred was taken as the press life. The bigger the number, the better is the press life. At this time, soiling of the non-image area due to printing was observed.

Test for Raw Preservation Property:

Unexposed lithographic printing plate precursor was allowed to stand at 60° C. 50% RH for three days, subsequently subjected to exposure and development, and then printing was performed with Lithrone (manufactured by Komori Corporation). At this time, printing performance of how many number of sheets could be used in printing with retaining sufficient ink density was visually observed, and at the same time, soiling of the non-image area due to printing was observed and raw preservation property was evaluated. The results obtained are shown in Table 4 below.

TABLE 4

| No. | Oligo-saccharide or Poly-saccharide | Binder Polymer | Polymerizable Cpd | Polymerization Initiator | Sensitizing Dye-stuff | Other Additives | Support | Developing Soln. | Press Life (number of Sheets) | Soil in Non-Image Area | Raw Preservation Property | Light Source (nm) |
| --- | --- | --- | --- | --- | --- | --- | --- | --- | --- | --- | --- | --- |
| 46 (Ex.) | S-1 | P-1 | M-1 | I-1 | Dye-1 | C-1 | AS-2 | 1 | 80,000 | No | Good (no soil) | 405 |
| 47 (Ex.) | S-2 | P-1 | M-1 | I-1 | Dye-1 | C-1 | AS-2 | 1 | 80,000 | No | Good (no soil) | 405 |
| 48 (Ex.) | S-3 | P-1 | M-1 | I-1 | Dye-1 | C-1 | AS-2 | 1 | 80,000 | No | Good (no soil) | 405 |
| 49 (Ex.) | S-4 | P-1 | M-1 | I-1 | Dye-1 | C-1 | AS-2 | 1 | 90,000 | No | Good (no soil) | 405 |
| 50 (Ex.) | S-5 | P-1 | M-1 | I-1 | Dye-1 | C-1 | AS-2 | 1 | 90,000 | No | Good (no soil) | 405 |
| 51 (Ex.) | S-6 | P-1 | M-1 | I-1 | Dye-1 | C-1 | AS-2 | 1 | 90,000 | No | Good (no soil) | 405 |
| 52 (Ex.) | S-5 | P-1 | M-1 | I-1 | Dye-1 | C-1 | AS-2 | 1 | 110,000 | No | Good (no soil) | 405 |
| 53 (Ex.) | S-6 | P-1 | M-1 | I-1 | Dye-1 | C-1 | AS-2 | 1 | 110,000 | No | Good (no soil) | 405 |
| 54 (Ex.) | S-7 | P-1 | M-1 | I-1 | Dye-1 | C-1 | AS-2 | 1 | 110,000 | No | Good (no soil) | 405 |
| 55 (Ex.) | S-8 | P-1 | M-1 | I-1 | Dye-1 | C-1 | AS-2 | 1 | 110,000 | No | Good (no soil) | 405 |
| 56 (Ex.) | S-9 | P-1 | M-1 | I-1 | Dye-1 | C-1 | AS-2 | 1 | 110,000 | No | Good (no soil) | 405 |
| 57 (Ex.) | S-10 | P-1 | M-1 | I-1 | Dye-1 | C-1 | AS-2 | 1 | 110,000 | No | Good (no soil) | 405 |
| 58 (Ex.) | S-11 | P-1 | M-1 | I-1 | Dye-1 | C-1 | AS-2 | 1 | 150,000 | No | Good (no soil) | 405 |
| 59 (Ex.) | S-14 | P-1 | M-1 | I-1 | Dye-1 | C-1 | AS-2 | 1 | 140,000 | No | Good (no soil) | 405 |

TABLE 4-continued

| No. | Oligo-saccharide or Poly-saccharide | Binder Polymer | Polymerizable Cpd | Poly-merization Initiator | Sen-sitizing Dye-stuff | Other Additives | Support | Developing Soln. | Press Life (number of Sheets) | Soil in Non-Image Area | Raw Preservation Property | Light Source (nm) |
|---|---|---|---|---|---|---|---|---|---|---|---|---|
| 60 (Ex.) | S-15 | P-1 | M-1 | I-1 | Dye-1 | C-1 | AS-2 | 1 | 140,000 | No | Good (no soil) | 405 |
| 10 (Comp.) | CS-1 | P-1 | M-1 | I-1 | Dye-1 | C-1 | AS-2 | 1 | 70,000 | No | Soiled | 405 |
| 11 (Comp.) | CS-2 | P-1 | M-1 | I-1 | Dye-1 | C-1 | AS-2 | 1 | 50,000 | No | Soiled | 405 |

The oligosaccharides and polysaccharides used in the undercoat layer, binder polymers, addition polymerizable compounds, polymerization initiators, sensitizing dyestuffs, and other additives used in the photosensitive layer, and developing solutions used including those that were used in the following examples (Tables 5 to 7) are shown below.

Oligosaccharides:

S-1: Maltose
S-2: Laminaribiose
S-3: Dextrin

Polysaccharides Not Taking a Helical Structure, and Not Having a Hydrophilic Group Other than OH:
S-4: Mannan
S-5: Hydroxypropyl cellulose
S-6: Methyl cellulose Polysaccharides Not Taking a Helical Structure, and Having a Hydrophilic Group Other than OH:

S-7: Carboxymethyl cellulose
S-8: Sodium alginate
S-9: HPMCAP (manufactured by Shin-Etsu Chemical Co., Ltd.)

Polysaccharides Taking a Helical Structure, and Not Having a Hydrophilic Group Other than OH:
S-10: Schizophyllan
S-11: Curdlan
S-12: Amylose Polysaccharides Taking a Helical Structure, and Having a Hydrophilic Group Other than OH:
S-13: κ-carrageenan
S-14: Agarose
S-15: Xanthane gum Hydrophilic Compounds Other than Oligosaccharides and Polysaccharides Used in Comparative Examples that are Often Used as an Undercoat Layer:
CS-1: Sodium polyacrylate (manufactured by Wako Pure Chemical Industries Ltd.)
CS-2: Phosmer PE (manufactured by Uni-Chemical Co., Ltd.)

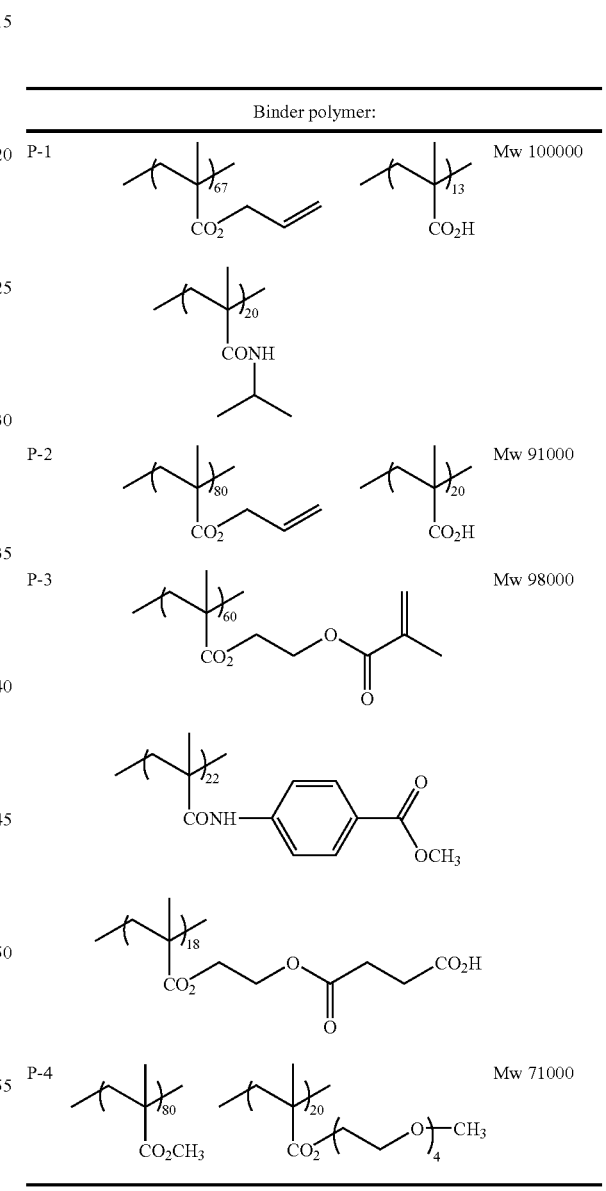

Addition Polymerizable Compound:
M-1: Pentaeryduitol tetraacrylate (NK Ester A-TMMT, manufactured by Shin Nakamura Kagaku Co., Ltd.)
M-2: Glycerin dimethacrylate hexamethylene diisocyanate urethane prepolymer (UA101H, manufactured by Kyoe-isha Chemical Co., Ltd.)

Polymerization initiator:
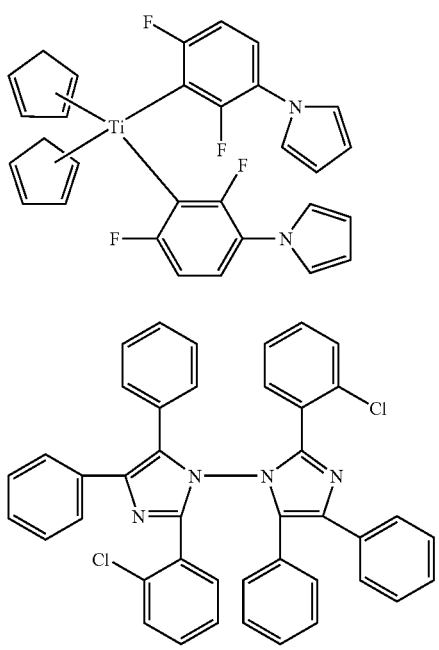
(I-1)
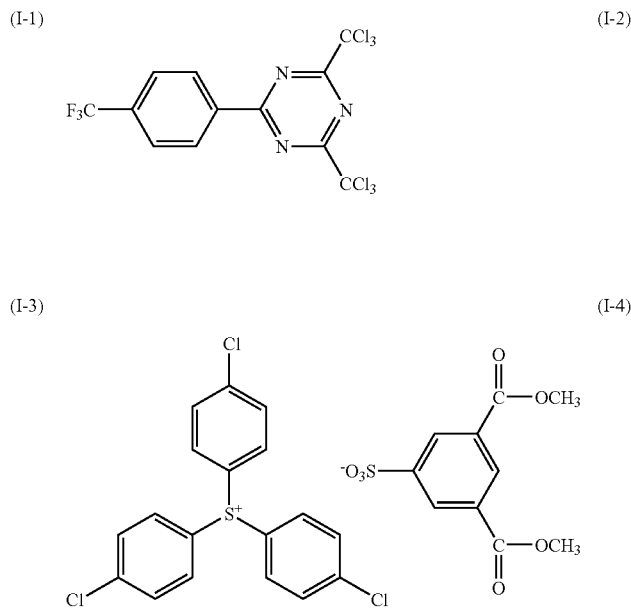
(I-2)
(I-3)
(I-4)
Sensitizing dyestuff:
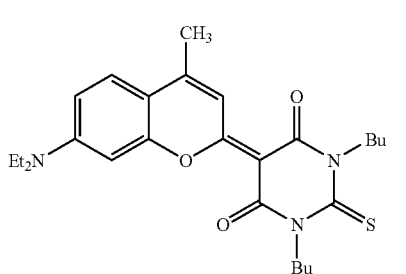
(Dye-1)
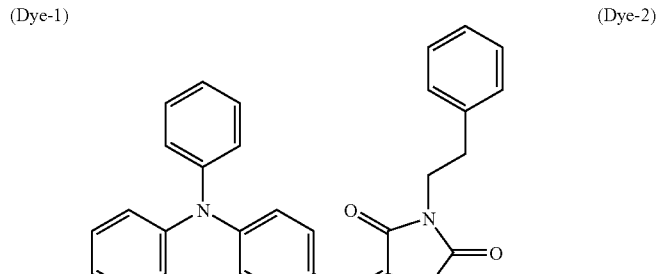
(Dye-2)
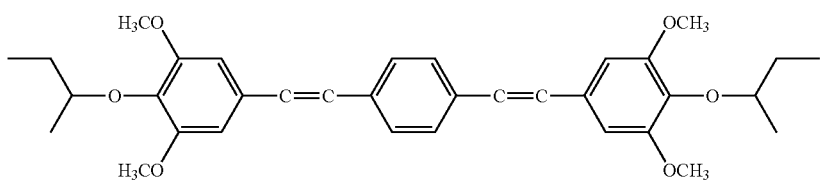
(Dye-3)
Other additives:
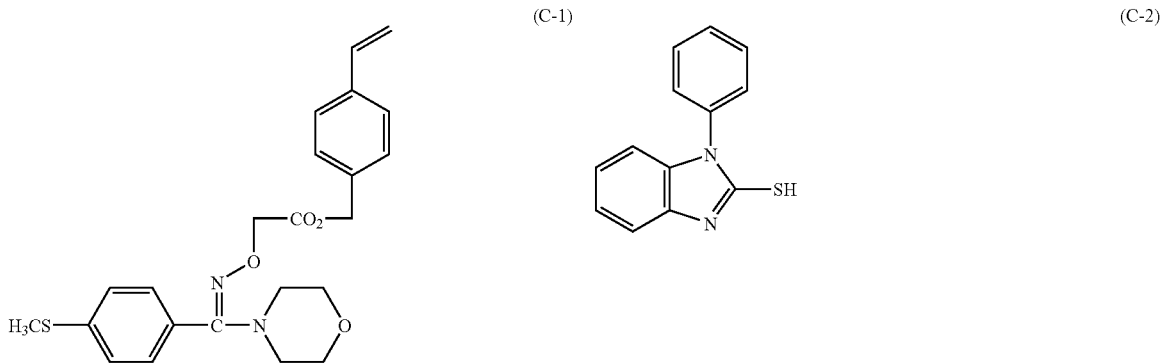
(C-1)
(C-2)

Developing solution:

Developing solution 1:

An aqueous solution of pH 10 comprising the following composition:

| | |
|---|---|
| Monoethanolamine | 0.1 mass parts |
| Triethanolamine | 1.5 mass parts |
| Compound of formula 1 shown below | 4.0 mass parts |
| Compound of formula 2 shown below | 2.5 mass parts |
| Compound of formula 3 shown below | 0.2 mass parts |
| Water | 91.7 mass parts |

$NaO_3S$—[naphthalene]—$R^{14}$ (Formula 1)

[naphthalene]—$O(C_2H_5O)_nSO_3Na$ (Formula 2)

$NaO_2C$—$CH_2$—N(—$CH_2$—$CO_2Na$)—$CH_2CH_2$—N(—$CH_2$—$CO_2Na$)—$CH_2$—$CO_2Na$ (Formula 3)

In the above (formula 1), $R^{14}$ represents a hydrogen atom or a butyl group.

Developing solution 2:

An aqueous solution having pH of 13 comprising the following composition:

| | |
|---|---|
| 1K Potassium silicatte | 3.0 mass parts |
| Potassium hydroxide | 1.5 mass parts |
| Compound of the above (formula 3) | 0.2 mass parts |
| Water | 95.3 mass parts |

Developing solution 3:

Non-alkali aqueous solution comprising 1/1 (by mass) mixture of FN-1 (manufactured by Fuji Photo Film Co., Ltd.) and distilled water. (pH:4.5)

Example 61 to 75, Comparative Examples 12 and 13

Negative lithographic printing plate precursors in Examples 61 to 70 and Comparative Examples 12 and 13 shown in Table 5 below were prepared in the same manner as in Examples 45 to 60 and Comparative Examples 10 and 11. Here, an undercoat layer was provided on support AS-1.

The thus-obtained lithographic printing plate precursor was subjected to solid image exposure with FD-YAG-(532 nm) laser exposer (plate setter, Gutenberg, manufactured by Heidelberg Japan K.K.) by adjusting exposure power so that exposure energy density of the plate surface reached 200 μJ/cm$^2$, and dot image exposure of 1 to 99% with every 1%, by 2,540 dpi and 175 line/inch.

Each of the exposed lithographic printing plate precursors was subjected to development/plate-making in the same manner as in Examples 45 to 60 and Comparative Examples 10 and 11, and printing performance was evaluated. In the Examples and Comparative Examples, the coating solution was coated so that the dry coating amount of the photosensitive layer was from 1.3 to 1.5 g/m$^2$. The results obtained are shown in Table 5.

TABLE 5

| No. | Oligo-saccharide or Poly-saccharide | Binder Polymer | Polymerizable Cpd | Poly-merization Initiator | Sen-sitizing Dye-stuff | Other Additives | Support | Developing Soln. | Press Life (number of Sheets) | Soil in Non-Image Area | Raw Preservation Property | Light Source (nm) |
|---|---|---|---|---|---|---|---|---|---|---|---|---|
| 61 (Ex.) | S-1 | P-2 | M-1 | I-2 | Dye-2 | None | AS-1 | 2 | 70,000 | No | Good (no soil) | 532 |
| 62 (Ex.) | S-2 | P-2 | M-1 | I-2 | Dye-2 | None | AS-1 | 2 | 70,000 | No | Good (no soil) | 532 |
| 63 (Ex.) | S-3 | P-2 | M-1 | I-2 | Dye-2 | None | AS-1 | 2 | 70,000 | No | Good (no soil) | 532 |
| 64 (Ex.) | S-4 | P-2 | M-1 | I-2 | Dye-2 | None | AS-1 | 2 | 80,000 | No | Good (no soil) | 532 |
| 65 (Ex.) | S-5 | P-2 | M-1 | I-2 | Dye-2 | None | AS-1 | 2 | 80,000 | No | Good (no soil) | 532 |
| 66 (Ex.) | S-6 | P-2 | M-1 | I-2 | Dye-2 | None | AS-1 | 2 | 80,000 | No | Good (no soil) | 532 |
| 67 (Ex.) | S-7 | P-2 | M-1 | I-2 | Dye-2 | None | AS-1 | 2 | 100,000 | No | Good (no soil) | 532 |
| 68 (Ex.) | S-8 | P-2 | M-1 | I-3 | Dye-2 | None | AS-1 | 2 | 100,000 | No | Good (no soil) | 532 |
| 69 (Ex.) | S-9 | P-2 | M-1 | I-3 | Dye-2 | None | AS-1 | 2 | 100,000 | No | Good (no soil) | 532 |
| 70 (Ex.) | S-10 | P-2 | M-1 | I-3 | Dye-2 | None | AS-1 | 2 | 100,000 | No | Good (no soil) | 532 |
| 71 (Ex.) | S-11 | P-2 | M-1 | I-3 | Dye-2 | None | AS-1 | 2 | 100,000 | No | Good (no soil) | 532 |
| 72 (Ex.) | S-12 | P-2 | M-1 | I-3 | Dye-2 | None | AS-1 | 2 | 100,000 | No | Good (no soil) | 532 |
| 73 (Ex.) | S-13 | P-2 | M-1 | I-3 | Dye-2 | None | AS-1 | 2 | 140,000 | No | Good (no soil) | 532 |

TABLE 5-continued

| No. | Oligo-saccharide or Poly-saccharide | Binder Polymer | Polymerizable Cpd | Poly-merization Initiator | Sen-sitizing Dye-stuff | Other Additives | Support | Developing Soln. | Press Life (number of Sheets) | Soil in Non-Image Area | Raw Preservation Property | Light Source (nm) |
|---|---|---|---|---|---|---|---|---|---|---|---|---|
| 74 (Ex.) | S-14 | P-2 | M-1 | I-3 | Dye-2 | None | AS-1 | 2 | 130,000 | No | Good (no soil) | 532 |
| 75 (Ex.) | S-15 | P-2 | M-1 | I-3 | Dye-2 | None | AS-1 | 2 | 130,000 | No | Good (no soil) | 532 |
| 12 (Comp.) | CS-1 | P-2 | M-1 | I-2 | Dye-2 | None | AS-1 | 2 | 60,000 | Yes | Soiled | 532 |
| 13 (Comp.) | CS-2 | P-2 | M-1 | I-3 | Dye-2 | None | AS-1 | 2 | 60,000 | Yes | Soiled | 532 |

Examples 76 to 90, Comparative Examples 14 and 15

A photosensitive layer coating solution having the composition shown below was prepared, and the solution was coated on support "AS-2" with a wire bar in a dry coating amount of from 1.4 to 1.6 g/m², and the coated layer was dried with a hot air dryer at 115° C. for 45 seconds to form a photosensitive layer.

| Photosensitive layer coating solution: | |
|---|---|
| Addition polymerizable compound (a compound shown in Table 6) | 2.0 g |
| Binder polymer (a polymer shown in Table 6) | 2.0 g |
| Sensitizing dyestuff (a polymer shown in Table 6) | 0.08 g |
| Polymerization initiator (a compound shown in Table 6) | 0.45 g |
| Other additive (a compound shown in Table 6) | 0.4 g |
| Fluorine-based nonionic surfactant (Megafac F-177, manufactured by Dainippon Ink and Chemicals Inc.) | 0.03 g |
| Naphthalenesulfonate of Victoria Pure Blue | 0.04 g |
| Methyl ethyl ketone | 10.0 g |
| Propylene glycol monomethyl ether | 20.0 g |
| Methanol | 10.0 g |

Coating of Protective Layer:

A 3 mass % aqueous solution of polyvinyl alcohol (saponification degree: 98 mol %, polymerization degree: 550) was coated on the obtained photosensitive layer in a dry coating amount of 2 g/m², and dried at 100° C. for 2 minutes.

Exposure of Lithographic Printing Plate Precursor:

Each of the obtained lithographic printing plate precursors was subjected to exposure with Trendsetter 3244VF (manufactured by Creo) loading a water-cooling type 40 W infrared semiconductor laser (830 rim) on the conditions of output of 9 W, external drum rotation speed of 210 rpm, plate energy of 100 mJ/cm², and resolution of 2,400 dpi.

Development/Plate-Making:

After exposure, an automatic developer Stablon 900N (manufactured by Fuji Photo Film Co., Ltd.) was charged with the developing solution shown in Table 3 and finisher FN-6 (manufactured by Fuji Photo Film Co., Ltd.) diluted with water in proportion of 1/1, and the lithographic printing plate precursor was subjected to development/plate-making at 30° C., whereby a lithographic printing plate was obtained.

Test for Press Life of Image Area:

Each lithographic printing plate precursor was mounted on a printing press. At this time, Lithrone (manufactured by Komori Corporation) was used as the printer and Graf G (N) (manufactured by Dainippon Ink and Chemicals Inc.) was used as the ink. The solid image of the printed substance was observed, and the number of the printed sheets that the image began to be blurred was taken as the press life. The bigger the number, the better is the press life. ). At this time, soiling of the non-image area due to printing was observed.

Test for Raw Preservation Property:

Unexposed lithographic printing plate precursor was allowed to stand at 60° C. 50% RH for three days, subsequently subjected to exposure and development, and then printing was performed with Lithrone (manufactured by Komori Corporation). At this time, printing performance of how many number of sheets could be used in printing with retaining sufficient ink density was visually observed, and at the same time, soiling of the non-image area due to printing-was observed and raw preservation property was evaluated. The results obtained are shown in Table 6 below.

TABLE 6

| No. | Oligo-saccharide or Poly-saccharide | Binder Polymer | Polymerizable Cpd | Poly-merization Initiator | Sen-sitizing Dye-stuff | Other Additives | Support | Developing Soln. | Press Life (number of Sheets) | Soil in Non-Image Area | Raw Preservation Property | Light Source (nm) |
|---|---|---|---|---|---|---|---|---|---|---|---|---|
| 76 (Ex.) | S-1 | P-3 | M-2 | I-4 | Dye-3 | C-2 | AS-2 | 2 | 80,000 | No | Good (no soil) | 830 |

TABLE 6-continued

| No. | Oligo-saccharide or Poly-saccharide | Binder Polymer | Polymerizable Cpd | Poly-merization Initiator | Sen-sitizing Dye-stuff | Other Additives | Support | Developing Soln. | Press Life (number of Sheets) | Soil in Non-Image Area | Raw Preservation Property | Light Source (nm) |
|---|---|---|---|---|---|---|---|---|---|---|---|---|
| 77 (Ex.) | S-2 | P-3 | M-2 | I-4 | Dye-3 | C-2 | AS-2 | 2 | 80,000 | No | Good (no soil) | 830 |
| 78 (Ex.) | S-3 | P-3 | M-2 | I-4 | Dye-3 | C-2 | AS-2 | 2 | 80,000 | No | Good (no soil) | 830 |
| 79 (Ex.) | S-4 | P-3 | M-2 | I-4 | Dye-3 | C-2 | AS-2 | 2 | 90,000 | No | Good (no soil) | 830 |
| 80 (Ex.) | S-5 | P-3 | M-2 | I-4 | Dye-3 | C-2 | AS-2 | 2 | 90,000 | No | Good (no soil) | 830 |
| 81 (Ex.) | S-6 | P-3 | M-2 | I-4 | Dye-3 | C-2 | AS-2 | 2 | 90,000 | No | Good (no soil) | 830 |
| 82 (Ex.) | S-7 | P-3 | M-2 | I-4 | Dye-3 | C-2 | AS-2 | 2 | 100,000 | No | Good (no soil) | 830 |
| 83 (Ex.) | S-8 | P-3 | M-2 | I-4 | Dye-3 | C-2 | AS-2 | 2 | 100,000 | No | Good (no soil) | 830 |
| 84 (Ex.) | S-9 | P-3 | M-2 | I-4 | Dye-3 | C-2 | AS-2 | 2 | 100,000 | No | Good (no soil) | 830 |
| 85 (Ex.) | S-10 | P-3 | M-2 | I-4 | Dye-3 | C-2 | AS-2 | 2 | 100,000 | No | Good (no soil) | 830 |
| 86 (Ex.) | S-11 | P-3 | M-2 | I-4 | Dye-3 | C-2 | AS-2 | 2 | 100,000 | No | Good (no soil) | 830 |
| 87 (Ex.) | S-12 | P-3 | M-2 | I-4 | Dye-3 | C-2 | AS-2 | 2 | 100,000 | No | Good (no soil) | 830 |
| 88 (Ex.) | S-13 | P-3 | M-2 | I-4 | Dye-3 | C-2 | AS-2 | 2 | 120,000 | No | Good (no soil) | 830 |
| 89 (Ex.) | S-14 | P-3 | M-2 | I-4 | Dye-3 | C-2 | AS-2 | 2 | 110,000 | No | Good (no soil) | 830 |
| 90 (Ex.) | S-15 | P-3 | M-2 | I-4 | Dye-3 | C-2 | AS-2 | 2 | 110,000 | No | Good (no soil) | 830 |
| 14 (Comp.) | CS-1 | P-3 | M-2 | I-4 | Dye-3 | C-2 | AS-2 | 2 | 60,000 | No | Soiled | 830 |
| 15 (Comp.) | CS-2 | P-3 | M-2 | I-4 | Dye-3 | C-2 | AS-2 | 2 | 60,000 | Yes | Soiled | 830 |

Examples 91 to 105, Comparative Examples 16 and 17

Negative lithographic printing plate precursors in Examples 91 to 105 and Comparative Examples 16 and 17 shown in Table 7 below were prepared in the same manner as in Examples 46 to 60 and Comparative Examples 10 and 11.

Exposure and Post Hating of Lithographic Printing Plate Precursor:

The thus-obtained lithographic printing plate precursor was subjected to solid image exposure with Violet semiconductor laser setter Vx9600 (InGaN system semiconductor laser, 405 nm±10 nm, emission/output: 30 mW, manufactured by Fuji Film Electronic Imaging Ltd.) by exposure amount of 90 µJ/cm$^2$, and dot image exposure of 1 to 99% with every 1% and resolution of 2,438 dpi. The plate was then heated at 100° C. for 10 seconds in an oven.

Development process was carried out with a processor 106 as shown in FIG. 1. The temperature of the processing solution was 25° C. The numeral 108 in the figure shows carrier rollers, and passing time from the inlet to outlet was set at 15 seconds.

Numeral 112 in the figure is rotary brush. The brush was rotated in the normal direction to the carrying direction at a speed of 280 mm/sec. The lithographic printing plate precursor discharged from the processing tank was naturally dried.

Test for Press Life of Image Area:

Each lithographic printing plate precursor was mounted on a printing press. At this time, Lithrone (manufactured by Komori Corporation) was used as the printer and Graf G (N) (manufactured by Dainippon Ink and Chemicals Inc.) was used as the ink. The solid image of the printed substance was observed, and the number of the printed sheets that the image began to be blurred was taken as the press life. The bigger the number, the better is the press life. At this time, soiling of the non-image area due to printing was observed.

Test for Raw Preservation Property:

Unexposed lithographic printing plate precursor was allowed to stand at 60° C. 50% RH for three days, subsequently subjected to exposure and development, and then printing was performed with Lithrone (manufactured by Komori Corporation). At this time, printing performance of how many number of sheets could be used in printing with retaining sufficient ink density was visually observed, and atthe same time, soiling of the non-image area due to printing was observed and raw preservation property was evaluated. The results obtained are shown in Table 7 below.

TABLE 7

| No. | Oligo-saccharide or Poly-saccharide | Binder Polymer | Polymerizable Cpd | Polymerization Initiator | Sensitizing Dyestuff | Other Additives | Support | Developing Soln. | Press Life (number of Sheets) | Soil in Non-Image Area | Raw Preservation Property | Light Source (nm) |
|---|---|---|---|---|---|---|---|---|---|---|---|---|
| 91 (Ex.) | S-1 | P-4 | M-1 | I-1 | Dye-1 | C-1 | AS-2 | 3 | 50,000 | No | Good (no soil) | 405 |
| 92 (Ex.) | S-2 | P-4 | M-1 | I-1 | Dye-1 | C-1 | AS-2 | 3 | 50,000 | No | Good (no soil) | 405 |
| 93 (Ex.) | S-3 | P-4 | M-1 | I-1 | Dye-1 | C-1 | AS-2 | 3 | 50,000 | No | Good (no soil) | 405 |
| 94 (Ex.) | S-4 | P-4 | M-1 | I-1 | Dye-1 | C-1 | AS-2 | 3 | 60,000 | No | Good (no soil) | 405 |
| 95 (Ex.) | S-5 | P-4 | M-1 | I-1 | Dye-1 | C-1 | AS-2 | 3 | 60,000 | No | Good (no soil) | 405 |
| 96 (Ex.) | S-6 | P-4 | M-1 | I-1 | Dye-1 | C-1 | AS-2 | 3 | 60,000 | No | Good (no soil) | 405 |
| 97 (Ex.) | S-7 | P-4 | M-1 | I-1 | Dye-1 | C-1 | AS-2 | 3 | 70,000 | No | Good (no soil) | 405 |
| 98 (Ex.) | S-8 | P-4 | M-1 | I-1 | Dye-1 | C-1 | AS-2 | 3 | 70,000 | No | Good (no soil) | 405 |
| 99 (Ex.) | S-9 | P-4 | M-1 | I-1 | Dye-1 | C-1 | AS-2 | 3 | 70,000 | No | Good (no soil) | 405 |
| 100 (Ex.) | S-10 | P-4 | M-1 | I-1 | Dye-1 | C-1 | AS-2 | 3 | 70,000 | No | Good (no soil) | 405 |
| 101 (Ex.) | S-11 | P-4 | M-1 | I-1 | Dye-1 | C-1 | AS-2 | 3 | 70,000 | No | Good (no soil) | 405 |
| 102 (Ex.) | S-12 | P-4 | M-1 | I-1 | Dye-1 | C-1 | AS-2 | 3 | 70,000 | No | Good (no soil) | 405 |
| 103 (Ex.) | S-13 | P-4 | M-1 | I-1 | Dye-1 | C-1 | AS-2 | 3 | 90,000 | No | Good (no soil) | 405 |
| 104 (Ex.) | S-14 | P-4 | M-1 | I-1 | Dye-1 | C-1 | AS-2 | 3 | 80,000 | No | Good (no soil) | 405 |
| 105 (Ex.) | S-15 | P-4 | M-1 | I-1 | Dye-1 | C-1 | AS-2 | 3 | 80,000 | No | Good (no soil) | 405 |
| 16 (Comp.) | CS-1 | P-4 | M-1 | I-1 | Dye-1 | C-1 | AS-2 | 3 | 20,000 | Yes | Soiled | 405 |
| 17 (Comp.) | CS-2 | P-4 | M-1 | I-1 | Dye-1 | C-1 | AS-2 | 3 | 30,000 | Yes | Soiled | 405 |

As shown in Tables 4 to 7, the lithographic printing plate precursors in the invention comprising a support having thereon a layer containing at least one saccharide selected from the group consisting of an oligosaccharide and a polysaccharide and a photosensitive layer on the layer are excellent in press life and raw preservation property even when not only alkali developing solutions (Tables 4 to 6) but also non-alkali aqueous solutions (Table 7) were used as the developing solutions as compared with lithographic printing plate precursors having an undercoat layer comprising conventionally used hydrophilic compounds other than oligosaccharides and polysaccharides.

The invention can provide a polymerizable composition suitable for a photosensitive layer of a negative lithographic printing plate precursor capable of high-sensitive writing with a laser beam, and a lithographic printing plate precursor excellent in press life and a raw preservation property capable of high-sensitive writing with a laser beam.

The entire disclosure of each and every foreign patent application from which the benefit of foreign priority has been claimed in the present application is incorporated herein by reference, as if fully set forth.

What is claimed is:

1. A lithographic printing plate precursor comprising: an aluminum support subjected to a surface roughening treatment; and a photosensitive layer formed from a polymerizable composition comprising:
   (A) at least one saccharide selected from the group consisting of an oligosaccharide and a polysaccharide, the polysaccharide containing an amino group, an alkylamino group, an acetylamino group, an ethyleneoxy group, a sulfonic acid group, a phosphoric acid group, a urethane group, a urea group, or a thiol group as a hydrophilic group;
   (B) a film-forming binder polymer which is not the at least one saccharide (A);
   (C) a compound having an addition polymerizable ethylenic unsaturated bond;
   (D) a polymerization initiator; and
   (E) a sensitizing dyestuff having an absorption maximum at a wavelength of from 300 to 600 mn.

2. A lithographic printing plate precursor comprising:
   a support;
   a layer comprising at least one saccharide selected from the group consisting of an oligosaccharide and a polysaccharide, wherein the polysaccharide has at least one substituent selected from the group consisting of a hydrophilic group and a salt of the hydrophilic group, wherein the hydrophilic group is selected from the group consisting of an amino group, an alkylamino group, an acetylamino group, an ethyleneoxy group, a sulfonic acid group, a phosphoric acid group, a urethane group, a urea group and a thiol group; and a photosensitive layer, in this order, wherein the photosensitive layer comprises:
   (B) a binder polymer having an ethylenic unsaturated double bond in a side chain of the binder polymer;
   (C) a compound having an addition polymerizable ethylenic unsaturated bond;
   (D) a polymerization initiator; and
   (E) a sensitizing dyestuff having an absorption maximum at a wavelength of from 300 to 600 nm.

3. The lithographic printing plate precursor according to claim 2, wherein the polysaccharide has a property that a part or an entire structure of the polysaccharide takes a helical structure in an aqueous solution having a concentration of 50 mass % or less.

4. A process for producing a lithographic printing plate comprising:
   imagewise exposing a lithographic printing plate precursor according to claim 1 to thereby cure an exposed area; and
   subjecting the exposed lithographic printing plate precursor to wet development processing.

5. The lithographic printing plate precursor according to claim 2, wherein the at least one substituent selected from the group consisting of a hydrophilic group and a salt of the hydrophilic group is a least one of a sulfonic acid group and a salt of a sulfonic acid group.

6. The lithographic printing plate precursor according to claim 3, which is produced by, at the time of preparation and coating of an undercoat layer coating solution comprising the polysaccharide, stirring and heating the coating solution at 60 to 100 degrees C. for 30 minutes or more; and then coating and drying the coating solution while maintaining the solution at coating and at drying at 60 to 100 degrees C.

7. The polymerizable composition according to claim 1, wherein the film-forming binder polymer (B) contains a structural unit represented by formula (2):

Formula (2)

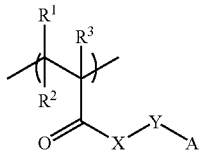

wherein X represents O, S or —NR$^4$—;
Y represents a divalent organic group;
A represents an acid group having an acid dissociation constant pKa of from 0 to 11; and
R$^1$, R$^2$, R$^3$, and R$^4$ each represents a hydrogen atom, a halogen atom, a monovalent organic group, a cyano group, or a nitro group.

* * * * *